United States Patent [19]

Storace et al.

[11] Patent Number: 4,551,806
[45] Date of Patent: Nov. 5, 1985

[54] METHOD AND APPARATUS FOR THE SIMULATION OF THE BUILD UP OF THE TREAD ON A TIRE CARCASS

[75] Inventors: Anthony Storace, Norwalk; Jeffery Ketchman, Westport, both of Conn.

[73] Assignee: AMF Inc., White Plains, N.Y.

[21] Appl. No.: 479,286

[22] Filed: Mar. 28, 1983

[51] Int. Cl.$^4$ .............. B31C 81/00; B29H 17/02; B65H 57/28; G06F 15/46

[52] U.S. Cl. .................. 364/473; 242/158 R; 156/128.1; 156/405.1; 156/425; 156/360

[58] Field of Search ............ 364/469, 473, 148, 149; 156/128.6, 128.1, 130, 141, 184, 185, 186, 187, 360, 75, 361, 405.1, 425, 129; 242/158 R; 318/561

[56] References Cited

U.S. PATENT DOCUMENTS

| | | | |
|---|---|---|---|
| 3,308,000 | 3/1967 | Holman | 156/130 X |
| 3,775,592 | 11/1973 | Ando et al. | 364/149 |
| 3,819,915 | 6/1974 | Smith | 364/148 X |
| 3,844,870 | 10/1974 | Donoghue et al. | 156/360 |
| 4,016,020 | 4/1977 | Ongaro | 156/75 |
| 4,145,740 | 3/1979 | McClean et al. | 156/425 X |
| 4,206,009 | 6/1980 | Kazares | 156/130 |
| 4,240,863 | 12/1980 | Vinton | 156/130 X |

Primary Examiner—Jerry Smith
Assistant Examiner—Jon D. Grossman
Attorney, Agent, or Firm—David E. Dougherty; Michael E. Zall

[57] ABSTRACT

A method and apparatus for simulating the manner in which a ribbon of known profile is wrapped around a carcass of known profile in accordance with a predetermined winding specification is disclosed. The profile of the ribbon, the profile of the carcass and the winding specification are stored in a memory together with the desired final profile of the ribbon build. The profile of the final ribbon build, which will be created at a selected cross-section of the carcass when the ribbon is wrapped around the carcass in accordance with the winding specification, is calculated. The final ribbon build so calculated is displayed on a video display which also displays the desired final profile so that the profile created by the predetermined winding specification can be compared to the actual profile which will be produced by the winding specification.

40 Claims, 34 Drawing Figures

FIG. 4B.
(PRIOR ART)

WINDING SPECIFICATION

| SEGMENT NUMBER (K) | REVOLUTIONS W(K) | AZIMUTHAL DISTANCES(K) |
|---|---|---|
| 1 | 1.00 | 0.00 |
| 2 | 2.25 | 0.98 |
| 3 | 2.15 | 0.75 |
| 4 | 5.90 | 2.08 |
| 5 | 0.70 | 0.37 |
| 6 | 1.45 | 0.48 |
| 7 | 5.30 | 1.68 |
| 8 | 1.25 | 0.32 |
| 9 | 0.00 | 1.54 |
| 10 | 1.00 | 0.00 |
| 11 | 0.98 | 0.19 |
| 12 | 1.15 | 0.35 |
| 13 | 2.12 | 0.49 |
| 14 | 3.00 | 0.91 |
| 15 | 0.90 | 0.47 |
| 16 | 0.92 | 0.17 |
| 17 | 2.02 | 0.58 |
| 18 | 0.95 | 0.22 |
| 19 | 1.25 | 0.38 |
| 20 | 1.71 | 0.48 |

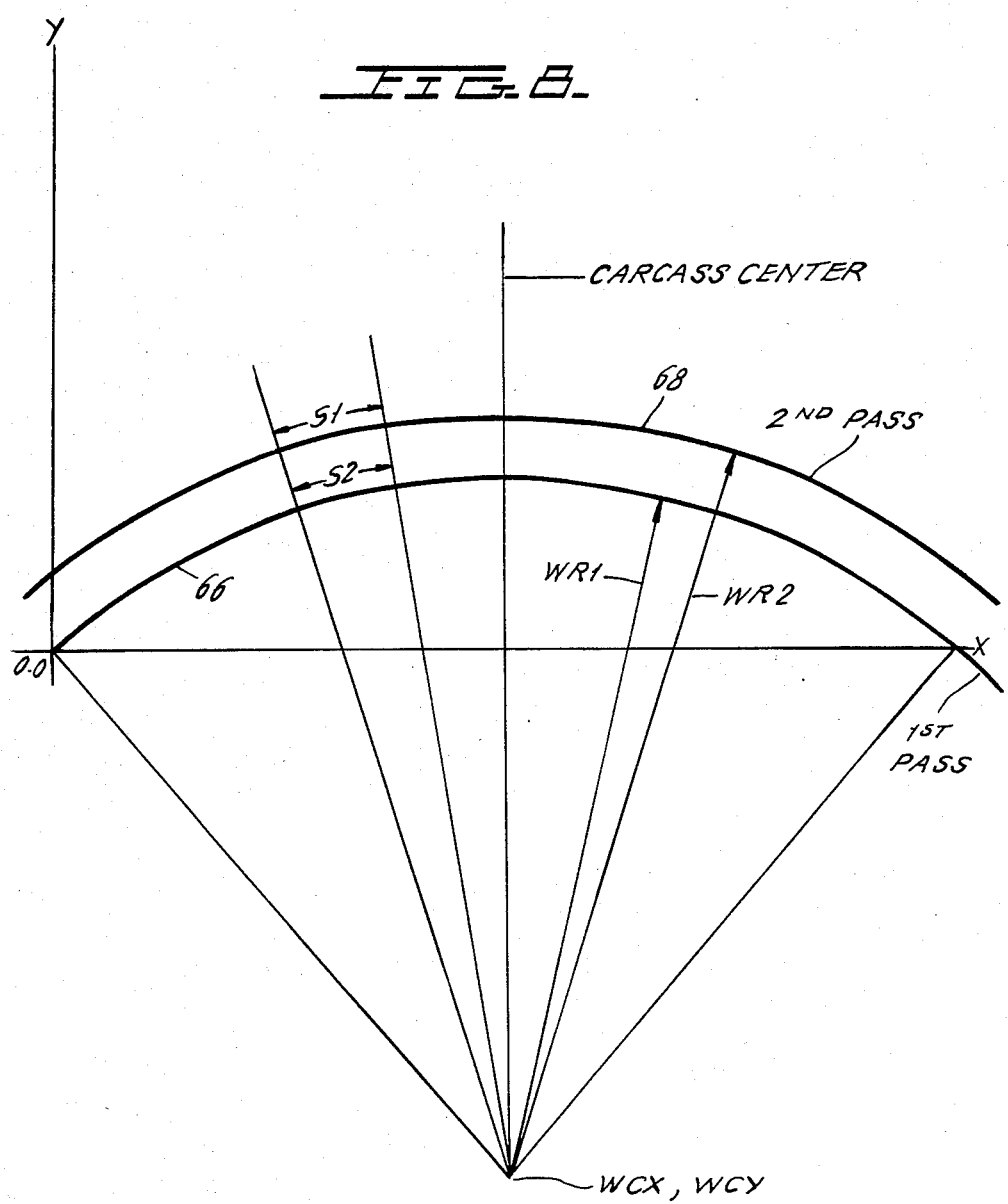
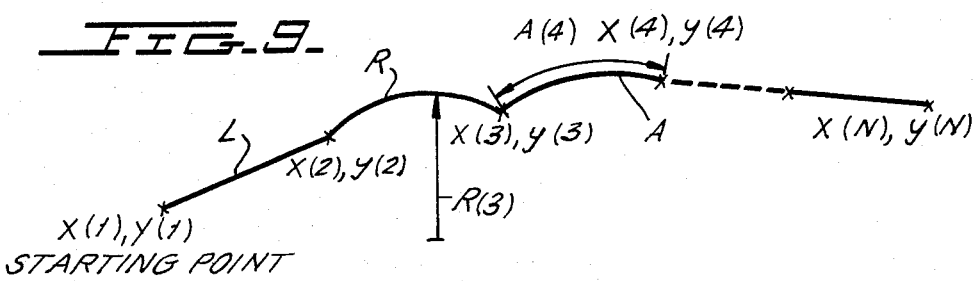

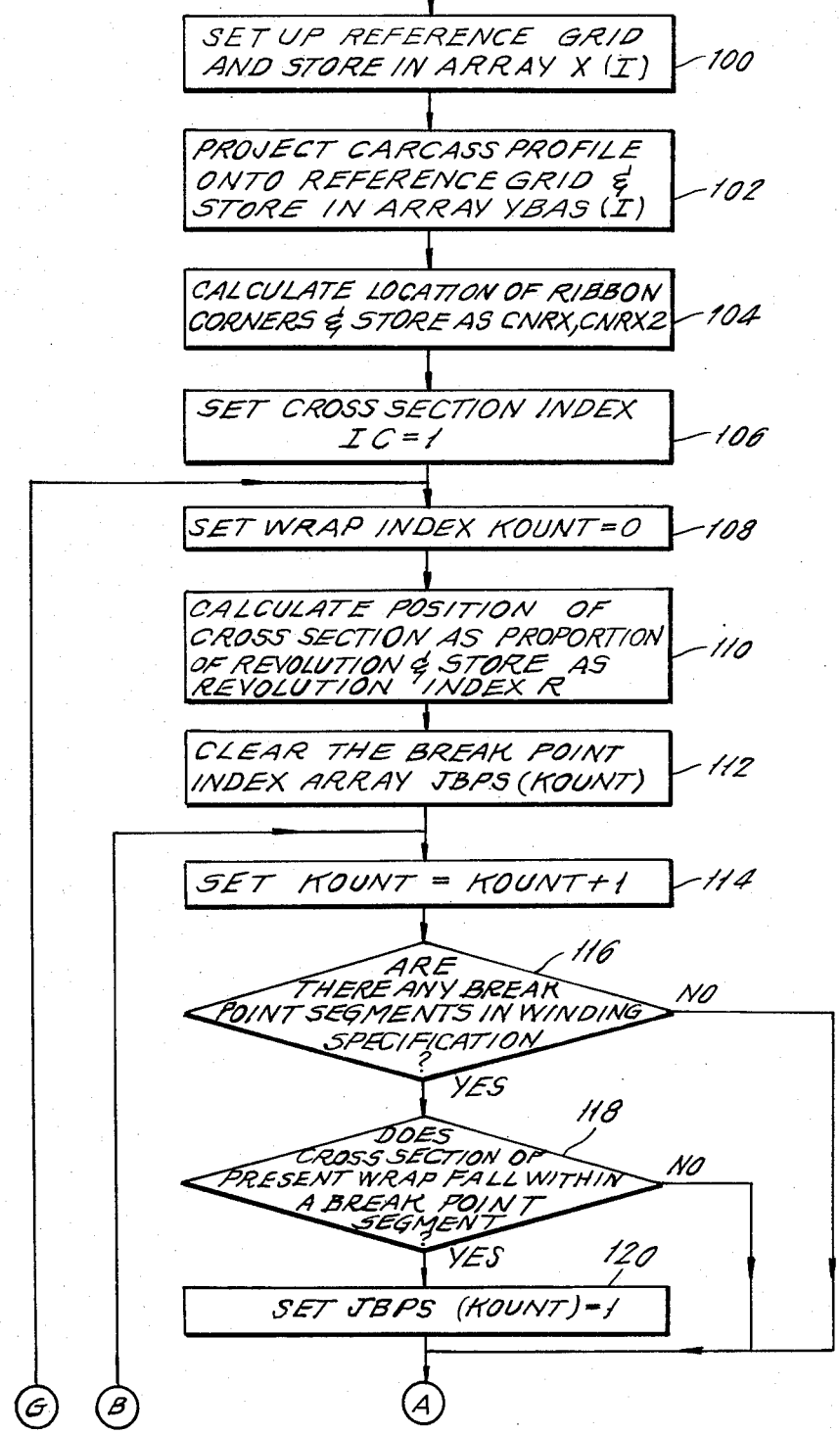

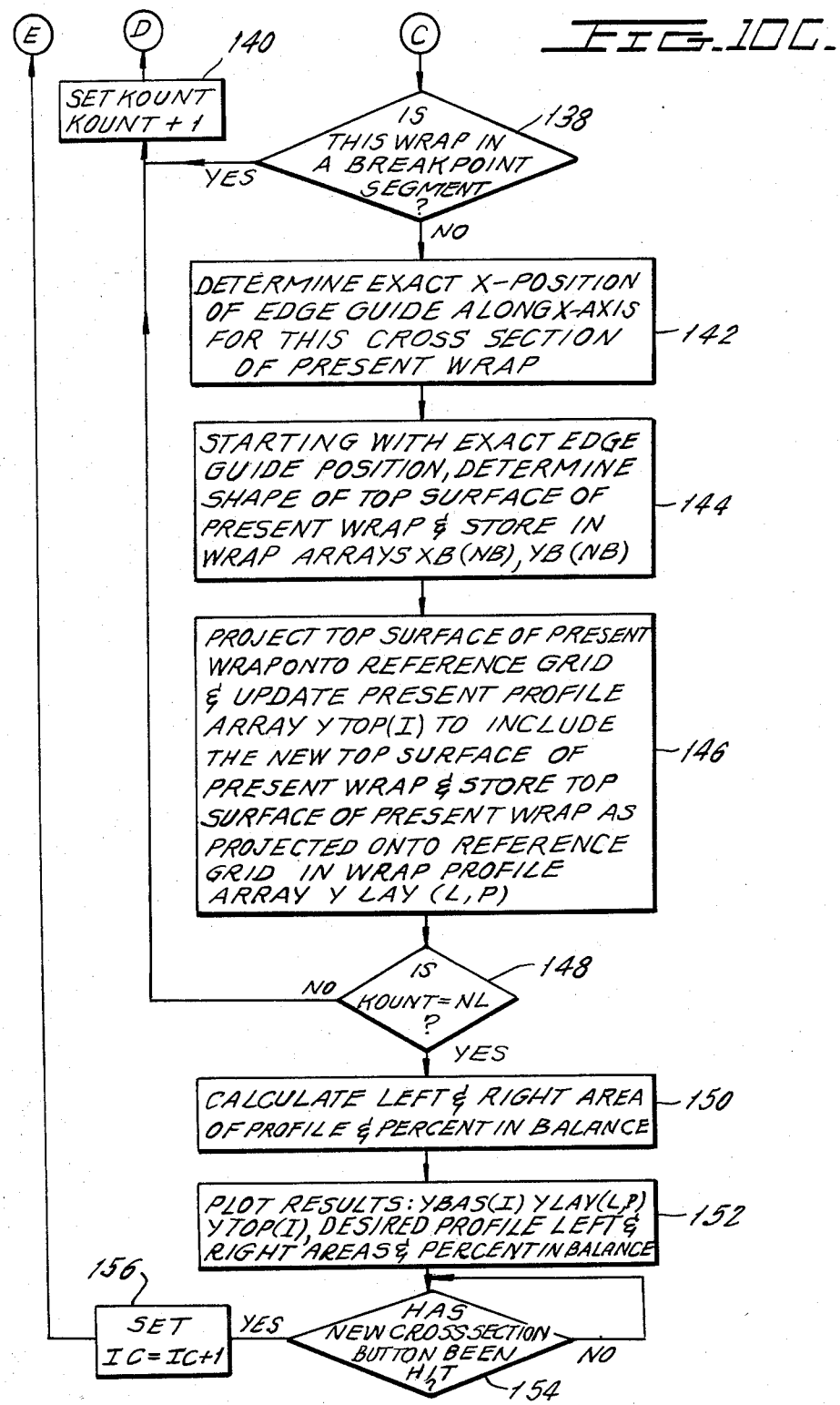

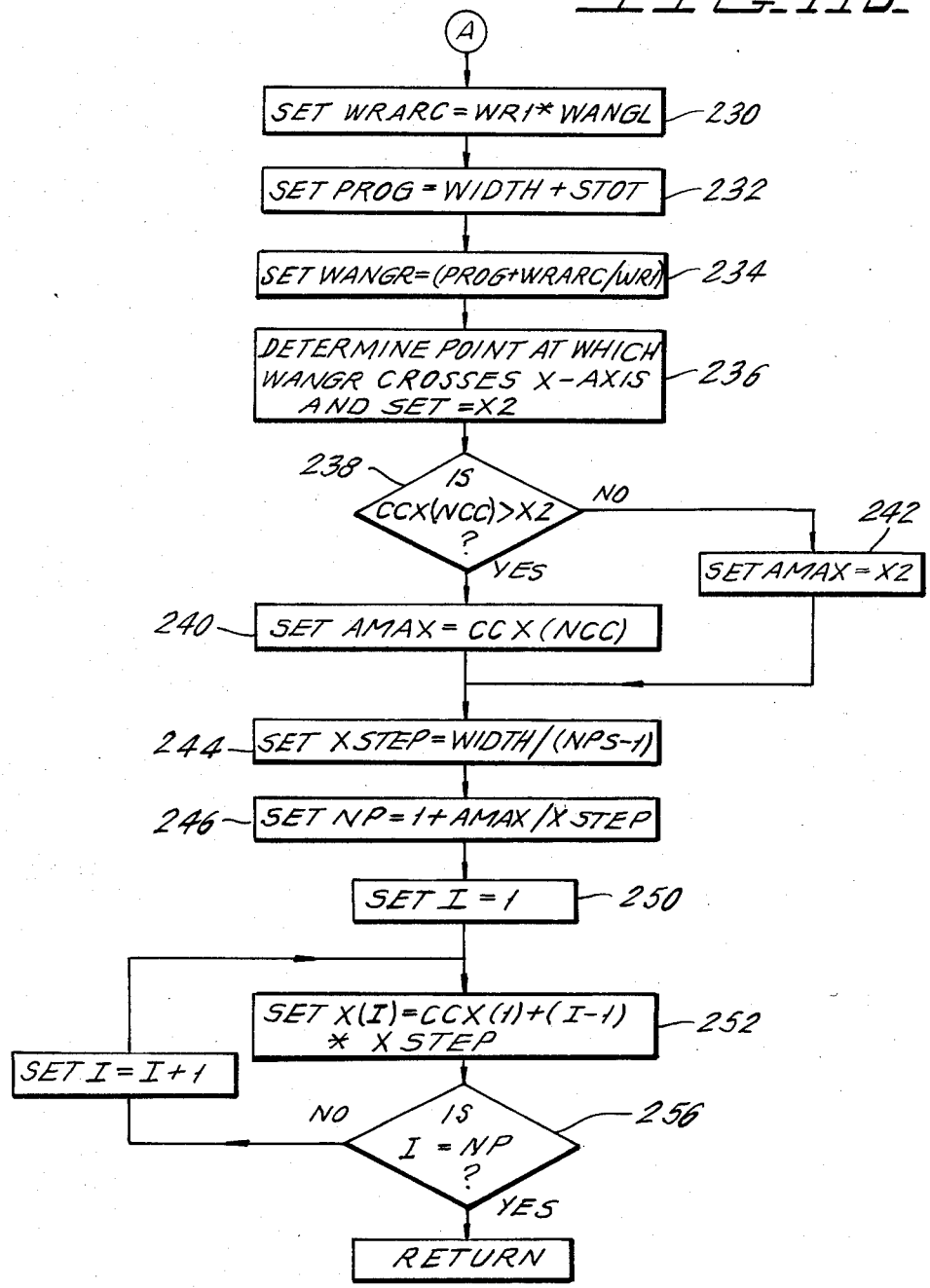

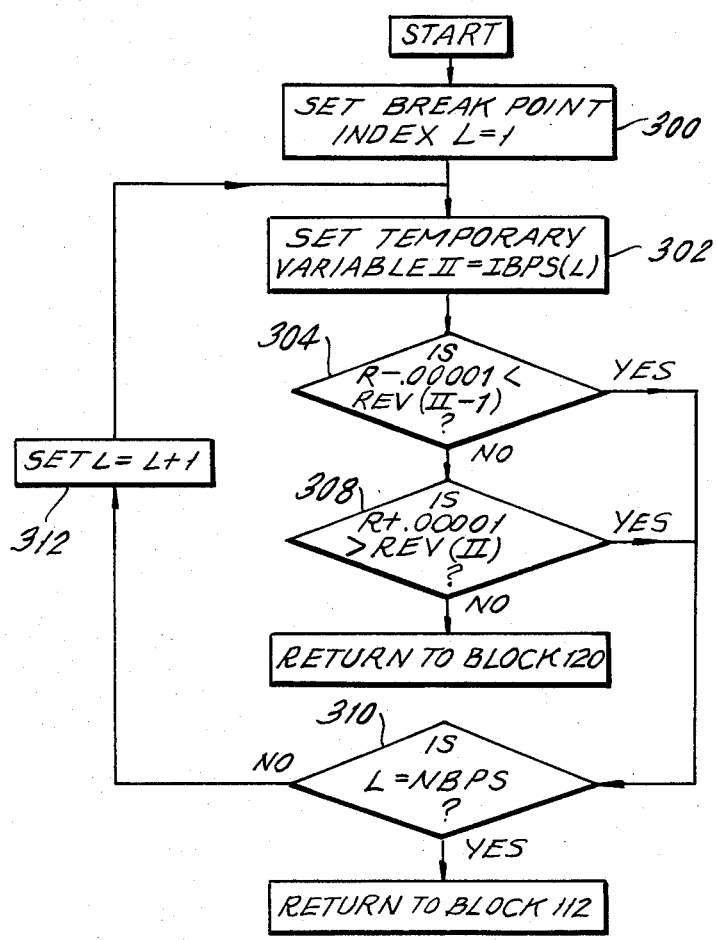

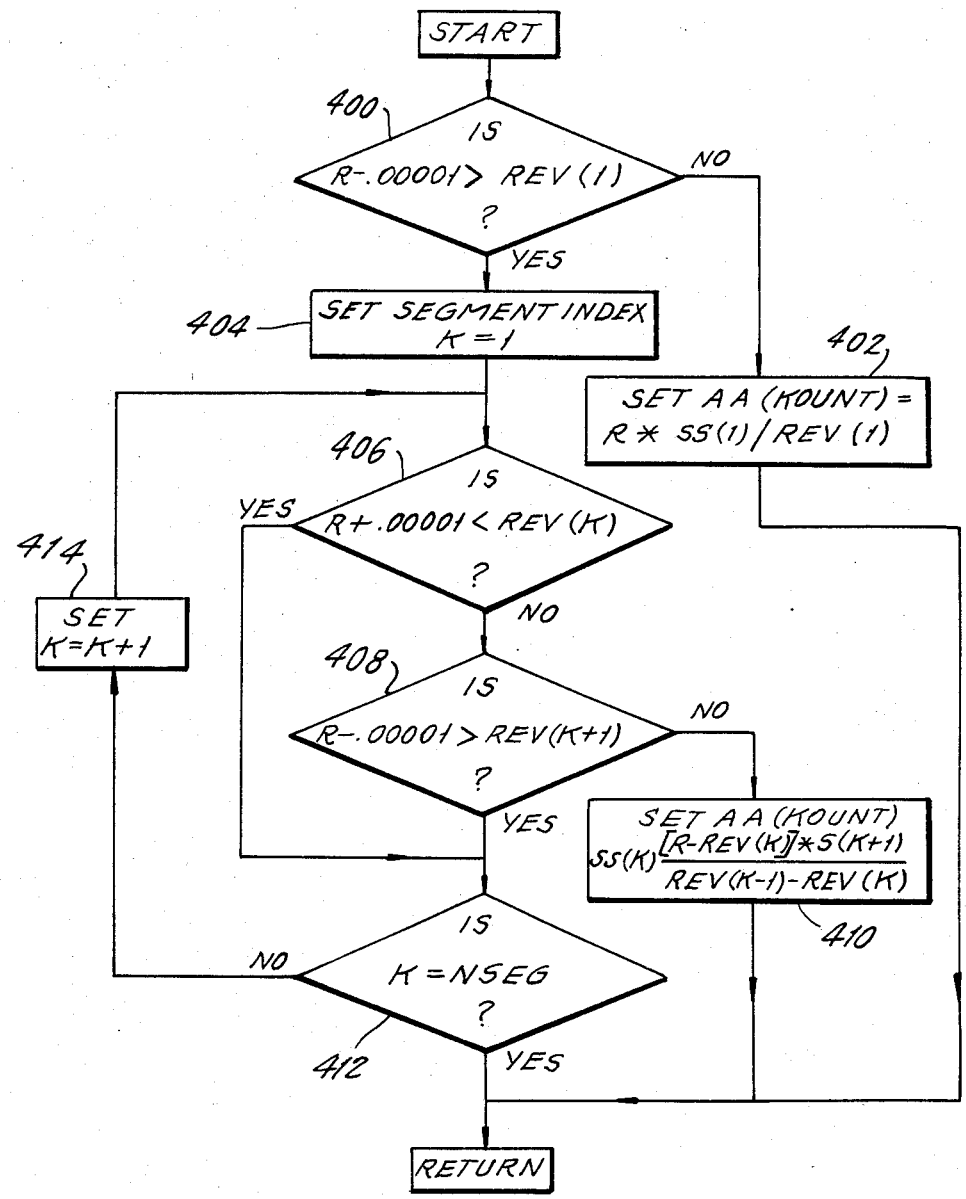

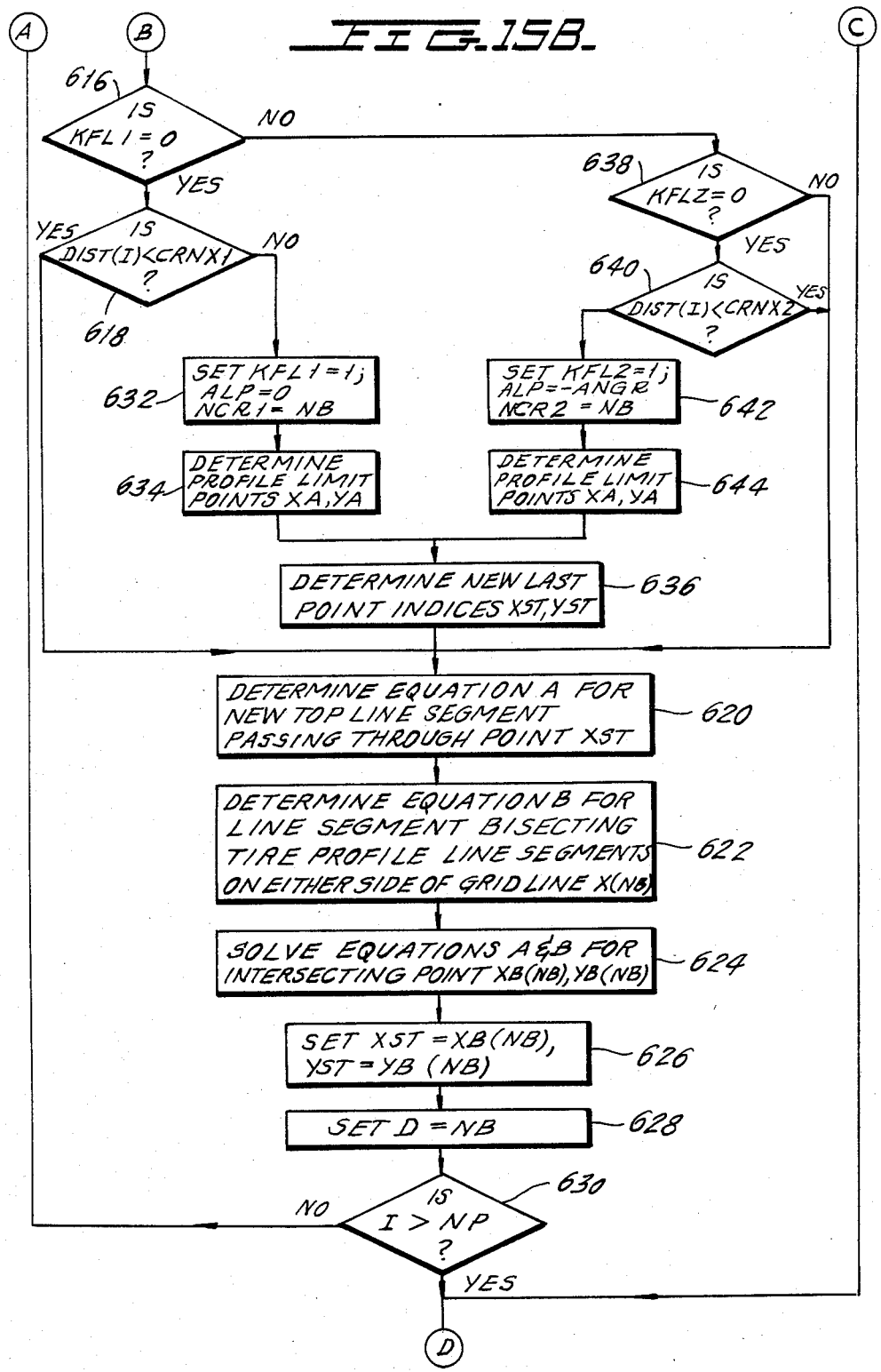

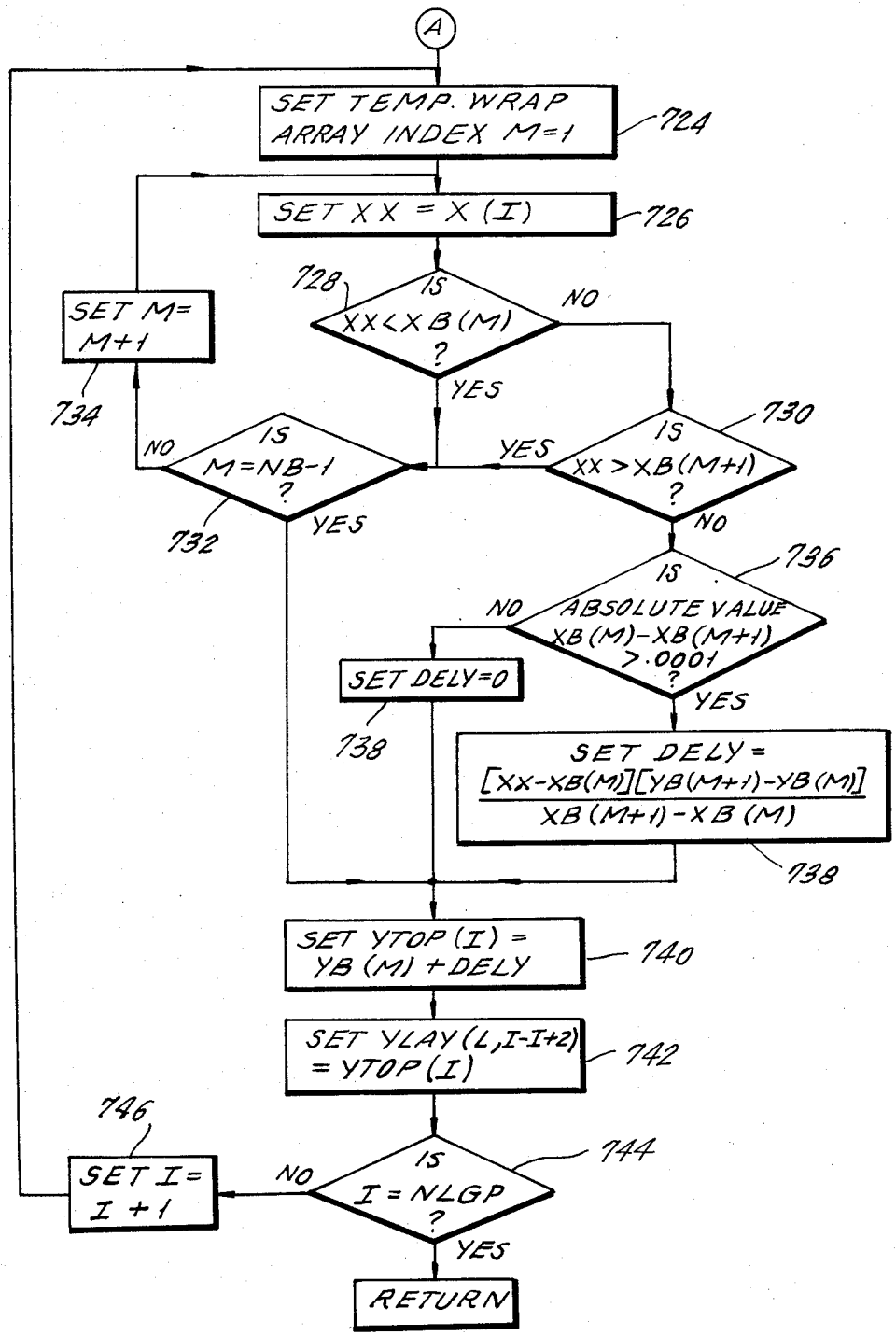

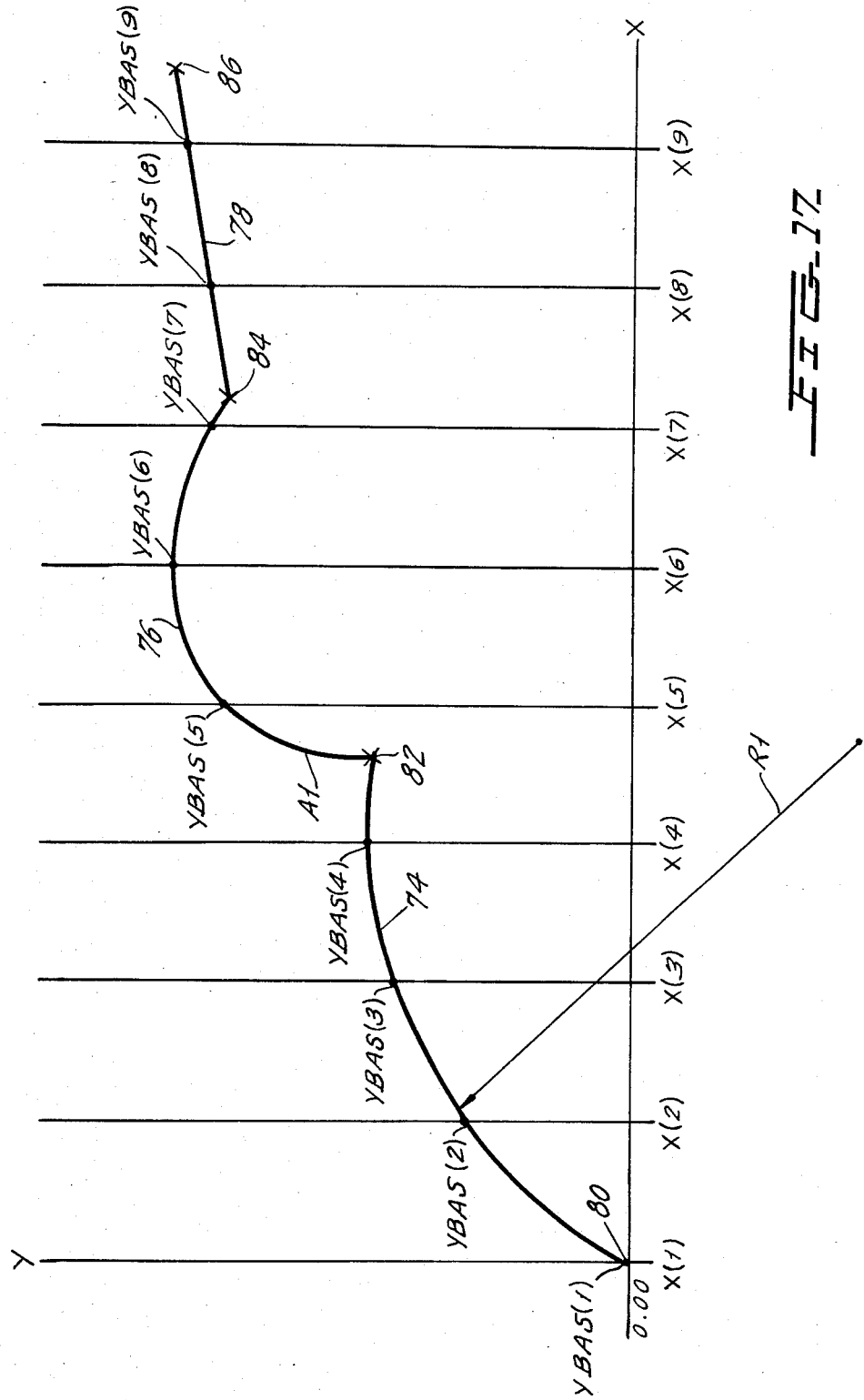

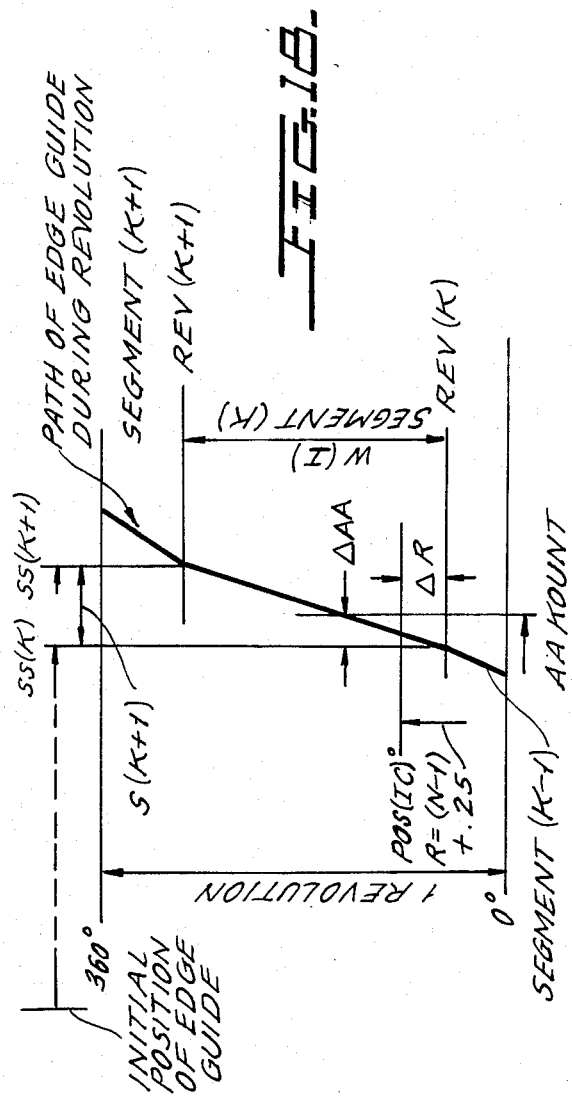
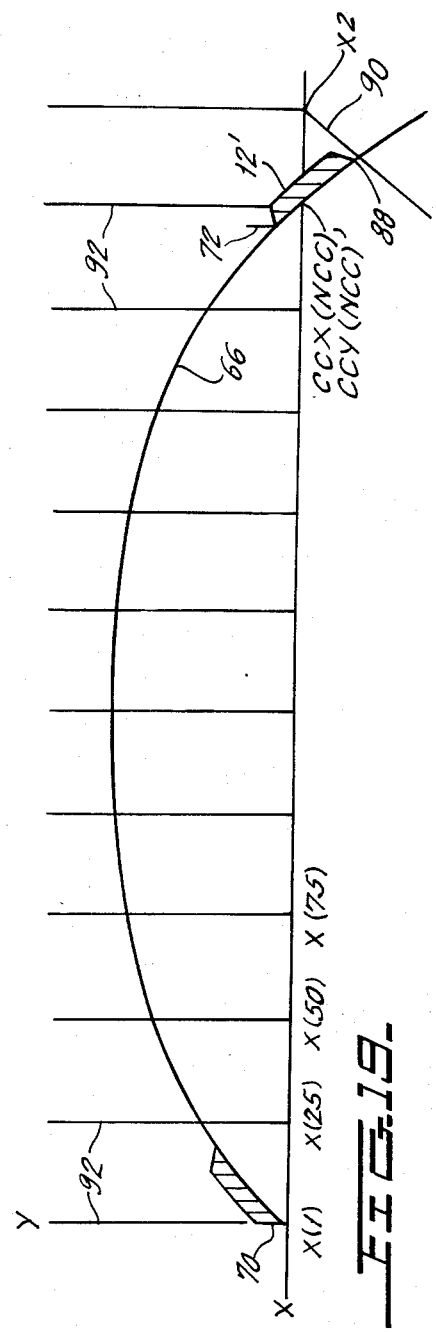
FIG. 18.
FIG. 19.

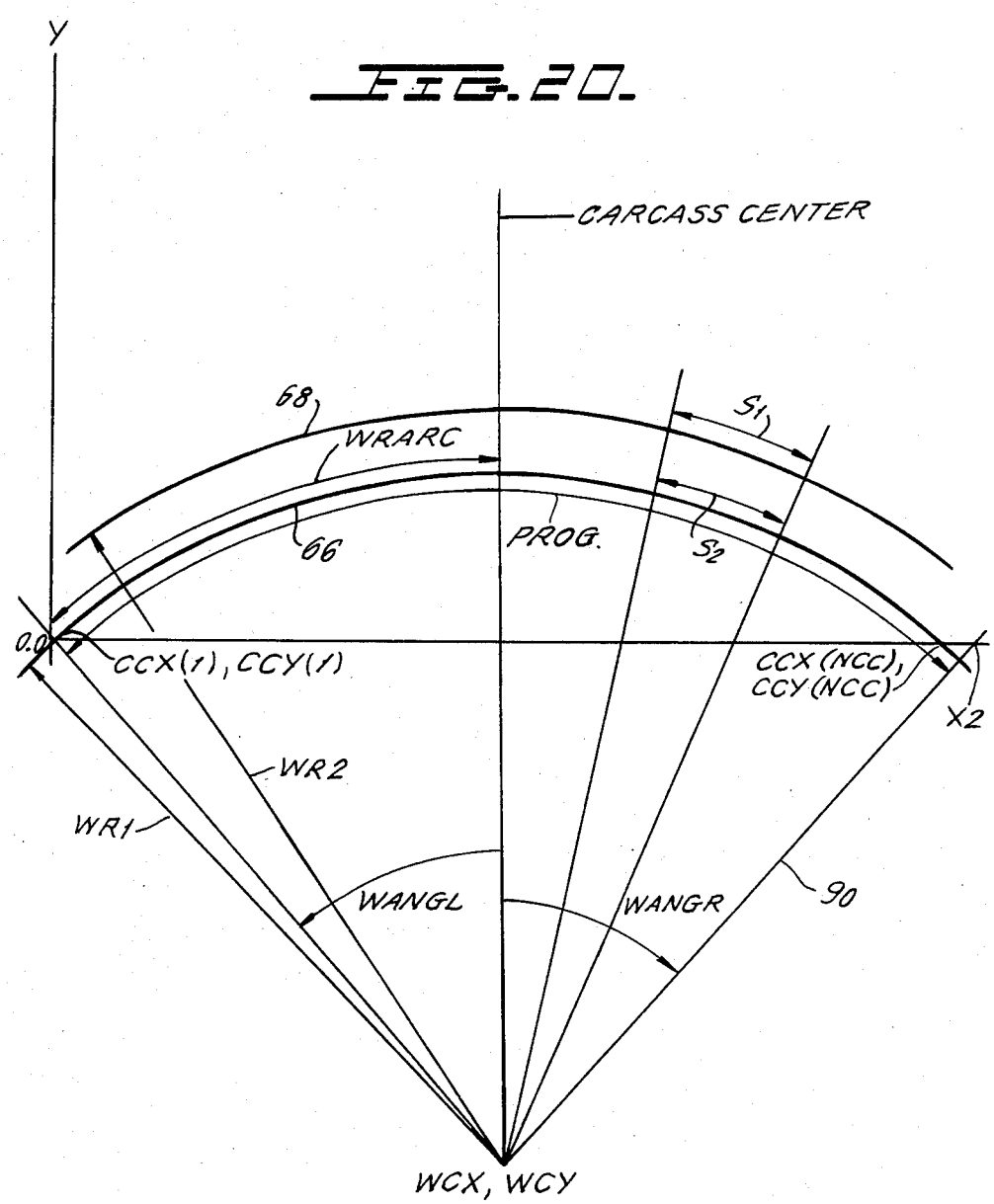

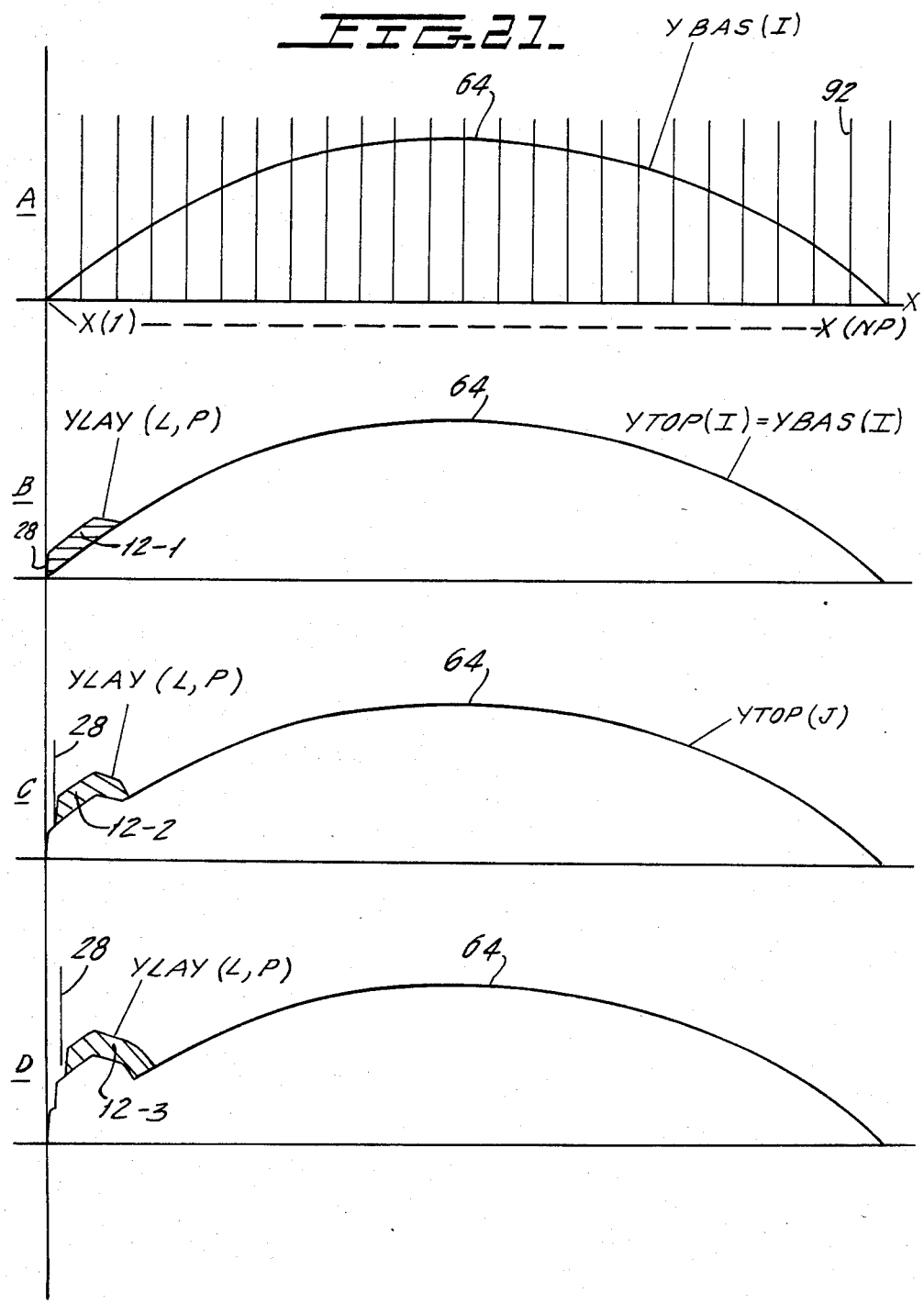

METHOD AND APPARATUS FOR THE SIMULATION OF THE BUILD UP OF THE TREAD ON A TIRE CARCASS

BACKGROUND OF THE INVENTION

The present invention relates to a method and apparatus for simulating the placement of a ribbon-like material on a generally cylindrical carcass (as used herein, carcass shall refer generally to a base structure) to build up a desired profile of the ribbon on the carcass. In the presently preferred embodiment described below, the ribbon is formed of rubber, has a trapezoidal profile and is placed on a tire carcass in accordance with a predetermined winding specification to build up a desired rubber profile on the carcass. While the invention will be described with reference to this particular application, it should be recognized that the method and apparatus can more broadly be applied to simulate any profile build up where a ribbon of known (constant or changing) profile is laid on any rotating carcass.

The present invention is particularly useful in simulating the manner in which an Orbitread (Orbitread is a trademark of AMF incorporated) tire treading machine (illustrated schematically in FIG. 1) builds a tread profile on a tire by placing ribbons of trapezoidal rubber on a rotating tire carcass (this may be either a bare carcass or a carcass having an old rubber profile in the case of retreads). As shown therein, an extruder 10 produces a continuous rubber ribbon 12 which is passed through a pair of rolling dies 14, 16 which compress the ribbon 12 into a trapezoidal shape (see FIG. 6). The ribbon is then threaded over idler rollers 18, 20 and 22 and applied to a guide roller 26 which presses the ribbon 12 onto the outer surface of the tire carcass. As shown in FIG. 2, the left-hand edge of the roller 26 is beveled to form a guide that ensures that the ribbon 12 will be placed onto the carcass at a desired lateral position of the carcass. The edge 28 of the roller 26 defines the specific point in which the left-hand edge of the ribbon 12 will be placed on the tire carcass 24 and will be referred to hereinafter as the edge guide.

As shown schematically in FIGS. 3A and 3B, the Orbitread tire winding machine causes the tire carcass 24 to rotate about its own axis 30, thereby taking up the ribbon 12 which is being extruded. By translating the tire laterally with respect to the edge guide 28, the ribbon 12 can be placed on different sections of the carcass 24. When the tire being wound is a bias tire, the carcass 24 is moved laterally along its spin axis 30 to vary the relative lateral position between the carcass 24 and the edge guide 28. When the tire being wound is a radial tire, the tire winding machine pivots the carcass 24 about a wind axis 32 which defines the center of a circle, an arc of which approximates the shape of the outer surface 34 of the tire. The tire winding machine varies the position of the wind axis 32 so as to adjust the wind radius W to approximate the particular shape of the outer surface 34 of the tire.

The manner in which the pivotal movement of the carcass about axis 32 changes the position at which the ribbon 12 is applied to the carcass can best be understood with reference to FIGS. 3A and 3B. In FIG. 3A, the carcass 24 is maintained at a 0° reference position wherein the ribbon 12 is applied to the center of the carcass. In FIG. 3B, the carcass 24 has been rotated counterclockwise to cause the ribbon 12 to be placed on the left end of the carcass 24. In each case, the position of the edge guide 28 with respect to the outer surface of the carcass 24 determines where the rubber 12 will be laid. In the present commercial embodiment, the edge guide 28 remains stationary while the carcass 24 is translated. Obviously, the same result can be achieved by translating the edge guide 28 and maintaining the carcass 24 at a single location. In either case, it is the relative movement between the edge guide 28 and the carcass 24 which determines where the rubber 12 will be laid. In the following description, reference will be made to the azimuthal movement of the edge guide along the arc prescribed by the wind radius W. Such references are used to indicate relative movement between the edge guide 28 and the carcass 24, whether it is the edge guide or the carcass (or both) that is being translated.

Utilizing the Orbitread tire winding machine, a plurality of winds of the rubber ribbon (a wind being a single strip of the rubber ribbon 12 placed around a single revolution of the tire) is placed on the outer surface 34 of the tire to form a desired tire profile. Once the rubber has been built up to the desired profile, the tire is removed from the Orbitread tire winding machine and placed in a mold which both cures the rubber and forms the desired tread pattern.

A typical rubber profile of a tire build formed in accordance with the Orbitread tire winding process is illustrated in FIG. 4A. As shown therein, a plurality of ribbons 12 is placed on the carcass 24 to form the desired profile. The manner in which the profile is formed is determined by a winding specification which is entered by a programmer into the Orbitread machine and defines the relative lateral movement between the edge guide 28 and the carcass 24 during each revolution of the carcass about its spin axis 30. The winding specification for the cross-section illustrated in FIG. 4A is shown in FIG. 4B. The winding specification includes a plurality of segments, each of which describes the desired movement of the edge guide relative to the carcass 24 during that segment. In the first segment, the edge guide is maintained stationary (S=0.0) and the carcass 24 is rotated through one revolution (REV=1) to cause a single wrap to be placed on the carcass 24. Since the carcass 24 is initially in the position illustrated in FIG. 3B, a single ribbon 12 will be placed along the leftmost edge of the carcass 24. During the second segment, the edge guide is translated 2.25 inches as measured along the arc prescribed by the wind radius W during a total of 0.90 revolutions of the tire. In the presently available commercial embodiment of the Orbitread tire winding machine, movement of the edge guide 28 is linear (equally distributed) during each segment. The method and apparatus for simulating the winding process, therefore, assumes such linear movement. It should be recognized, however, that non-linear movement could also be utilized in the actual ribbon laying system and would be duplicated in the simulation process.

The process is continued for the entire winding specifications until all the wraps of ribbon 12 are applied to the carcass. The winding specification which is applied to the tire winding machine is developed by a trained programmer who has significant experience with the system and can make a fairly accurate guess as to what specification will produce a desired tire profile. Once the programmer has guessed at the required winding specification, he enters it into the tire winding machine and produces a test run. The tire formed in accordance with the proposed winding specification is then removed from the system and cut along its axis to examine the actual tire profile resulting from the entered specification.

While the programmer is normally fairly accurate, the actual profile of the tire produced by the specification developed by the programmer will normally vary from the desired profile 36 as shown in FIG. 4A. In this example, an excess amount of rubber is formed on the left-hand side of the profile as well as on the topside of the profile while a shortage exists on the upper right-hand corner of the profile. After examining the actual profile of the rubber laid by the Orbitread machine, the programmer will then revise the winding specification in a manner which he believes will correct the errors in the profile.

The new winding specification is then entered into the Orbitread machine which builds a new profile on a new carcass 24. The resulting rubber build is then examined by cutting the tire along its axis and comparing the actual profile with the desired profile. If necessary, the winding specification is again revised and the process repeated until the actual profile conforms to the desired profile 36 to a sufficient degree.

Using the foregoing procedure, the programmer is able to develop a desired winding specification which may then be used to build a tread layer on a large number of tires. This process, however, is time-consuming and wastes rubber due to the need to actually build a rubber profile on a tire carcass each time the winding specification is modified to see if the change in the winding specification produces the desired results in the rubber profile. This process also causes undesirable down time on the system since the machine cannot be producing usable tires while it is being used to test a new winding specification.

BRIEF DESCRIPTION OF THE PRESENT INVENTION

In order to overcome the drawbacks of the foregoing process, the present invention uses a programmed digital computer to simulate the manner in which the rubber ribbon is laid on the carcass and produces a visual output which shows both the actual tire profile which will be attained using a proposed winding specification and the desired rubber profile which the programmer wishes to attain. This lets the programmer immediately compare the results of his proposed winding specification to the desired profile. The programmer may then update the winding specification and produce yet another profile simulation which he may again compare to the desired profile. Since the computer can simulate the profile which will result from an entered winding specification in a manner of seconds, there is significant time savings using the present invention. Additionally, since no ribbon need be wound on a tire carcass, materials are not wasted and there is no down time on the Orbitread system for producing the experimental profile.

In accordance with the preferred embodiment of the present invention, the method and apparatus for simulating the tire profile can simulate the profile at a plurality of angular cross-sections of the tire profile. For example, four different cross-sections, each located 90° degrees apart, may be obtained. This provides the programmer with important information since the desired profile might be obtained at one cross-section and not at another.

Additionally, the present invention automatically calculates the total cross-sectional area of the profile as well as the percent imbalance (the percent by which the left half of the profile varies from the cross-sectional area of the right side of the profile) of the tire. This provides the programmer with further information which he may use to produce a better winding specification.

In the description of the invention set forth below, it will be assumed that the present invention is being used to simulate the build up of a tire tread on a radial carcass using the Orbitread tire winding system as illustrated in FIGS. 3A and 3B. It will be apparent to those of ordinary skill in the art that the invention could be used to simulate the build up of a ribbon on a biased tire carcass. In such a case, the outer surface 34 of the carcass 24 is substantially cylindrical and the carcass 24 is translated along the axis 30 rather than about the winding axis 32. Such a simulation is, in fact, simpler than that described below since movement of the tire is linear rather than angular.

BRIEF DESCRIPTION OF THE DRAWINGS

For the purposes of illustrating the invention, there is shown in the accompanying drawings an embodiment which is presently preferred, it being understood, however, that this invention is not limited to the precise arrangements and instrumentalities shown.

FIG. 4B is a winding specification which produced the build of FIG. 4A;

FIG. 8 is a graph illustrating the manner in which the wind radius of the tire winding machine varies during successive passes of the edge guide over the tire carcass;

FIG. 9 is a diagram illustrating the types of line segment which may be used to store information concerning the carcass profile and the desired final rubber profile;

FIGS. 10–16 are flow charts of the program used by the computer of FIG. 5 to carry out the method of the present invention;

FIG. 17 is a graph illustrating the manner in which the carcass profile is projected onto a reference grid;

FIG. 18 is a graph illustrating the movement of the edge guide during a single rotation of the tire;

FIG. 19 is a graph used to illustrate the manner in which the width of the reference grid is computed;

FIG. 20 is a graph showing various variables which are used in the program of FIGS. 10–16;

FIG. 21 is a series of graphs illustrating schematically the method used by the present invention to determine the profile of each successive wrap in the cross-section being considered;

DETAILED DESCRIPTION OF THE PREFERRED EMBODIMENT

Figure 5:
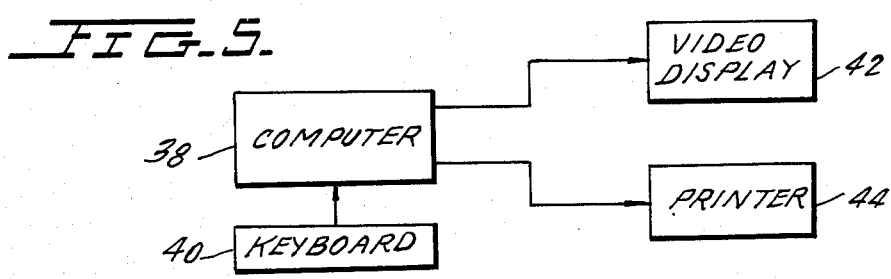
FIG. 5 is a block diagram of the apparatus of the present invention.

The method and apparatus of the present invention will now be described with reference to FIGS. 5–30. As shown in FIG. 5, the apparatus of the present invention includes a programmed digital computer 38 which receives information from a keyboard (or other input device) 40, computes the actual profile which would be formed by the Orbitread tire winding machine in accordance with a given winding specification and then displays the profile on a video display 42 or other output device. A printer 44 is preferably utilized to obtain a permanent copy of the simulated profile. The computer 38 performs the simulation using a software program which is illustrated in flow diagram form in FIGS. 10–16 and will be described in detail below.

Before a tire profile can be simulated, the programmer must enter information concerning the profile of the ribbon 12, the profile of the outer surface 34 of the carcass on which the ribbon 12 is to be wound, the winding specification, the number of profile cross-sections desired and their angular position relative to the point at which the initial ribbon is laid, and the desired profile of the rubber build. This information can be entered through the keyboard 40 or any other input device. Additionally, information can be stored in the memory of computer 38 and periodically updated using the keyboard 40.

Figure 6:
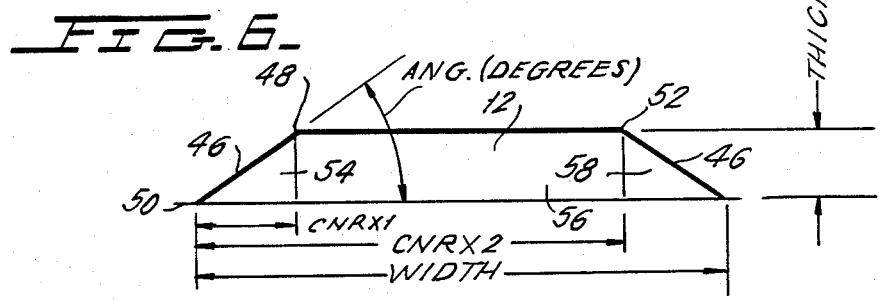
FIG. 6 is a cross-sectional profile of the ribbon used in the tire winding machine of FIG. 1.

As shown in FIG. 6, the cross-sectional profile of the ribbon 12 utilized in the Orbitread tire winding process, is trapezoidal in shape and can be defined in terms of the following variables:

1. The linear width (e.g. in inches) of the ribbon 12 as measured along its base;

2. The linear thickness (e.g. in inches) of the ribbon 12 as measured perpendicular to its base; and 3. The angle (in degrees) that the slanted edges 46 of the ribbon 12 form with respect to the base.

The values of these variables are stored in the computer 40 as variables WIDTH, THICK and ANG, respectively.

Figure 7:
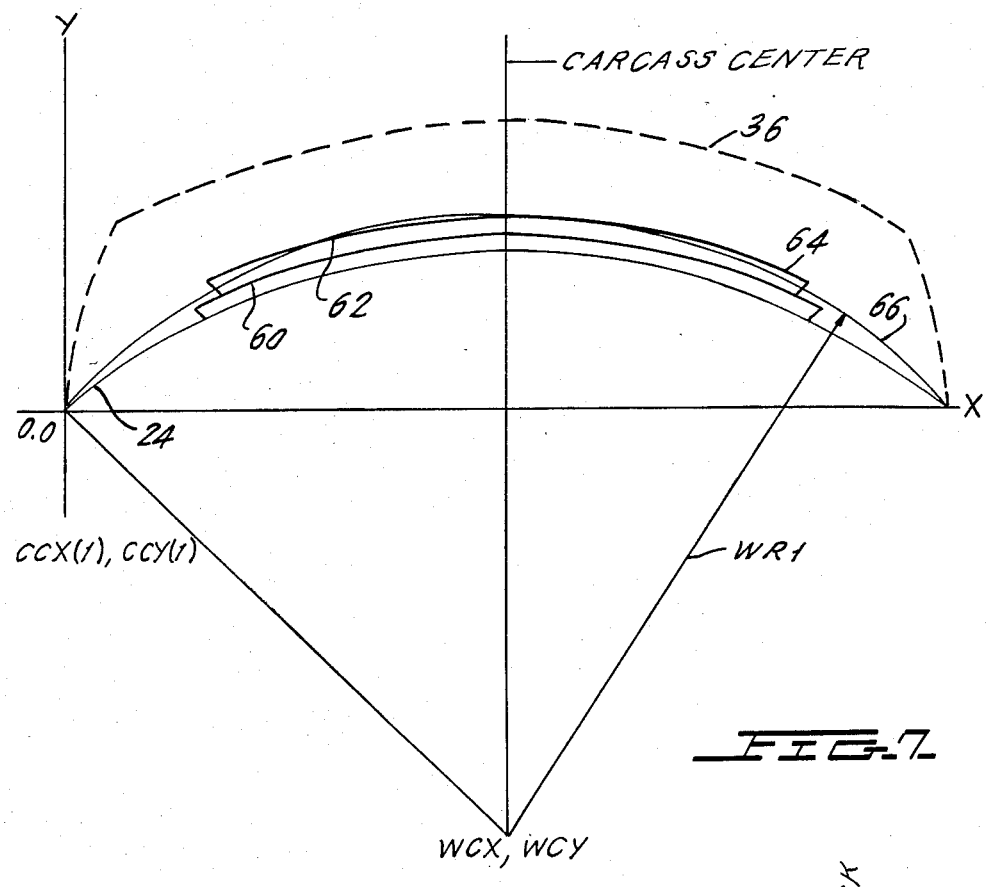
FIG. 7 is a graph illustrating the carcass profile upon which a rubber build is to be laid and the desired profile of the final tire build.

In addition to entering the dimensions of the ribbon, the programmer enters the desired dimensions and shape of the final tire profile 36 as well as the dimensions and shape of the tire carcass 24. Typical profiles are illustrated in FIG. 7. As shown therein, the carcass 24 will typically have a plurality of belts 60, 62 formed thereon. The exposed upper surface of the elements 24, 60 and 62 combine to define the carcass profile 64 on which the ribbons are laid.

In the presently preferred embodiment, both the desired profile 36 and the carcass profile 64 are defined as a plurality of line segments which can either be straight lines, radii or arcs. The three types of line segments are illustrated in FIG. 9. As shown therein, the first segment "L" is a straight line defined as extending between points $x(1)$, $y(1)$ and $x(2)$, $y(2)$. The second line segment "R" is an arc of a circle extending between points $x(2)$, $y(2)$ and $x(3)$, $y(3)$ and having a radius $R(3)$. The third line segment "A" is an arc extending between points $x(3)$, $y(3)$ and $x(4)$, $y(4)$ and having an arc length $A(4)$. Using these three types of line segments, substantially any type of profile can be defined. The information on both the desired profile 36 and the carcass profile 64 is entered into the computer with respect to an arbitrary x-y coordinate system. For simplicity, the starting point of the carcass profile 64, and the starting point of the desired tire profile may be selected to pass through the origin of the x-y axis. If desired, however, the starting point can be displaced from one or both axes.

The carcass profile is stored as a series of carcass profile arrays ICC(NCC), CCX(NCC), CCY(NCC), CCR(NCC) and CCA(NCC). The array ICC(NCC) identifies the type of line segment (i.e., straight line, arc or radius) that each segment is, the arrays CCX(NCC) and CCY(NCC) identify the starting point of each line segment NCC, the array CCR(NCC) identifies the radius of each line segment NCC which is a radius, and the array CCA(NCC) identifies the arc length of each line segment NCC which is an arc. The desired final tire shape profile is similarly stored in tire profile arrays TSS(NCC), TSX(NCC), TSY(NCC), TSR(NCC) and TSA(NCC) which store information which is equivalent to the information stored in the carcass arrays.

As noted above, a winding specification such as that illustrated in FIG. 4B is entered into the keyboard 40 and defines the movement of the edge guide 28 along an arc of a circle defined by the wind radius W1. As shown in FIG. 8, this arc (the wind arc 66) preferably approximates the outer surface of the carcass profile. When the winding specification calls for several passes of the edge guide 28 with respect to the tire carcass 24, the edge guide 28 will move in a single direction—e.g., left to right—during the first path and will reverse direction for each successive pass. As a result, one layer of ribbons 12 will be laid on top of a prior layer of ribbons 12 during each successive pass. In such cases, the Orbitread tire winding machine increases the wind radius for each successive pass to accommodate for the fact that the effective radius of the upper surface of the tire build will be increased after each layer of ribbons 12 is added to the carcass 24. This process can better be understood with reference to FIG. 8 which presumes that the winding specification calls for two passes, the first left to right, the second right to left. During the first pass, the carcass profile 64 (FIG. 7) is approximated by the wind arc 66 which has a wind radius WR1 whose center is located at the point WCX, WCY. During the second pass (FIG. 8), the previously laid ribbons have increased the effective radius of the tire build. As a result, the tire winding machine increases the wind radius to WR2 which prescribes a wind arc 68 which approximates the shape of the rubber profile after the first pass has been completed. Since this information is required to simulate the tire winding process, the location of the wind center WCX, WCY as well as the length of the wind radius WR(P) for each respective pass P is entered into the keyboard 40 as part of the wind specification.

Referring to the winding specification of FIG. 4B, each incremental azimuthal distance S which is positive in magnitude represents movement during the first pass from the left-hand side of the carcass to the right-hand side of the carcass as measured along the wind arc 66. The incremental azimuthal distances S which are negative, indicate movement during the second pass from the right-hand side of the carcass to the left-hand side of the carcass. These later distances are measured along the second wind arc 68 rather than the first wind arc 66. Many winding specifications include one or more breakpoint segments. A breakpoint segment is one in which the edge guide is moved without laying a ribbon. This will occur, for example, when the edge guide changes directions. In the winding specification of FIG. 4B, segment 10 is a breakpoint segment.

The programmer enters the winding specification by entering the following information:
1. The total number of segments in the winding specification—stored as NSEG;
2. The number of revolutions in each respective segment—stored as incremental revolution array W(K) wherein K is the segment index;
3. The total distance to be moved in each respective segment along the appropriate wind arc—stored as incremental azimuthal distance array S(K) wherein K is the segment index;
4. The center of the wind radius—stored as WCX, WCY;
5. The length of each respective wind radius—stored as wind radius array WR(P) wherein P is the pass index;
6. The total number of breakpoint segments in the winding specification—stored as NBPS; and
7. The segment number of each individual breakpoint segment—stored as a breakpoint segment array IBPS(L) wherein L is the breakpoint index.

Finally, the programmer enters information identifying the cross-sections of the tire which he would like to examine. These cross-sections are stored in PROFILE cross-section array POS(IC) wherein the index IC is the cross-section index. The first cross-section might typically be at 0°, the second cross-section at 90°, the third cross-section at 180° and the fourth cross-section at 270°.

Figure 4A:
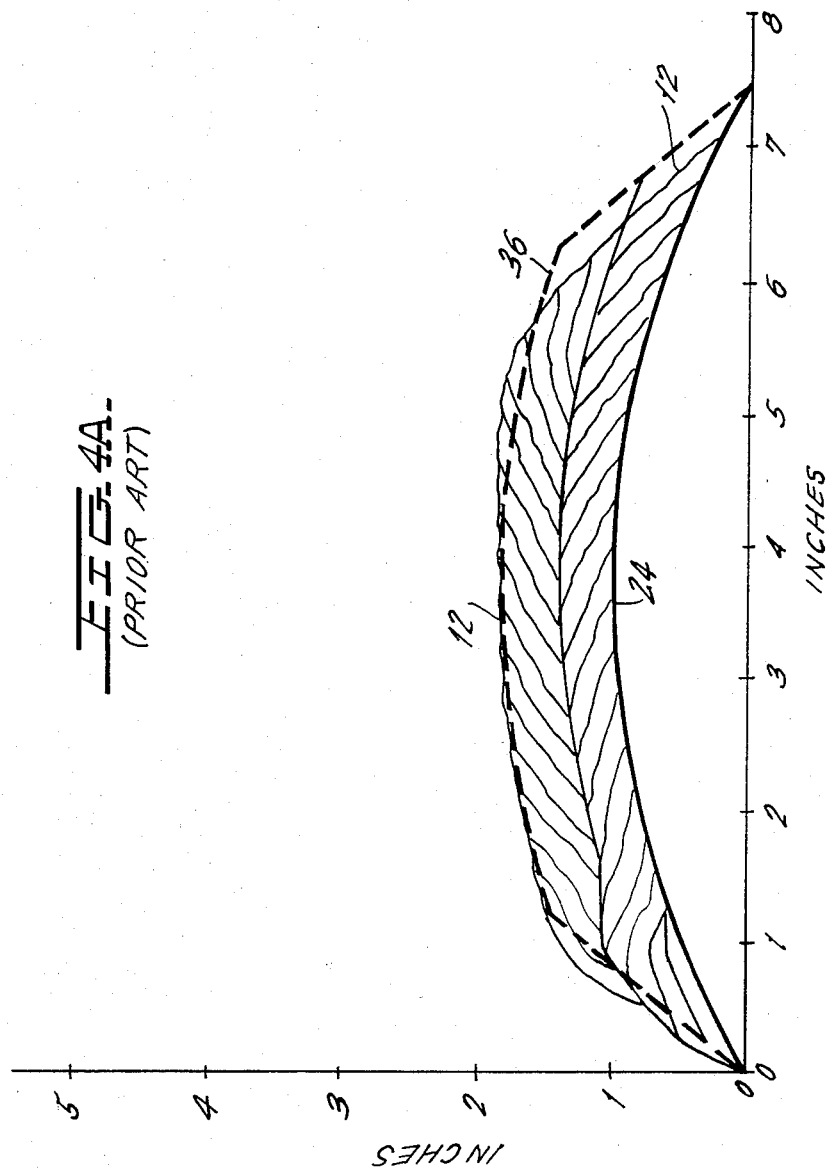
FIG. 4A is a graph illustrating a cross-section of a tire having a rubber build laid by the tire winding machine of FIG. 1.

Once the foregoing information has been entered into the keyboard 38, the computer 40 is ready to simulate the placement of ribbon 12 on the carcass profile 64 in accordance with the winding specification and will present a pictorial representation of the tire profile which results from the entered winding specification as well as the desired tire profile in the manner illustrated in FIG. 4A. This simulation is achieved utilizing the computer program illustrated in flow chart form in FIGS. 10-16.

Before describing the program of FIGS. 10-16 in detail, it is helpful to provide a brief overview of the approach the program of the present invention utilizes to simulate the laying of the ribbon. This process can best be understood with reference to FIG. 21.

Line A of FIG. 21 illustrates the carcass profile 64 as defined by the input carcass data. As noted above, this data is initially entered into the computer as a series of line segments. Throughout the program, it is necessary for the computer to determine the y value of the carcass profile 64 at different points along the x-axis. It is impractical for the computer to calculate the y value of the carcass 64 for a given x-coordinate from the wind segment data each time a new y value is required. For this reason, the program initially projects the carcass profile 64 onto a reference grid comprising a plurality of reference lines 92 which are evenly spaced along the x-axis and run parallel to the y-axis. While relatively few reference lines 92 are illustrated in FIG. 21, it should be recognized that a large number of lines, typically in the order of 500-600 lines, are used. These reference lines are stored as an array X(I) wherein the grid line index I extends from 1 to NP (NP=the total number of grid lines in the reference grid). Each element of the array X(I) will store the distance along the x-axis of the Ith grid line.

Using this grid as a reference, the shape of the carcass profile 64 may now be stored as a base profile array YBAS(I). Each element of the base profile array YBAS(I) will store the y value at which the carcass profile 64 crosses the associated grid line 92. Thus, the first element YBAS(1) of the array YBAS(I) will store the y value at which the carcass 64 intersects the first grid line X(1), the second element YBAS(2) of the array YBAS(I) will store the y value at which the carcass profile 64 intersects the second grid line X(2), etc. Once the carcass profile 64 is stored in the array YBAS(I), the program is ready to begin laying the ribbon 12 on the carcass profile 64. While one continuous ribbon (or a few ribbons if the winding specification contains one or more breakpoint segments) is laid on the carcass profile 64, the method of the present invention treats each cross-section of the ribbon falling within the tire cross-section being examined as a separate wrap which is laid on top of the then existing tire profile (which profile includes the carcass profile and the profile of any previously laid wraps).

Referring to line B of FIG. 21, the computer initially stores the carcass profile YBAS(I) in an array YTOP(I) which defines the profile of the upper surface of the tire after the last wrap has been placed on the tire. At the beginning of the wrap laying process, no wraps have been laid. As such, the tire profile array YTOP(I) is equal to the carcass profile array YBAS(I). The program then lays the first wrap 12-1 on the tire profile defined by array YTOP(I). To this end, the computer determines the position of the edge guide 28 (this will initially be at the origin of the x-y axis) and computes the profile of the top surface of the first wrap 12-1 taking into account both the profile of the present tire top surface defined by YTOP(1) and the trapezoidal shape of the ribbon 12. The profile of the top layer of the wrap 12-1 is stored in the two-dimensional array YLAY(L,P) for later use. Additionally, it is added to the present tire profile YTOP(I) so as to define a new tire profile YTOP(I) which includes both the carcass profile 64 and the top profile of the first wrap 12-1. See line C of FIG. 21. At this point, the edge guide 28 is moved to its new position for the laying of the second wrap 12-2 and the second wrap is laid upon the top of the present tire profile YTOP(I). The computer then computes the new top surface for the second wrap 12-2 taking into account both the trapezoidal shape of the ribbon and the shape of the tire surface YTOP(I) upon which the second wrap is being laid. After computing the top surface of the second wrap, the program stores the profile of the top surface in the array YLAY(L,P) for later use and updates the tire profile YTOP(I) to include the carcass profile 64 plus the profile of the tops of the first two wraps.

The updated tire profile YTOP(I) is illustrated in line D of FIG. 21. At this point, the computer determines the new location of the edge guide 28 for the laying of the third wrap 12-3 and then lays the third wrap to the right of the edge guide 28. Again, the profile for the top of the third wrap 12-3 is computed taking into account both the trapezoidal shape of the ribbon and the tire profile as defined by the updated YTOP(I). This process is repeated until all of the wraps of the cross-section are laid. At the end of the process, the tire profile array YTOP(I) will define the final tire profile while the array YLAY(L,P) will define the profile of the individual wraps. The computer plots these arrays, together with the carcass profile YBASE(I) to produce the graph illustrated in FIG. 4A.

Having described the general procedure in which the method of the present invention simulates the laying of the ribbon on the tire carcass, the preferred computer program for carrying out the invention will now be described in detail.

Figure 10B:
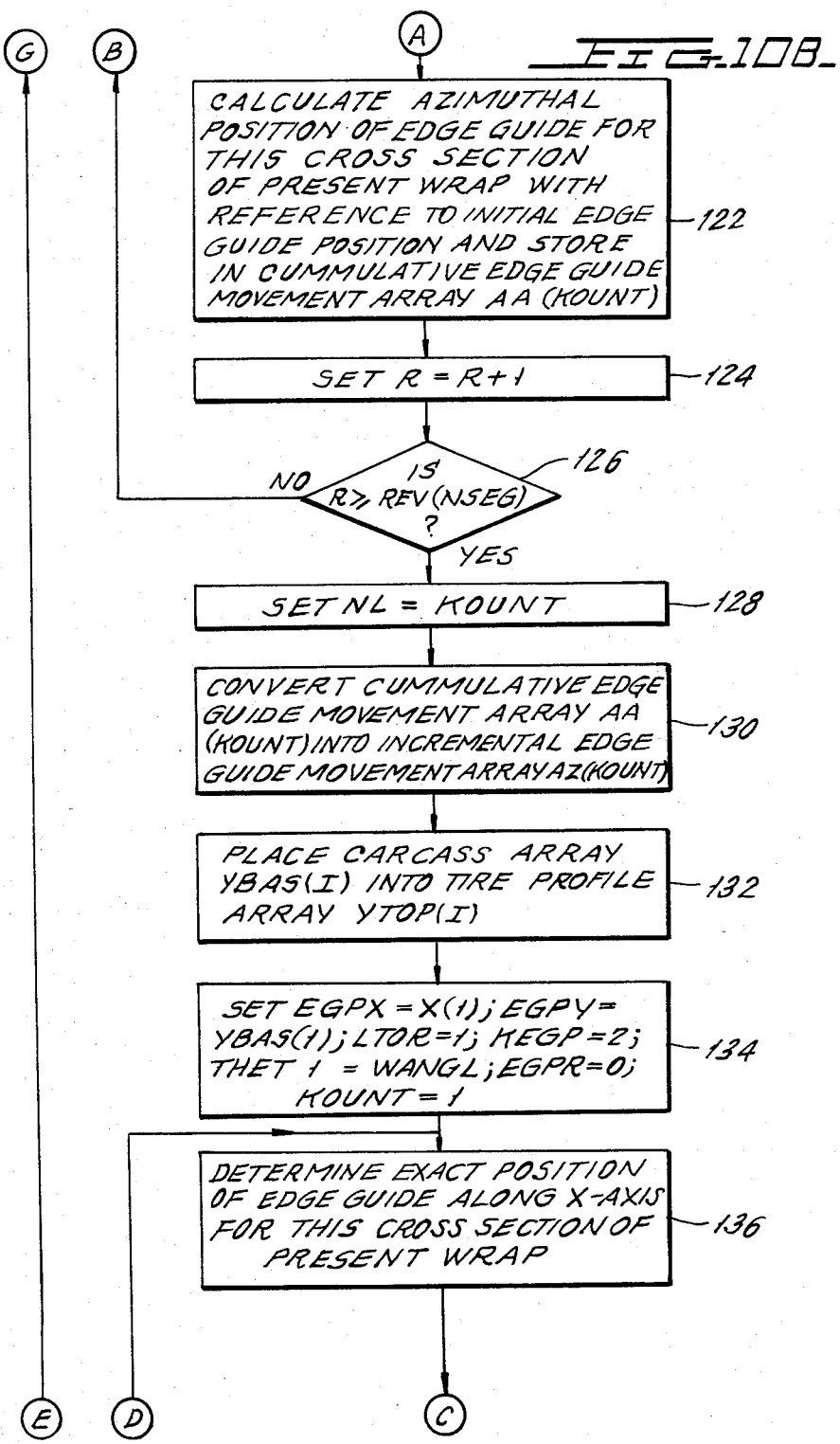
Figure 11A:
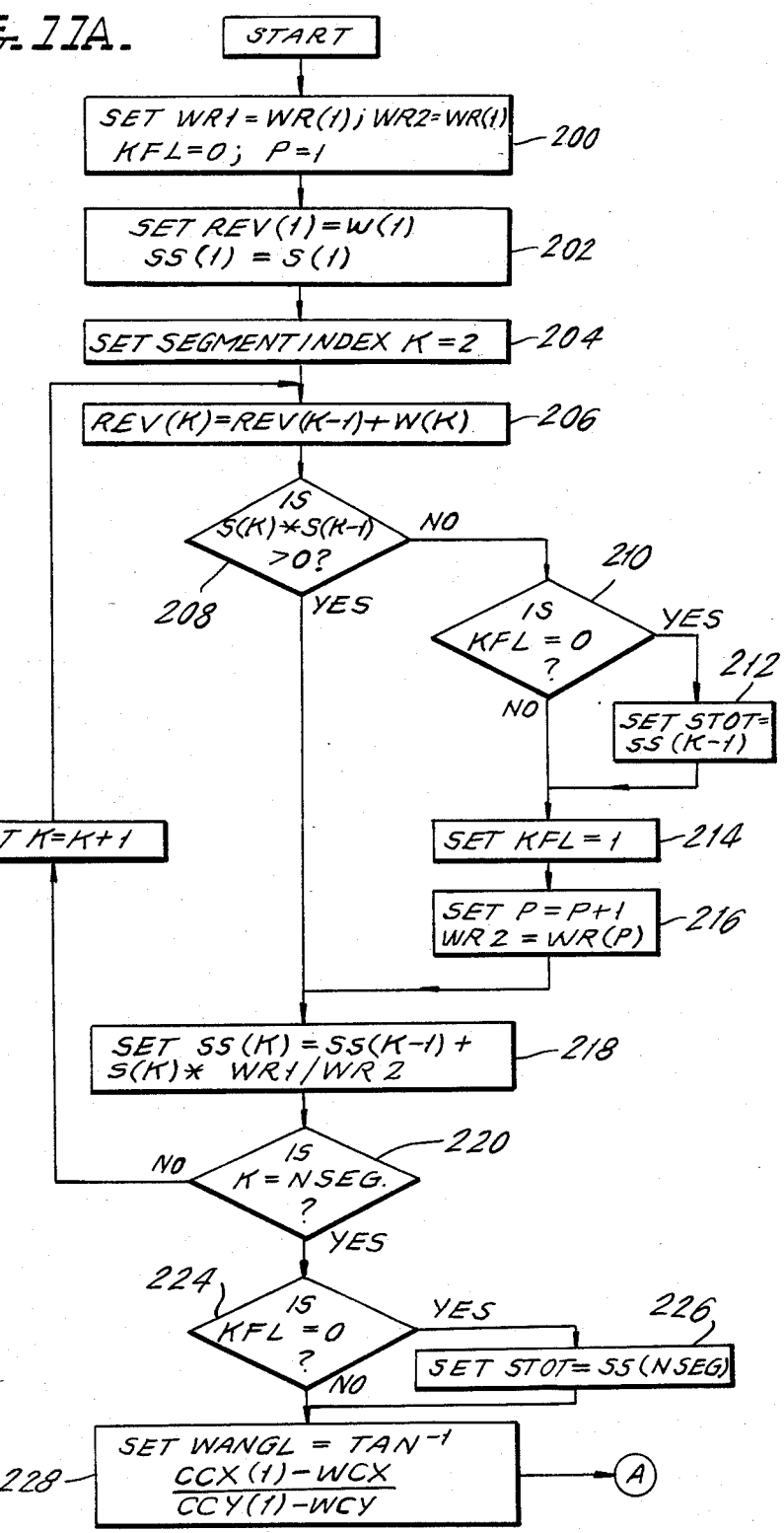

Referring to FIG. 10A, the initial step to be carried out by the program (instruction block 100) is to set up the array X(I) which defines the reference grid lines 92. The subroutine for creating the array X(I) is illustrated in FIGS. 11A and 11B. This subroutine also computes the cumulative azimuthal distance array SS(K) and the cumulative revolution array REV(K) from the winding specification. The array SS(K) stores the cumulative azimuthal distance as measured along the first wind arc 66, that the edge guide has moved from its initial position at the end of each segment K of the winding specification. Similarly, the array REV(K) stores the cumulative number of revolutions that the tire will have been rotated at the end of each segment K.

Before setting up the reference grid and calculating the arrays SS(K), REV(K), the program initializes the variables set forth in instruction block 200. Particularly, the wind radius variables WR1 and WR2 (used to convert azimuthal distances along subsequent wind arcs to equivalent distances along the first wind arc 66) are set equal to the first wind radius WR(1) entered by the programmer, the first pass flag KFL (which identifies whether the segment K of the winding specification presently being examined by the program falls within the first pass) is set to 0 and the pass index P (which indicates whether the segment K presently being considered by the programs falls within the first pass) is set by 1.

At this point, the program is ready to compute the cumulative revolution array REV(K) and the cumulative azimuthal edge guide movement array SS(K). In order to create these arrays, the program proceeds to instruction block 202 and sets the first element of arrays REV(K) and SS(K) equal to the first element of the resolution array W(K) and the edge guide movement array S(K) (these later arrays were entered by the programmer as part of the winding specification), respectively.

Proceeding to instruction block 204, the program sets the segment index K equal to 2 and enters a loop including blocks 206-222 whih calculates the remaining elements of the revolution and azimuthal distance arrays REV(K) and SS(K), respectively. Proceeding to instruction block 206, the program determines the next element of the cumulative revolution array REV(K) by adding the number of revolutions in the Kth segment to the total number of revolutions completed through the $(K-1)$th segment (i.e., the $(K-1)$th element of the cumulative revolution array REV$(K-1)$ which has already been calculated).

Proceeding to decision block 208, the program determines if the winding specification has switched from a present to a subsequent pass (e.g., from the first to the second pass) between the present and the last segment of the winding specification. This can be determined by multiplying S(K)*S$(K-1)$ and determining if the resultant value is positive. If it is, this indicates that the edge guide 28 is moving in the same direction in the present segment as it was in the last segment and that the winding specification is, therefore, still within the same pass. If the result is negative, this indicates that the present segment is the first segment of a subsequent pass. It is important to know which pass the present segment being considered is located in for two reasons. Initially, the incremental azimuthal distances stored in the array S(K) in the winding specification must be converted to equivelent distances along the first wind arc 66 for second and subsequent passes before they are accumulated in the cumulative azimuthal movement array SS(K). Additionally, since the number of reference lines 92 in the reference grid is determined as a function of the cumulative azimuthal distance the edge guide 28 moves during the first pass (see below), the program must know when the first pass has been completed.

Presuming that the edge guide has changed direction between the present and the last segment of the winding specification, the program proceeds to decision block 210 and determines if the first pass flag KFL is equal to 0. If it is, this indicates that the present segment being considered is the first segment in the second pass and that the $(K-1)$th element in the cumulative azimuthal distance array SS$(K-1)$ represents the total azimuthal movement of the edge guide during the first pass. As such, the program proceeds to instruction block 212 and sets the total sweep variable STOT equal to SS$(K-1)$. At this point, the program proceeds to instruction block 214 and sets the first pass flag KFL equal to 1 to indicate that the first pass has been completed. The program then proceeds to instruction block 216 where it increases the pass index P by 1 and resets the wind radius variable WR2 equal to the entered wind radius WR(P).

Proceeding to instruction block 218, the program calculates the Kth element of the cumulative azimuthal edge guide movement array SS(K) in accordance with the following equation:

$$SS(K) = SS(K-1) + S(K) * WR1/WR2 \qquad \text{Eq. 1}$$

This equation calculates the Kth element of the array SS(K) by adding the total distance, as projected onto the wind arc 66, that the edge guide moves in the Kth segment to the total distance that the edge guide had moved at the end of the $(K-1)$th segment. The conversion of the distance S(K) to an equivalent azimuthal distance on the first wind arc 66 is attained by multiplying the distance S(K) by the ratio WR1/WR2. During the first pass, this ratio will equal 1 since WR1 and WR2 are set equal to WR(1). Thereafter, WR2 is set equal to the next element of the winding radius array WR(P) for each successive pass of the winding specification. Accordingly, the proper ratio will always be maintained.

In the event that the winding specification does not change passes between the present segment of the winding specification and the last segment of the winding specification (see block 208), the program proceeds directly to instruction block 218 and calculates the Kth element of the cumulative azimuthal edge guide movement array SS(K) in accordance with Eq. 1.

Once the Kth element of the array SS(K) has been computed, the program proceeds to decision block 220 and determines if the segment index K is equal to the last segment (NSEG) in the wind specification. If not, the program returns to instruction block 206 after increasing the segment index by 1 (see instruction block 202) to calculate the next elements of the arrays SS(K) and REV(K). If the segment index K does equal the total number of segments in the winding specification, all the elements of the array SS(K) have been completed and the program proceeds to instruction block 224 where it determines if the first pass flag KFL is equal to 0. If it is, the program would never have entered the loop encompassing blocks 210–216 and a total sweep variable STOT would not have been computed. In such a case, the program proceeds to decision block 226 and sets the total sweep variable STOT equal to the last element in the cumulative edge guide azimuthal movement array (this will be the value of that array at the end of the first pass).

Once the calculation of instruction block 226 has been completed, or if the first pass flag was not equal to 0, the program proceeds to instruction block 228 and calculates the initial edge guide position polar angle WANGL (see FIG. 20) which represents the angle from the carcass center to the carcass starting point as measured in radians. This is done in accordance with the following equation:

$$WANGL = \tan^{-1}\frac{CCX(1) - WCX}{CCXY(1) - WCY} \qquad \text{Eq. 2}$$

This angle will be a negative number and is used to calculate the distance along the wind radius 66 from the carcass center to the initial edge guide position. This later distance, the carcass starting point polar arc WRARC, is determined in accordance with the following equation:

$$WRARC = WANGL*WR1 \qquad \text{Eq. 3}$$

At this point, the program is ready to begin calculating the reference grid array X(I). Proceeding to instruction block 232 (FIG. 11B), the maximum programmed wind arc distance PROG is set equal to the total azimuthal edge guide movement variable STOT plus the width of the ribbon WIDTH. Referring to FIG. 19, this distance is the distance along the first wind arc 66 from the initial edge guide position 70 (the origin of the x-y coordinate system) to the far edge 88 of the ribbon 12' which is the last ribbon laid during the first pass of the winding specification.

When the programmer selects the winding specification, he cannot be sure exactly what the tire build will look like when the last ribbon 12' is laid. If the build is fairly high at the point where the final edge guide position 72 is located, the final ribbon 12' will extend substantially vertically. In FIG. 19, the build is presumed to be non-existent at point 72. As a result, the final ribbon 12' is laid directly on the carcass with the result that the final ribbon 12' extends beyond the final carcass point CCX(NCC), CCY(NCC). While this is not what the programmer intends when he creates the winding specification, it is quite possible that his winding specification will have been poorly selected and will result in the final ribbon 12' exending to the point 88. Accordingly, it is important that the reference grid extend a sufficient distance to encompass this worst case situation. To this end, the program projects a line 90 (see FIGS. 19 and 20) from the wind center WCX, WCY through the rightmost point 88 of the final ribbon 12' onto the x-axis to determine the maximum point X2 along the x-axis which is required to encompass the edge 88 of the final ribbon 12'.

To calculate the location of the point X2, the program first determines the maximum sweep polar angle WANGR in accordance with the following equation (see block 234—FIG. 11B):

$$WANGR = (PROG + WRARC)/WR1 \qquad \text{Eq. 4}$$

Using simple geometry, the point X2 at which the line 90 crosses the x-axis can be determined in accordance with the following equation:

$$X2 = WCY \tan(WANGR) - WCX \qquad \text{Eq. 5}$$

At this point, the program proceeds to instruction block 238 (FIG. 11B) and determines whether the final carcass point CCX(NCC), CCY(NCC) is located to the right of X2. If it is, the variable AMAX is set equal to the x-coordinate CCX(NCC) of the final carcass point. See instruction block 240. If it is not, the variable AMAX is set equal to X2. See block 242.

In either case, the program proceeds to instruction block 244 and determines the spacing XSTEP between each line 86 of the reference grid by dividing the width of the ribbon 12 by (NPS−1), wherein NPS is the maximum number of grid points per ribbon and determines the resolution of the reference grid. NPS can be preset in the program or can be entered by the programmer along with the winding specification.

Proceeding to instruction block 248, the program then determines the total number of reference lines NP in the reference grid in accordance with the following equation:

$$NP = 1 + AMAX/XSTEP \qquad \text{Eq. 6}$$

At this point, the program is ready to calculate the values of each element of the reference array X(I). To this end, the program proceeds to instruction block 250 and sets the reference line index I equal to 1. Proceeding to the loop defined by blocks 252–258, the program computes each element of the reference array X(I), by solving the following equation for I=1 through I=NP:

$$X(I) = CCX(1) + (I-1)*XSTEP \qquad \text{Eq. 7}$$

The program repeatedly proceeds through the loop 256–258 until the grid index I is equal to the total number of lines NP in the reference grid. At that point, the program returns to the main program (FIG. 10A).

Once the reference grid has been stored in the array X(I), the program proceeds to instruction block 102 and causes the carcass profile 64 to be projected onto the array X(I) to determine the y locations on the array X(I) through which the carcass profile passes. This projection is stored in the base profile array YBAS(I) which describes the shape of the carcass profile 64 with reference to the grid array X(I). This procedure can be better understood with reference to FIG. 17 which illustrates the first portion of a carcass profile 64. This profile is defined by a first segment 74 which is a radius segment extending between points 80 and 82 and having a radius R1, a second segment 76 which is an arc segment extending between points 82 and 84 and having an arc length A, and a third segment 78 which is a straight line segment extending between points 84 and 86. The program projects this profile onto the reference grid by determining where the grid lines X(I) intersect the profile. The y-coordinate of these intersecting points are then stored in respective elements of the carcass profile array YBAS(I). Thus, YBAS(1) will contain the y-coordinate of the carcass profile passing through grid line X(1), YBAS(2) will contain the y-coordinate of the carcass profile passing through the grid line X(2), etc.

After the carcass profile is stored in the array YBAS(I), the program proceeds to instruction block 104 (FIG. 10A) and calculates the distances CNRX1 and CNRX2. As shown in FIG. 6, CNRX 1 is the distance, as measured along the base of the ribbon 12, from the edge 50 of the ribbon to the first corner point 48. CNRX2 is the distance, as measured along the base of the ribbon 12, from the edge 50 to the second corner point 52. These corners divide the ribbon 12 into three sections: an increasing thickness section 54, a constant thickness section 56, and a decreasing thickness section 58. As will be described below, the program treats each of these sections differently when laying the ribbon 12 on the tire build.

The computer calculates the location of these points by first converting the corner angle ANG into radians in accordance with the following equation:

$$ANGR = ANG * 3.1415/180.0 \qquad \text{Eq. 8}$$

and then solving the following equations:

$$CNRX1 = THICK/\text{Tan}(ANGR) \qquad \text{Eq. 9}$$

$$CNRX2 = WIDTH - CNRX1 \qquad \text{Eq. 10}$$

These values are stored in the computer memory and will later be used during the ribbon laying process.

At this point in the program, the computer presets certain variables which are used later in the program. Proceeding to instruction block 106 (FIG. 10A), the computer 40 sets the cross-section index IC equal to 1. This identifies the first cross-section in the cross-section array POS(I) which was entered by the programmer. All further calculations will be made with reference to this cross-section until the index is updated later in the program. The cross-section indentified by the present value of the cross-section index IC will be referred to hereinafter as the present cross-section.

Proceeding to instruction block 108, the wrap index KOUNT is set equal to 0. The wrap index KOUNT identifies the particular wrap being examined for the cross-section identified by the cross-section index IC. The wrap identified by the present value of the wrap index KOUNT will be referred to hereinafter as the present wrap.

Proceeding to instruction block 110, the program calculates the position of the cross-section identified by index IC as a proportion of the revolution of the tire and stores this value as the revolution index R. The value of the revolution index R is determined in accordance with the following equation:

$$R = POS(IC)/360 \qquad \text{Eq. 11}$$

If the cross-section entered by the programmer is 0°, the index R will equal 0. To ensure that the first wrap laid will be shown in this cross-section, it is preferable to have the program automatically set with the index R at some small number (e.g., 0.0001) whenever the solution to Eq. 11 is less than number.

In accordance with Eq. 11, the cross-section index is initially equal to the fraction of a revolution through which the tire must be rotated to reach the first wrap of the cross-section being examined. The revolution index R is incremented by 1 after each revolution of the tire. As such, the value of the revolution index will always represent the total fractional number of the revolutions through which the tire has been rotated to get to the present wrap of the present cross-section.

The program next proceeds to instruction block 112 and clears the breakpoint index array JBPS (KOUNT) such that each element in the array is equal to 0. Each element in the breakpoint index array is a flag which identifies whether the present cross-section of the wrap identified by the wrap index KOUNT falls within a break-point segment. Since the array has been cleared, the program must now examine the winding specification to determine if it contains any breakpoints and, if so, to set all flags in the array JBPS(KOUNT) which correspond to a wrap falling within a breakpoint segment. To this end, the program enters a loop including blocks 114–126 where it determmes, for each wrap of the winding specification, whether the particular cross-section being examined falls within a breakpoint segment and further calculates the position of the edge guide 28 for each segment. Starting with instruction block 114, the program increases the wrap index KOUNT by one so as to examine the next wrap being laid each time the program passes through the loop. The first time through the loop, the index KOUNT will be set at 1, identifying a first wrap being laid.

Proceeding to decision block 116, the computer determines if there are any breakpoint segments in the winding specification by examining NBPS. If NPBS is equal to zero, there are not breakpoints in the winding specification and the program jumps to instruction block 122 (FIG. 10B). If there are one or more breakpoint segments (NPBS>0) in the winding specification, the program proceeds to block 118 and determines if the present cross-section of the present wrap falls within any of the breakpoint segments. This determination is made in accordance with the subroutine illustrated in FIG. 12.

Proceeding to instruction block 300, the computer sets the breakpoint segment index L equal to 1 to cause the program to examine the first breakpoint segment in the array IBPS(L). The program then enters the loop including blocks 302–312 which examines each breakpoint segment stored in array IBPS(L) to determine if the present cross-section of the present wrap falls within the breakpoint segment identified by index L. Proceeding to block 302, the program first sets the temporary variable II equal to the value of breakpoint segment IBPS(L) identified by the present value of the index L. This will be the first breakpoint segment for the first pass through the loop. The program then proceeds to instruction block 304 where it determines if the tire has rotated fewer than the total number of revolutions which the tire will have rotated at the beginning of the segment corresponding to the breakpoint segment IBPS(L). If it has, the present cross-section of the present wind does not fall within a breakpoint segment and the program proceeds to decision block 310 when it determines if the breakpoint index L is equal to the total number of breakpoint segments. If it is not, the program returns to instruction block 302 after increasing the breakpoint index L by 1 (see block 312) and continues through the loop until all the breakpoint segments have been examined. Once all of the segments have been examined (L=NPBS), the program returns to instruction block 122 of the main program (see FIG. 10B).

Returning to decision block 304, if the tire has rotated through a greater number of revolutions than the total number of revolutions at the end of the segment prior to the breakpoint segment IBPS(L) identified by the present value of the breakpoint index L, then the present cross-section of the present wind is either in the breakpoint segment or beyond the breakpoint segment. To make this determination, the program proceeds to decision block 306 which determines if, at the present cross-section of the present wrap, the tire has rotated through a greater number of revolutions than the total number of revolutions which will be completed at the end of the breakpoint segment IBPS(L) identified by the present value of the breakpoint index L. If it has, the present cross-section of the present wrap does not fall within a breakpoint segment and the program proceeds to decision block 310.

If the total number of revolutions that the tire has rotated through to reach the present cross-section of the present wrap is less than the total number of revolutions which are completed at the end of the breakpoint segment IBPS(L) identified by the present value of the breakpoint index L, then the present cross-section of the present wrap does fall within a breakpoint segment. The program notes this fact by returning to instruction block 120 of the main program (FIG. 10A) wherein the flag JBPS(KOUNT) is set to 1.

Returning to the flow chart of FIG. 10B, the program next calculates the azimuthal position of the edge guide for the present cross-section of the present wrap with reference to the initial edge guide position and stores this value in cumulative edge guide movement array AA(KOUNT). The manner in which this array is created is illustrated in the flow chart of FIG. 13.

Starting with decision block 400, the program determines if the present cross-section of the present wrap falls within the first segment of the wind specification. If it does, the program proceeds to instruction block 402 and calculates the cumulative azimuthal movement of the edge guide to the present cross-section of the present wrap in accordance with the following equation:

$$AA(KOUNT) = R*SS(1)/REV(1) \qquad \text{Eq. 12}$$

Since the edge guide moves linearly in each segment, dividing the total azimuthal movement of the edge guide in the first segment of the winding specification SS(1) by REV(1) (the total number of revolutions in the first segment of the winding specification) will result in the azimuthal movement of the edge guide for a single revolution in the first segment. Since the revolution index R is equal to the total fractional number of revolutions through which the tire will have rotated to reach the present cross-section of the present wrap, Eq. 12 provides the azimuthal distance (as measured along the first wind arc 66) that the edge guide 28 has moved from its initial position to the present position corresponding to the present cross-section of the present wrap. Once this calculation has been completed, the program returns to the main program.

Returning to decision block 400, if the present cross-section of the present wrap does not lie within the first segment of the winding specification, the program next determines which segment of the winding specification the present cross-section of the present wrap falls within. To this end, the program proceeds to instruction block 404 and sets the segment index K equal to 1. This has the effect of causing the program to examine the (K+1)th segment of the winding specification (this is done in decision blocks 406 and 407) to see if the present cross-section of the present wrap falls within that segment. If it does, the program determines the cumulative azimuthal distance from the original edge guide position to the present cross-section of the present wrap in accordance with the following equation:

$$AA(KOUNT) = SS(K) + \frac{[R - REV(K)] * S(K + 1)}{REV(K - 1) - REV(K)} \qquad \text{Eq. 13}$$

The manner in which this equation provides the proper cumulative edge guide distance can best be understood with reference to FIG. 18. As shown therein, the total azimuthal distance that the edge guide has moved from its initial position to the present cross-section of the present wrap is equal to the cumulative azimuthal distance SS(K) plus the additional distance ΔAA. The distance ΔAA is the distance which the edge guide 28 moves in the present segment to reach the present cross-section of the present wrap. Since movement of the edge guide is equally distributed over the entire segment, the ratio of the distance ΔAA to the distance S(K+1) is equal to the ratio of the number of revolutions that the tire has rotated in the present segment to reach the present cross-section of the present wrap (i.e., R−REV(K)) to the total number of revolutions in this segment (i.e. REV(K+1)−REV(K)). Thus, ΔAA can be computed as follows:

$$\Delta AA = \frac{[R - REV(K)] * S(K + 1)}{REV(K + 1) - REV(K)} \qquad \text{Eq. 14}$$

Ex. 13 adds the value ΔAA to the cumulative azimuthal value SS(K) at the beginning at the present segment and thereby results in the total cumulative azimuthal movement of the edge guide from the initial edge guide starting position to the present cross-section of the present wrap.

Returning to FIG. 13, once the calculation set forth in instruction block 410 has been completed, the program returns to the main program (FIG. 10B). In the event that the present cross-section of the present wrap does not fall within the (K+1)the segment, the program proceeds to decision block 412 and determines if the segment index K is equal to the last segment NSEG in the winding specification. If it is not, the program returns to decision block 406 after increasing the segment index K by 1 (see block 414) to determine if the present cross-section of the present wrap falls within the next segment of the winding specification. If the segment index K is equal to the last segment in the winding specification, all the segments have been examined and the program returns to instruction block 124 of the main program (FIG. 10B) and increases the revolution index R by one so that the index R indentifies the total number of revolutions through which the tire will have been rotated when the next wrap is laid.

Proceeding to decision block 126, the program determines if the revolution index R is greater than the total number of revolutions in the winding specification REV(NSEG). If it is not, this indicates that less than all the wraps have been examined and the program returns to instruction block 114 and continues to pas through the loop until the calculations have been made for all of the wraps in the winding specification. This process continues until all elements of the array JBPS(KOUNT) and AA(KOUNT) have been computed for the present cross-section. At this time, R will be greater than or equal to REV(NSEG) and the program will proceed to instruction block 128 where the variable NL is set equal to the wrap index KOUNT. Since the wrap index KOUNT is now equal to the total number of wraps in the cross-section being examined, the variable NL stores the number of wraps in the cross-section being examined. This information is used later in the program.

Proceeding to instruction block 130, the program converts the cumulative edge guide movement array AA(KOUNT) into an incremental edge guide movement array AZ(KOUNT). Each element of the array AZ(KOUNT) stores the azimuthal distance, as measured along wind arc 66, that the edge guide 28 is translated to move from its last position (when the last wrap was laid) to its present position corresponding to the wrap identified by the wrap index KOUNT. This is done by setting the first element in the array AZ(1) equal to 0, the second element in the array AZ(2) equal to AA(1) and by solving the following equation for the remaining elements (K=2 through NL) in the array:

$$AZ(KOUNT+1)=AA(KOUNT)-AA(KOUNT-1) \quad \text{Eq. 15}$$

The effect of the foregoing is that each element in the array AZ(KOUNT) will store a value equal to the azimuthal distance the edge guide moves between wrap KOUNT−1 and KOUNT as measured along the first winding arc 66.

Proceeding to instruction block 132, the program places the carcass array YBAS(I) into the tire profile array YTOP(I) which is constantly updated to identify the profile of the top surface of the tire build before the wrap identified by the index KOUNT is laid. Since the first wrap is placed directly on the carcass, the tire profile array is initially set equal to the base profile array YBAS(I).

At this point, the program is ready to begin laying successive wraps on the continually updated tire profile YTOP(I). This is done by locating the x-y coordinates of the edge guide 28 for the present wrap identified by the index KOUNT and laying a wrap on the tire profile YTOP(I) beginning immediately to the right of the edge guide 28. Once the wrap has been laid, its top surface is added to the tire profile array YTOP(I) and the process is repeated for each wrap. The wrap laying process is set forth in the wrap laying loop which includes blocks 136-148. Before entering this loop, the variables set forth in instruction block 134 must be set to the values shown. EGPX and EGPY are the x-position and y-position variables, respectively, and are continually updated to store the position of the edge guide with respect to the x-y axis for the wrap identified by the wrap index KOUNT. When first entering the wrap laying loop, the edge guide is at the starting position at the beginning of the carcass profile. Accordingly, the x-position variable EGPX is set equal to the first element X(1) of the reference array X(I) while the y-position variable EGPY is set equal to the first element of the carcass profile array YBAS(1).

The variable EGPR identifies the azimuthal displacement of the edge guide along the wind arc 66 as measured from the initial edge guide position to the position of the edge guide for the wrap identified by the present value of the wrap index KOUNT. Since the first wrap is laid during the first pass through the wrap laying loop, this variable is set at 0. The variable THET1 is used in the subroutine which determines the exact position of the edge guide along the x-axis and will be explained below with reference to FIG. 14. This variable is initially set equal to the polar angle of the edge guide starting position WANGL (FIG. 20). Like the variable THET1, the variable KEGP is used in the subroutine of FIG. 14 and is initially set equal to 2. The variable LTOR indicates whether the edge guide is moving from left to right or from right to left. This variable is set to 1 when the edge guide is moving from left to right and is set to −1 when the edge guide is moving from right to left. In the example being considered, the edge guide initially moves from left to right. As such, the left to right variable LTOR is initially set equal to 1. Finally, the wrap index KOUNT is reset to 1 to cause the first wrap to be laid.

Once these variables have been set, the program is ready to lay the first wrap. Proceeding to instruction block 136, the program determines the position of the edge guide along the x-axis for the present cross-section of the present wrap. This position is determined as a function of the incremental azimuthal edge guide movement array AZ(KOUNT).

The incremental azimuthal edge guide movement array AZ(KOUNT) stores the incremental azimuthal movement of the edge guie along the wind arc 66 for each successive wrap of the cross-section being considered. If the wind radius 66 were a straight line lying parallel to the x-axis (which would be the case if a bias tire were being considered), the position of the edge guide along the axis for each successive wrap could be calculated by merely adding the appropriate element of the incremental azimuthal edge guide movement array AZ(KOUNT) to the prior x guide position. In the embodiment being considered, however, the simulation is being performed with respect to a radial tire, and the incremental azimuthal edge guide movement array AZ(KOUNT) stores increments along the curved wind arc 66. Accordingly, the program must convert these movements into equivalent movements along the x-axis.

Figure 14:
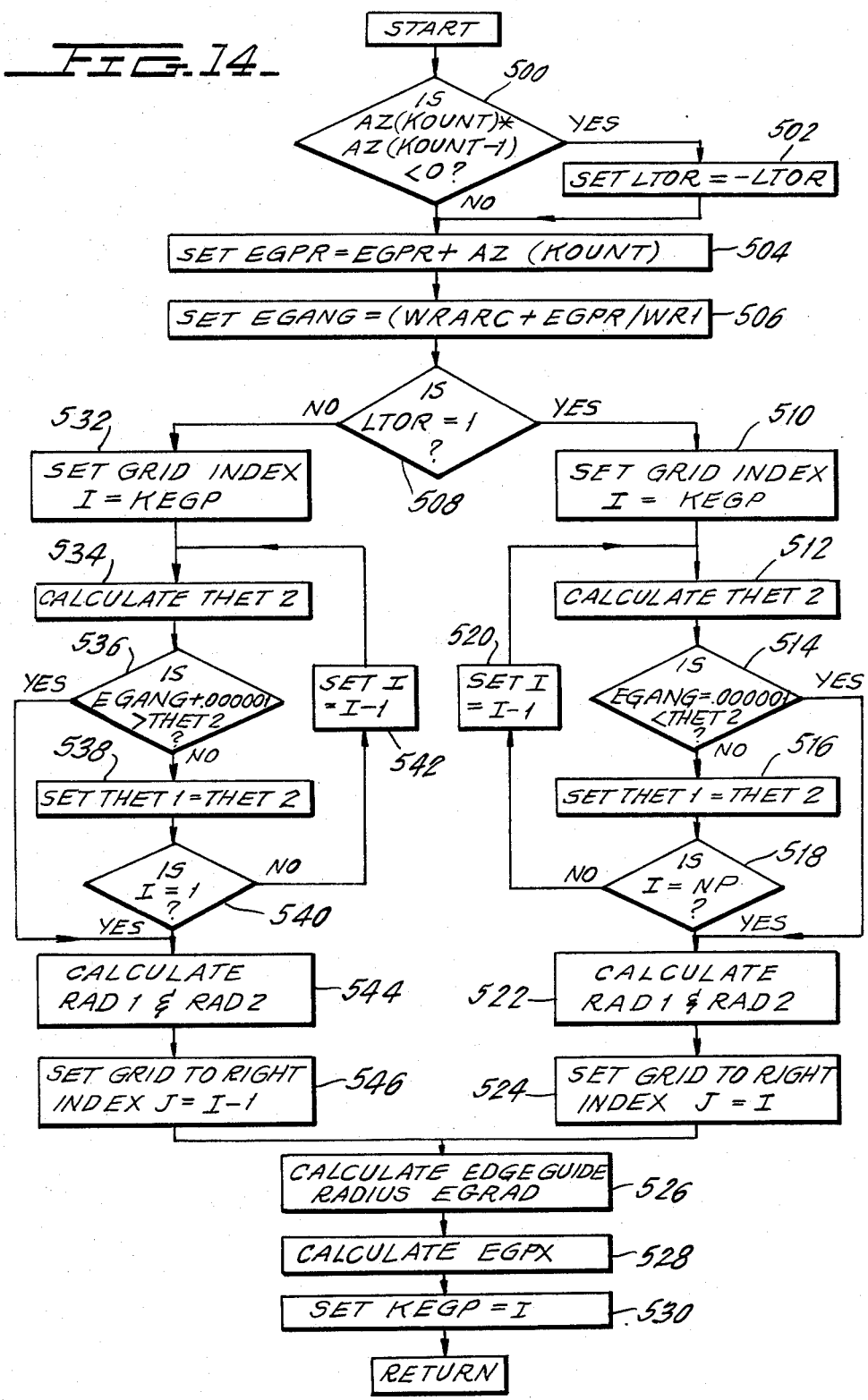

The procedure for making this conversion and thereby determining the exact exposition of the edge guide is set forth in FIG. 14. As shown therein, the subroutine begins at decision block 500 wherein the program determines if the winding specification changed directions between the present and the last wrap. This is done by multiplying the incremental movement of the edge guide during the present wrap by the incremental movement of the edge guide during the last wrap. If this product is positive, there has been no change in directions. If it is negative (the product will be less than zero), the winding specification will have changed directions. If there has been a change of directions, the left to right edge guide movement flag LTOR is set to −LTOR to indicate a change in direction. See block 502. Assuming that the present wrap being considered is the first wrap in the second pass, the index LTOR will be set to −1 to indicate movement from the right to the left.

Proceeding to instruction block 504, the program determines the present value of the edge guide arc position variable EGPR in accordance with the following equation:

$$EGPR = EGPR + AZ(KOUNT) \qquad \text{Eq. 16}$$

Figure 22A:
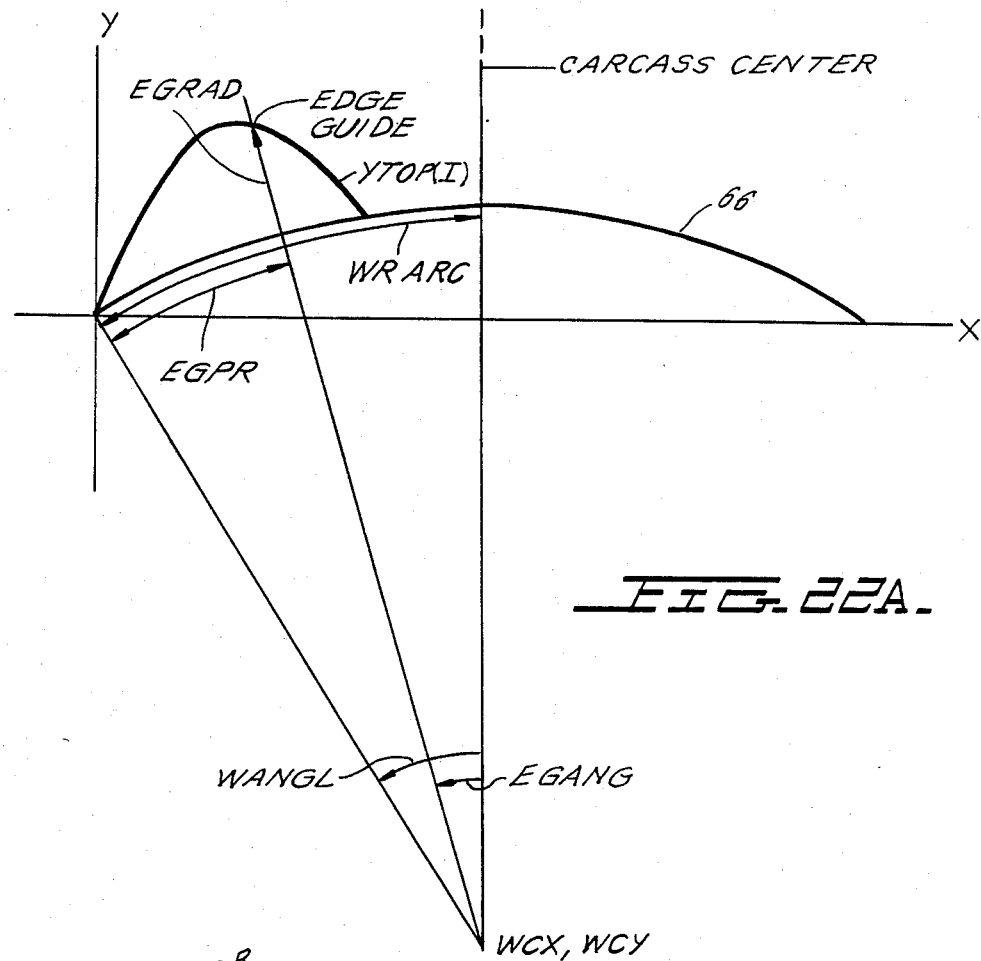
FIGS. 22A and 22B are graphs illustrating the manner in which the position of the edge guide along the x-axis is determined.
Figure 22B:
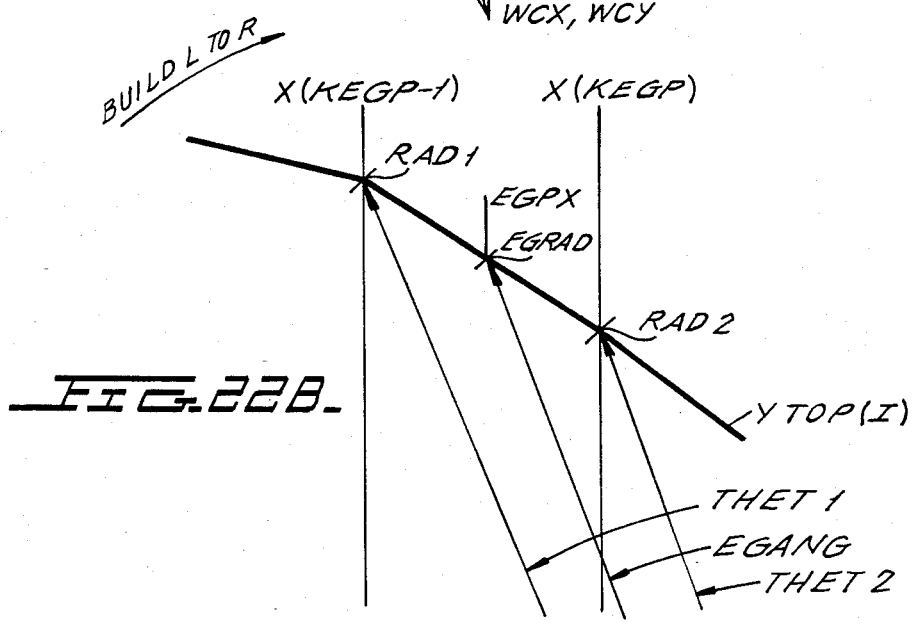
Figure 23:
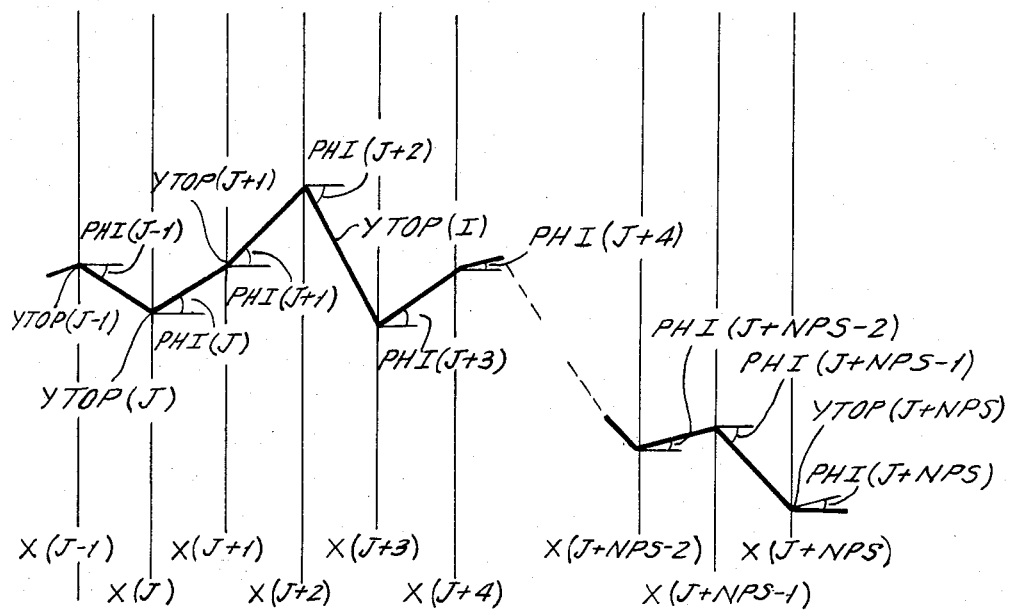
FIG. 23 is a graph illustrating the angles which form the angle array PHI(I)

In accordance with this equation, the edge guide arc position variable EGPR will be incremented for each successive wrap by the incremental azimuthal edge guide movement for that wrap as stored in the ncremental azimuthal edge guide movement array AZ(KOUNT). As shown in FIGS. 20 and 22A, the edge guide arc position variable EGPR provides a measurement along the first wind arc 66 and is measured from the initial guide position.

Proceeding to instruction block 506, the program computes the polar angle of the edge guide and stores it as the edge guide polar angle variable EGANG in accordance with the following equation:

$$EGANG = \frac{WRARC + EGPR}{WR1} \qquad \text{Eq. 17}$$

The equation provides the polar angle of the present edge guide position as measured from the center of the tire (see FIGS, 20 and 22A).

Referring to FIG. 22A, the intersection between the radius defined by the polar angle EGANG and the current tire surface defined by tire profile array YTOP(I) defines the current position of the edge guide 28. The position of this intersection along the x-axis defines the x-axis variable EGPX.

In order to compute the value of EGPX, the program continues to decision block 508 and first determines if the left to right variable LTOR equals 1 since the manner in which the x-position variable is calculated varies slightly depending upon the direction of movement of the edge guide. Presuming that the edge guide is moving left to right, the program proceeds through the loop including blocks 510-524. The purpose of this loop is to determine where on the reference array X(I) the present position of the edge guide falls. As shown in FIG. 20B, the edge guide will normally fall somewhere between two successive reference lines of the reference grid. The loop including blocks 510-524 determines which two reference lines surround the edge guide.

In instruction block 510, the grid index I is set equal to the edge guide point index KEGP. As noted above, this index is initially set at 2 in block 134 and indentifies the second reference line X(2). The program then proceeds to instruction block 512 wherein the variable THET2 is calculated in accordance with the following equation:

$$THET2 = Tan^{-1} \frac{X(I) - WCX}{YTOP(I) - WCY} \qquad \text{Eq. 18}$$

It should be apparent from FIG. 22A that the variable THET2 is equal to the polar angle, as measured from the center of the carcass, of a line extending from the wind center WCX, WCY to the point that the reference grid line X(2) intersects the tire profile YTOP(I). Since THET1 has previously been set to equal WANGL, it represents the polar angle, as measured from the carcass center, of a line extending from the wind center WCX, WCY to the point that the reference grid line X(1) intersects the tire profile YTOP(I). Having calculated these angles, the program determines if the edge guide 28 falls between the first two grid points X(1), X(2).

Proceeding to decision block 514, the program determines if the edge guide polar angle EGANG is less than THET2. If it is, thus indicates that the present position of the edge guide falls between grid points X(1) and X(2) and the program proceeds to instruction block 522. If EGANG is greater than THET2, this indicates that the edge guide is to the right of the reference line X(2) and the program proceeds to instruction block 512 where THET1 is set equal to THET2 (i.e., to X(2)). The program then proceeds to decision block 518 and determines if I is equal to the total number of reference grid lines NP. It it is not, the program returns to instruction block 512 after incrementing the grid index I by 1. See block 520. The program will continue through this loop until it finds the two reference grid lines which surround the edge guide. Thus, when the program finally reaches instruction block 522, THET1 will be equal to the polar angle of a line extending from the wind center WCX, WCY to the intersection between the tire profile YTOP(I) and the reference line directly to the left of the edge guide 28 while THET2 will be equal to the polar angle of a line extending from the wind center WCX, WCY to the intersection between the tire profile YTOP(I) and the reference line immediately to the right of the edge guide 28.

In instruction block 522, the program calculates the length of the radii RAD1, RAD2 which correspond to the distance from the wind center WCX, WCY to the points where the present tire profile YTOP(I) crosses the grid lines immediately to the left and the right of the present edge guide position. See FIG. 20B. The program then proceeds to instruction block 524 where it sets the grid to the right index J equal to the present value of the grid index I. This has the effect of setting the grid to the right index J equal to the index of the reference line which is immediately to the right of the present edge guide position. This index is used later in the subroutine in which the wrap is actually laid.

Proceeding to instruction block 526, the program now calculates the edge guide radius EGRAD in accordance with the following equation:

$$EGRAD = (RAD2-RAD1)*(EGANG-THET1)/(THET2-THET1) + RAD1 \qquad \text{Eq. 19}$$

This equation effectively proportions the distance between RAD1 and RAD2 as a function of the angle EGANG relative to the angles THET1 and THET2.

Using simple geometry, the edge guide radius EGRAD can now be converted into the X position variable EGPX in accordance with the following equation:

$$EGPX = WCX + EGRAD * \sin(EGANG) \qquad \text{Eq. 20}$$

Finally, the edge guide point index KEGP is set equal to the present grid index I so that when the program again proceeds through the subroutine of FIG. 14 (this will happen when the program computes the x-position of the edge guide for the next wrap in the winding specification), it will begin looking for the reference lines which straddle the new edge guide position starting with the reference grid immediately to the right of the present edge guide position.

Returning to decision block 508, if the left to right index LTOR had equaled −1, the program would have proceeded through the subroutine including elements 532 through 546. This subroutine is substantially identical to that described with reference to blocks 510–524 except that the grid index I is decremented since the edge guide is moving to the left rather than to the right. The differences between the subroutine of blocks 510–524 and the subroutine of blocks 532–546 are set forth in FIG. 14 and will not be described further herein.

Once the subroutine of FIG. 14 has been completed, the program returns to the main program (FIG. 10C) and proceeds to instruction block 144. At this time, the program is ready to calculate the shape of the top surface of the present wrap (also referred to herein as the wrap being laid). The subroutine for calculating the shape of the top surface of the wrap being laid is set forth in FIGS. 15A–15C. In accordance with this subroutine, the profile of the top surface of the wrap being laid is computed with reference to the x-y coordinate system and is independent of the position of the reference grid X(I). The points which define the top surface of the wrap being laid are stored in wrap arrays XB(NB), YB(NB).

Figure 15A:
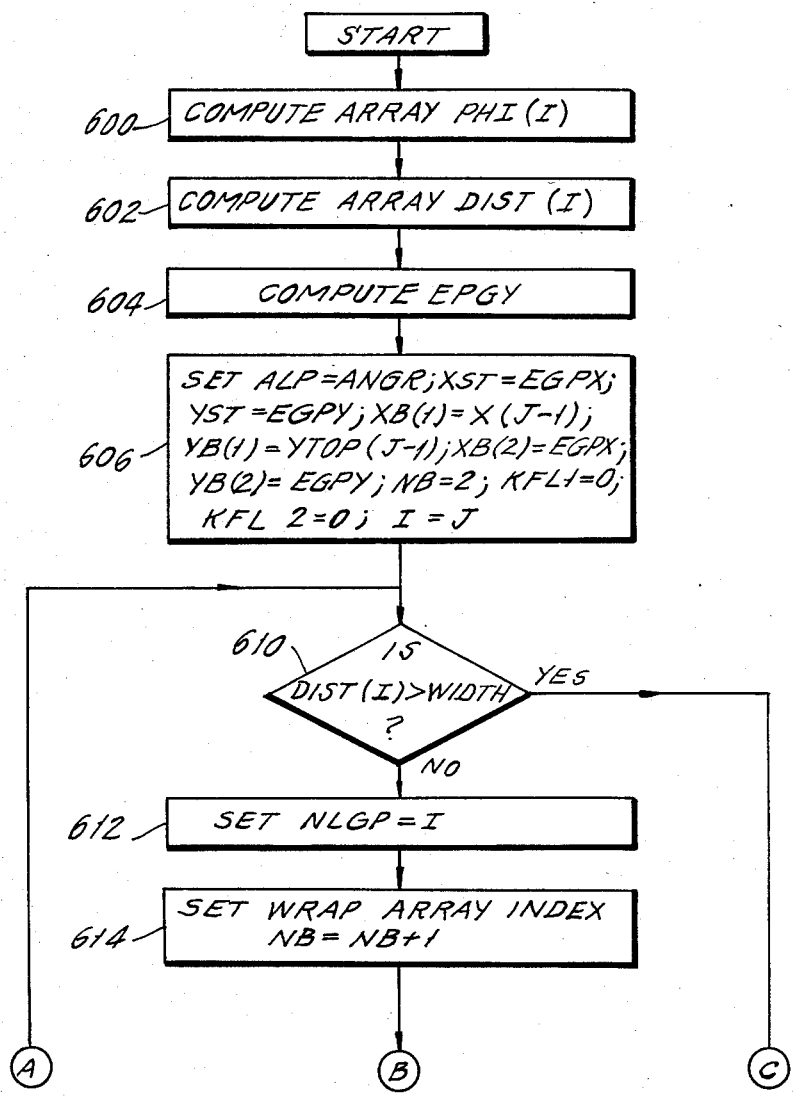
Figure 15C:
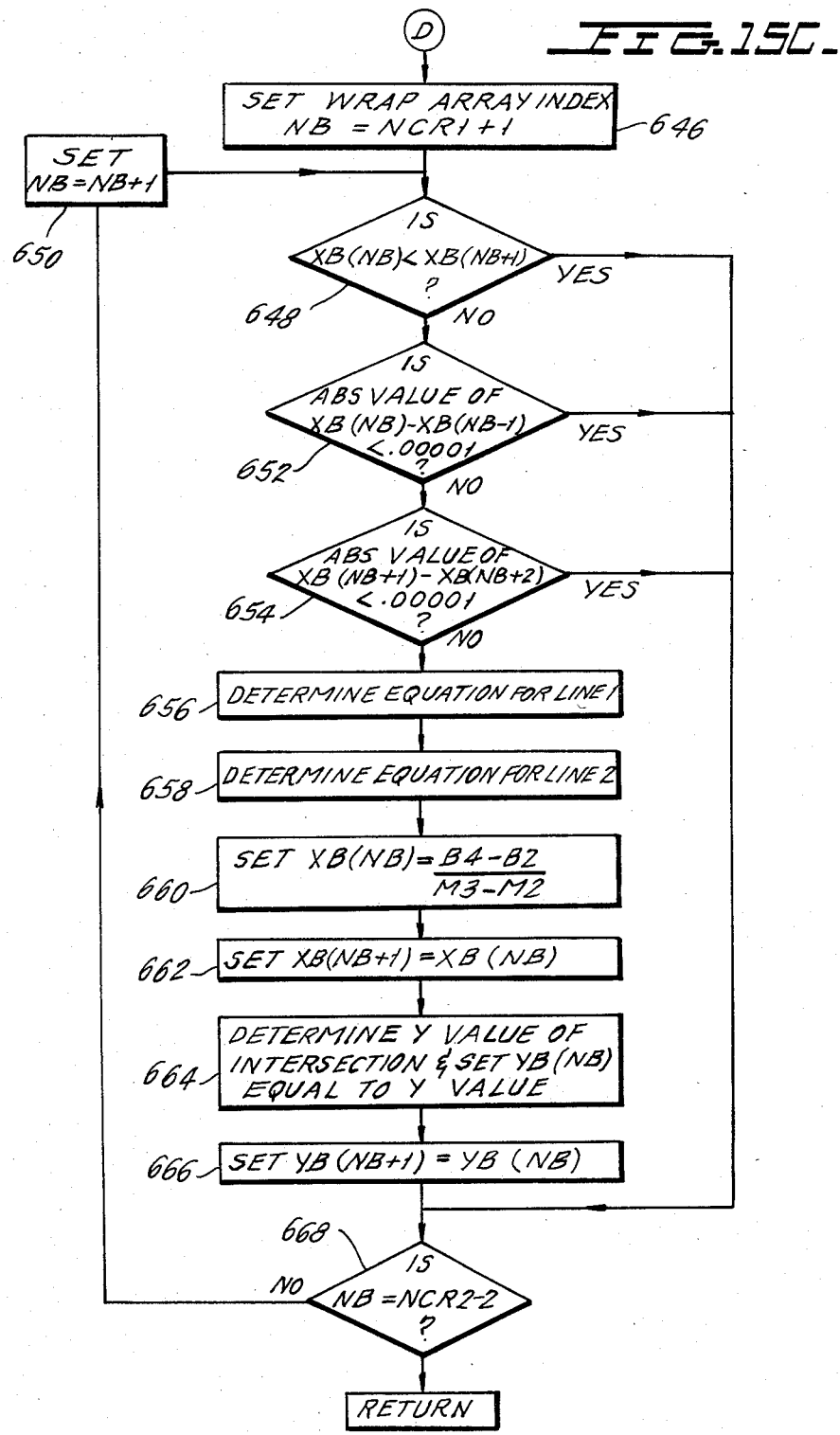

Before describing the subroutine of FIGS. 15A–15C in detail, it is instructive to provide a brief explanation of the method the present invention uses to determine the profile of the ribbon being laid. As noted above with respect to FIG. 6, the profile of the ribbon 12 is divided into three sections 54, 56 and 58 by the corner points 48 and 42. The program treats each of these sections differently, one laying the ribbon on the tire profile YTOP(I).

Figure 25:
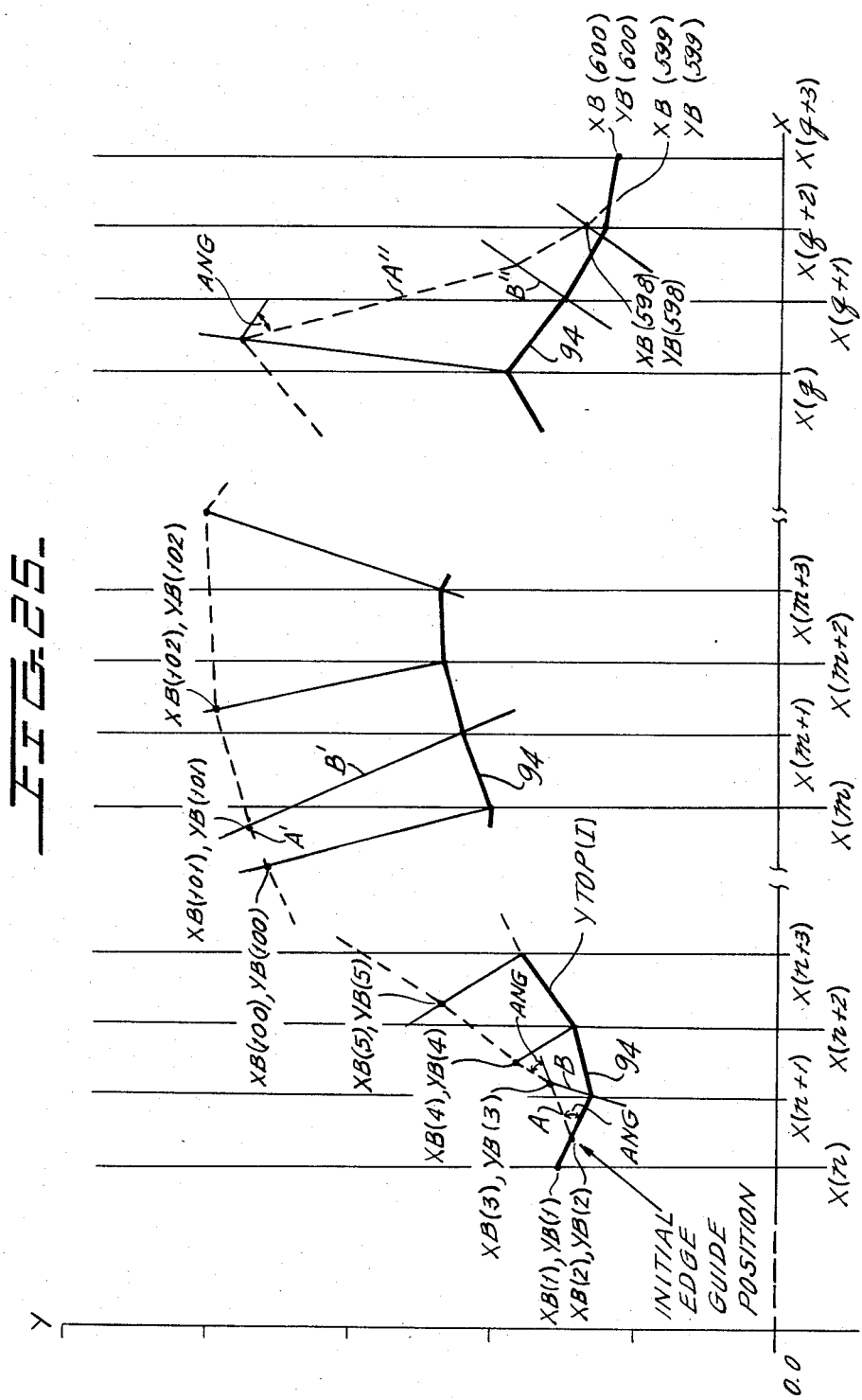
FIG. 25 is a graph illustrating in detail the manner in which the profile of a wrap being laid is determined.

Referring to FIG. 25, there are shown three sections of the reference grid: X(n)–X(n+3), X(n)–X(m+3) and X(q)–X(q+3). In the first section, the beginning of the increasing thickness section 54 of the ribbon 12 is being laid. In the second section, the constant thickness section 56 of the ribbon 12 is being laid. In the third section, the end of the decreasing thickness section 58 of the ribbon 12 is being laid.

In the first section, the first elements XB(1), YB(1) of the wrap arrays XB(NB) and YB(NB) are set equal to the point at which the tire profile YTOP(I) intersects the grid line X(n). This ensures that the beginning of the wrap profile being calculated will close onto the tire profile on which it is being built. The second elements XB(2), YB(2) of the wrap arrays XB(NB) and YB(NB) are set equal to the initial edge guide position EGPX, EGPY, respectively. The remaining elements of the wrap arrays XB(NB), YB(NB) which fall within the increasing thickness section 54 of the ribbon 12 are found by determining the intersection of a first line A and a second line B as shown in FIG. 25. The first line A passes through the last element of the wrap arrays XB(NB), YB(NB) which have been calculated (point XB(2), YB(2) in the example shown) and which forms an angle ANG (equal to the corner angle of the ribbon 12) with the tire profile YTOP(I). The second line B bisects the tire profile line segments falling on either side of the next reference line (reference line X(n+1) in the example shown). Once the new point XB(3), YB(3) has been calculated, the program calculates the next point XB(4), YB(4), by determining the intersection between a first line extending through the last point XB(3), YB(3) and forming an angle ANG with the tire profile YTOP(I) and a second line bisecting the time profile segments on either side of the next grid point X(n+2). This process is continued until the first corner 48 is reached at which time each successive element of the wrap arrays XB(NB), YB(NB) is computed by finding the intersection between a first line A′ which runs parallel to the tire profile YTOP(I) and a second line B′ which bisects the tire profile line segments falling on either side of the next reference line. This process is continued until the second corner 52 of the ribbon is reached at which time each successive element of the wrap arrays XB(NB), YB(NB) is computed by determining the intersection between a first line A″ which forms an angle −ANG with the tire profile YTOP(I) and a second line B″ which bisects the tire profile line segments located on either side of the next reference line. This procedure continues until one of the entire wrap has been laid. Later in the program, the final elements of the arrays XB(NB), YB(NB) are set equal to the point in which the tire profile YTOP(I) crosses the next reference line [line X(q+3) in the example illustrated in FIG. 25] in order to make sure that the end of the profile stored in arrays XB(NB), YB(NB) close on the tire profile on which it is built.

Having described the general approach the present invention uses to determine the profile of a ribbon being laid, the specific program steps which are required to carry out this process will now be described.

Referring to FIG. 15A, the subroutine beings in instruction block 600 and computes the top surface angle array PHI(I). Each element of this array stores the respective angle, in radians, of the slope of the line segment of the tire profile YTOP(I) extending to the right of a respective reference line X(I) for the reference lines X(J−1) through X(J+NPS). This can best be understood with reference to FIG. 23 wherein the tire profile YTOP(I) is illustrated for grid points X(J−1) through X(J+NPS). Since the reference line X(J−1) is the line immediately to the left of the edge guide 28, and since the reference line X(J+NPS) is a reference line to the right of the end of the ribbon being laid (NPS is the total number of grid points in a ribbon), the grid points X(J−1) through X(J+NPS) encompass the entire section of the top surface YTOP(I) upon which the ribbon being laid will be placed.

The array PHI(I) can be computed by solving the following equation for I=J−1 through J+NPS:

$$PHI(I) = \tan^{-1} \frac{YTOP(I+1) - YTOP(I)}{XSTEP} \qquad \text{Eq. 21}$$

Figure 24:
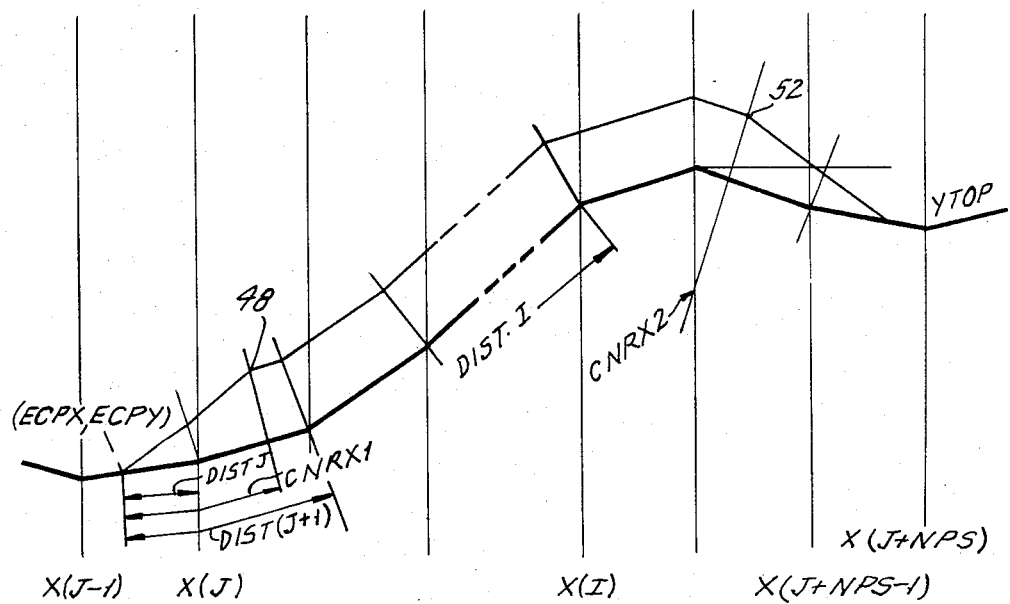
FIG. 24 is a graph illustrating the manner in which the array DIST(I) is used to determine when the wrap laying subroutine has reached the first and second corner points.

Returning to FIG. 15A, the program proceeds to instruction block 602 where it computes the top surface distance array DIST(I). As shown in FIG. 24, each element of the top surface distance array DIST(I), stores the distance, as measured along the present tire profile YTOP(I), from the initial edge guide position EGPX, EGPY to each successive reference line X(J)

through X(J+NPS). This array is used to determine when the wrap laying process has reached the corner points 48 and 52 and when it has completed laying the tire wrap.

The first element DIST(J) of the distance array DIST(I) is the distance from the edge guide to the grid line immediately to its right which is identified by the grid line to the right index J. This distance is computed in accordance with the following equation:

$$DIST(J) = \frac{X(J) - EGPX}{Cos[PHI(J-1)]} \qquad \text{Eq. 22}$$

The remaining elements of the distance array DIST(I) are calculated in accordance with the following equation for I=J+1 through J+1+NPS:

$$DIST(I) = DIST(I-1) + XSTEP/COS\,[PHI(I-1)] \qquad \text{Eq. 23}$$

Having stored the distance array DIST(I), the program proceeds to instruction block 604 (FIG. 15A) and determines the y-position of the edge guide 28 in accordance with the following equation:

$$EGPY = YTOP(J-1) + [EGPX - X(J-1)] * \text{Tan}\,[PHI(J-1)] \qquad \text{Eq. 24}$$

The program steps required to calculate the wrap arrays XB(NB), YB(NB) are contained in the wrap laying loop which includes blocks 610 through 644. Before entering this loop, the variables set forth in instruction block 606 must be preset. The variable ALP determines the angle of the lines A, A' and A" (see FIG. 25) with respect to the tire profile YTOP(I). This variable is initially set equal to the corner angle of the ribbon ANGR (in radians) because the program begins with the laying of the first section 54 of the ribbon. The variables XST, YST are the last point indices and define the point through which the lines A, A' and A" are drawn. These variables are updated each time the program passes through the wrap laying loop so that they always identify the element of the arrays XB(NB), YB(NB) which were calculated during the last pass through the loop. The first time the program passes through the loop, the first line A is drawn through the initial edge guide position. As such, the last point indices XST, YST are set equal to EGPX and EGPY as shown.

As noted above, the first two points of the wrap arrays XB(NB), YB(NB) are set equal to the point in which the tire profile YTOP intersects the grid line X(n) and the initial edge guide position, respectively. This ensures that the profile of the wrap being laid will always close onto the tire profile YTOP when it is plotted on the video display 42 later in the program. Accordingly, the elements XB(1), YB(1), XB(2) and YB(2) are set as shown in block 606.

Since the first two elements of the wrap arrays XB(NB), YB(NB) have already been set, and since the wrap array index NB is increased by 1 each time the program passes through the wrap laying loop, the wrap array index NB is initially set equal to 2. The first and second ribbon corner flags KFL1, KFL2 are initially set equal to 0. These flags will be set to 1 as the ribbon laying process reaches the first and second ribbon corners 48, 52, respectively. Finally, the grid index I is set equal to the grid to the right index J to ensure that the first time the program passes through the wrap laying loop line B bisects the line segments of the tire profile YTOP(I) located on either side of the reference line X(J).

Having so preconditioned the foregoing variables, the program proceeds to decision block 610 and determines if the Ith element of the cumulative distance array DIST(I) is greater than WIDTH, the width of the ribbon 12. If it is, this indicates that the wrap laying loop has calculated all of the elements in the wrap arrays XB(NB), YB(NB) and the program proceeds to decision block 646 (FIG. 15C). The first time through the wrap laying loop, the grid index I will be equal to J and the Jth element of the cumulative distance array DIST(I) will be less than the width of the ribbon. As such, the program proceeds to instruction block 612 and sets the next to the last grid point index NLGP equal to I. This index is increased with the grid index I each time the program passes through the loop. As a result, the index NLGP will be equal to the index of the next to the last grid point encompassed by the wrap being laid once the program leaves the wrap laying loop and proceeds to instruction block 646.

Proceeding to instruction block 614, the program increments the wrap array index NB by 1 each time the program passes through the loop to cause the next element of the arrays XB(NB), YB(NB) to be calculated each time the program passes through the loop. Proceeding to instruction block 616, the program first determines if the first ribbon corner flag KFL1 is equal to 0. This flag will be equal to 0 as long as the portion of the ribbon being laid falls within the increasing thickness segment 54. In this case, the program will proceed to decision block 616 (FIG. 15B) and determine if the distance to the reference line identified by the present grid index I is less than the distance CNRX1. If it is, the program proceeds to instruction block 624 and determines equation A for the new top line segment passing through the point XB(NB−1). The slope of this line is defined by the equation:

$$M1 = \text{Tan}\,[ALP + PHI(NB-2)] \qquad \text{Eq. 25}$$

Since the line passes through the point defined by last point indices XST, YST, the point at which the line A crosses the y-axis may be calculated as follows:

$$B1 = YST - M1*XST \qquad \text{Eq. 26}$$

The equation for line A may then be expressed as follows:

$$y = M1X + B1 \qquad \text{Eq. 27}$$

Proceeding to instruction block 622, the program then determines the equation B for the line segment bisecting the tire profile line segments located on either side of the reference line X(NB). Again, the equation for this line can be calculated since the slope of the line and a point through which it passes (i.e., X(NB), YTOP(NB)) are known. Particularly, the slope of the line is defined by the following equation:

$$M2 = -1/\text{Tan}\left[\frac{PHI(NB-1) + PHI(NB)}{2}\right] \qquad \text{Eq. 28}$$

Since the line passes through the point defined by YTOP(NB) and X(NB), the point at which the line B crosses the y-axis can be determined as follows:

$$B2 = YTOP(NB) = M2*X(NB) \qquad \text{Ex. 29}$$

The equation for line B may then be expressed as follows:

$$y = M2X + B2 \qquad \text{Ex. 30}$$

Proceeding to instruction block 624, the program now solves the equations A and B for the intersecting point XB(NB), YB(NB) in accordance with the following equation:

$$XB(NB) = \frac{B2 - B2}{M1 - M2} \qquad \text{Eq. 31}$$

$$YB(NB) - M1 * XB(NB) + B1 \qquad \text{Eq. 32}$$

Having calculated the new elements of the wrap arrays, the program sets the last point indices XST, YST equal to XB(NB), YB(NB), respectively. Proceeding to instruction block 628, the last point index D is set equal to the wrap array index NB. This index will be increased by 1 each time the program passes through the wrap laying loop. As such, when the program finally leaves the loop, the last point index D will be equal to the index of the last element in the wrap arrays XB(NB), YB(NB). This index is used later in the program.

Proceeding to decision block 630, the program determines if the grid point index I is greater than the total number of grid points NB. If it is not, the program returns to decision block 610 and again passes through the wrap laying loop after increasing the grid index I by 1 (see block 631).

The program will continue passing through the path laying loop in the manner described above until the cumulative distance DIST(I) becomes greater than or equal to the first corner point CNRX1 (see decision block 618). At this point, the program will have generated all of the elements of the wrap profile arrays XB(NB), YB(NB) that fall within the increasing thickness section 54 of the ribbon 12. The manner in which the subsequent elements of arrays XB(NB), YB(NB) are generated must be changed to reflect the fact that the ribbon is now entering the constant thickness section 56. To this end, the program proceeds to instruction block 632 wherein the first corner flag KFL1 is set equal to 1 (indicating that the first corner 48 has been reached), the ribbon angle index ALP is set equal to 0 (indicating that the top surface of the ribbon is parallel to the bottom surface of the ribbon for the section being laid), and the first corner point index NCR1 is set equal to the present value of the wrap array index NB (this index is used later in the program).

Since the slope of the top of the ribbon being laid with respect to the bottom of the ribbon changes at this point, it would be improper to calculate the next element XB(5) YB(5) of the wrap arrays with respect to a line extending through the last element XB(4), YB(4) of the wrap arrays. To take this change into account, the program finds the point along the carcass profile YTOP(I) which corresponds to the corner point 48 of the ribbon. This point will lie a distance from the edge guide position EGPX, EGPY, as measured along the tire profile YTOP(I), equal to CNRX1. See FIG. 26. (In this figure, the first corner point 48 is shown as being located two reference lines from the initial edge guide position for simplicity of illustration. It will be understood, however, that this point will actually be many reference lines away from the initial edge guide position.) The coordinates of this point are located at the profile limit points XA, YA, which points are determined in accordance with the following equations:

$$XA = X(I-1) + [CNRX1 - DIST(I-1)] * \cos[PHI(I-1)] \qquad \text{Eq. 33}$$

$$YA = YTOP(I-1) + [CNRX1 - DIST(I-1)] * \sin[PHI(I-1)] \qquad \text{Eq. 34}$$

See instruction block 634.

After having determined the profile limit points XA, YA, the program proceeds to instruction block 636 and determines new last point indices XST, YST which will correspond to the corner point 48 of the ribbon. As shown in FIG. 24, this point lies on a line which runs perpendicular to the entire profile YTOP(I) passing through the profile limit point XA, YA and is located a distance THICK equal to the thickness of the ribbon from the profile limit point XA, YA. The new last point indices can thus be calculated in accordance with the following equations:

$$XST = XA - THICK * \sin[PHI(I-1)] \qquad \text{Eq. 35}$$

$$YST = YA + THICK \cdot \cos[PHI(I=1)] \qquad \text{Eq. 36}$$

Having determined the new last point indices XST, YST, the program continues through instruction blocks 620–624 and determines the new intersecting points XB(NB), YB(NB) with reference to the newly calculated last point indices XST, YST. Since the ribbon angle index ALP is now equal to 0, the equation for line A' will be determined with a slope which is equal to the slope of the tire profile.

Once the new element of the wrap arrays XB(NB), YB(NB) have been calculated, the program again passes through the wrap laying loop proceeding through the block 628–631 and 610–616. At decision block 616, the first ribbon corner flag KFL1 will now be set equal to 1 and the program will proceed to decision block 638. As long as the portion of the wrap being laid remains within the constant thickness segment 56, the second ribbon corner flag KFL2 will be equal to 0 and the program will proceed to decision block 640. At this point, the program determines if the Ith element of the cumulative distance array DIST(I) is less than the distance CRNX2 to the second ribbon corner 52. As long as the portion of the wrap being laid is still within the constant thickness section 56, the distance of the Ith element in the array DIST(I) will be less than CNRX2 and the program will proceed through blocks 620–626 to calculate the next element of the wrap arrays XB(NB), YB(NB).

Once the cumulative distance DIST(I) becomes greater than or equal to the second corner point CNRX(2) (see decision block 640), the program will have generated all of the elements of the wrap profile arrays XB(NB), YB(NB) that fall within the constant thickness section 56 of the ribbon. The manner in which subsequent elements of the arrays XB(NB), YB(NB) are generated must be changed to reflect that fact that the wrap is now entering the decreasing thickness section 58 of the ribbon. To this end, the program proceeds to instruction block 642 wherein the second corner flag KFL2 is set equal to 1 (indicating that the second corner 52 has been reached), the ribbon angle index ALP is set equal to −ANGR (indicating that the slope of the top surface of the ribbon is decreasing at the angle ANGR for the section being laid), and the second corner point index NCR2 is set equal to the present value of the wrap array index NB (this index is used later in the program). For the reasons noted with respect to the first corner point 48, supra, it would be improper to calculate the next element of the wrap arrays XB(NB), YB(NB) with respect to a line extending through the last element of these arrays which had been calculated during the last pass through the loop. To take this change into account, the program finds the point along the carcass profile YTOP(I) which corresponds to the corner point 52 of the ribbon. This point will lie a distance from the edge of the edge guide position EGPX, EGPY, as measured along the tire profile YTOP(I), equal to CNRX 2. The coordinates of this point are located at the profile limit points XA, YA, which are determined in accordance with the following equations:

$$XA = X(I-1) + [CNRX2 - DIST(I-1)] * \cos[PHI(I-1)] \quad \text{Eq. 37}$$

$$YA = YTOP(I-1) + [CNRX2 - DIST(I-1)] * \sin[PHI(I-1)] \quad \text{Eq. 38}$$

See instruction block 644.

After having determined the profile limit points XA, YA for the second corner 52 of the ribbon 12, the program proceeds to instruction block 636 and determines the new last point indices XST, YST in accordance with Eq. 32 and 33, supra. Having determined the new last point indices XST, YST, the program continues through instruction blocks 620-624 and determines the new intersecting points XB(NB), YB(NB) with reference to the newly calculated last point indices XST, YST.

Figure 26:
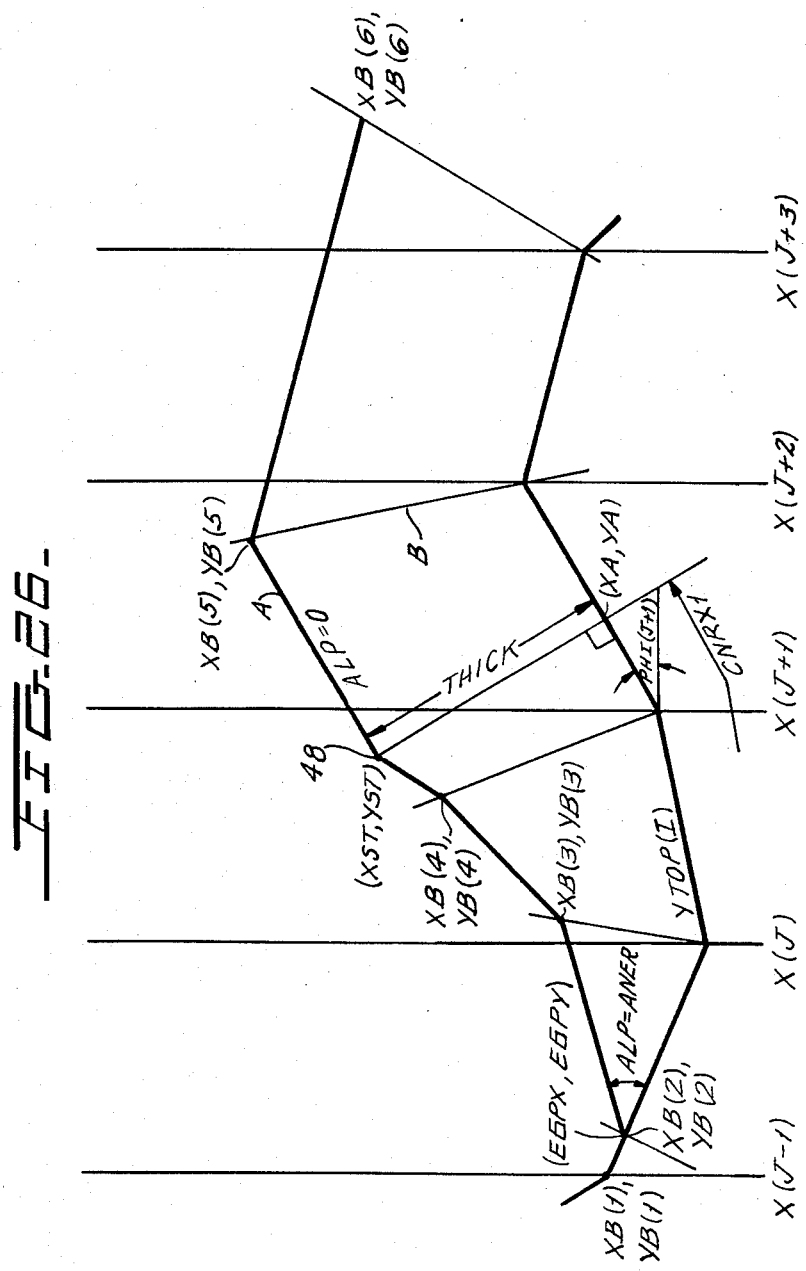
FIG. 26 is a graph illustrating the manner in which the wrap laying procedure is modified at the first corner point of the ribbon.
Figure 27:
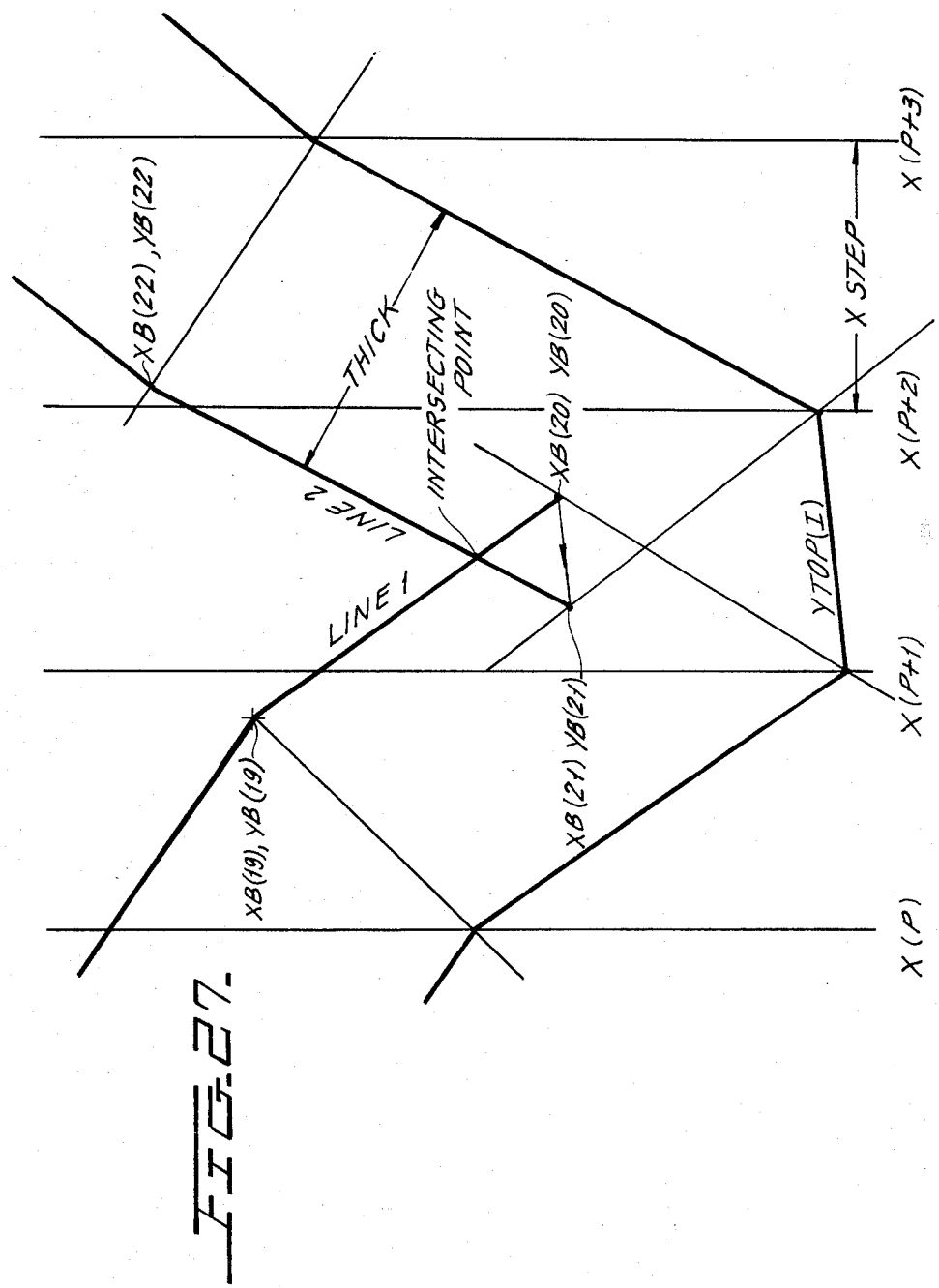
FIG. 27 is a graph illustrating in which deep concavities in the profile of the wrap being laid are smoothed down.

Once the new element of the wrap arrays XB(NB), YB(NB) have been calculated, the program again passes through the wrap laying loop proceeding through the blocks 628-631 and 610-616. At decision block 616, the first ribbon corner flag KFL will now be set equal to 1 and the program will proceed to decision block 638. Since the second corner index flag KFL2 is now equal to 1, the program will proceed to instruction block 620 and the next element of the wrap arrays XB(NB), YB(NB) will be calculated. The program will continue to pass through this loop until the value of DIST(I) is greater than the width of the ribbon at which point the program will leave the loop and will proceed to instruction block 646 (FIG. 15C). At this point in the program, all but the last element of the wrap arrays XB(NB), YB(NB) have been calculated using the procedure described with reference to FIGS. 24-26. In the example shown in these Figures, each successive point defined by the arrays is located to the right of the immediately proceeding element. Thus, as shown in FIG. 26, the point XB(4), YB(4) lies to the right of the point XB(3), YB(3), and the point XB(5), YB(5) lies to the right of the point XB(4), YB(4). However, if there is a sufficiently deep concavity in the tire build defined by YTOP(I), successive points may be located to the left of a prior point. This is illustrated in FIG. 27 which illustrates the portion of the tire profile YTOP(I) extending between four grid lines X(P) through X(P+3). It is assumed that the portion of the wrap being laid at this location of the grid falls within the constant profile thickness section 56 of the ribbon 12. Due to the steep concavity defined by the line segments of the tire profile YTOP(1) extending between the grid lines X(P) and X(P+3), the 21st element of the wrap arrays XB(NB), YB(NB) lies to the left of the 20th element of these arrays. While this fact will not prevent the process of the present invention from providing a fairly good simulation of the profile of the present wrap being laid, it has been found preferable to smooth out these deep depressions. To this end, the program develops an equation for a first line extending between the 19th and 20th elements of the arrays XB(NB), YB(NB) and a second line extending between the 21st and 22nd elements of the arrays XB(NB), YB(NB). The intersection of these lines defines a common point which will be used as a replacement for both the 20th and the 21st index of the arrays XB(NB), YB(NB).

The subroutine for smoothing out the deep concavities as shown in FIG. 27 is set forth in FIG. 15C. Since, as a practical matter, the problem illustrated in FIG. 27 can only occur in the constant thickness section of the ribbon, the subroutine only examines those elements of the wrap arrays XB(NB), YB(NB) which fall between the two ribbon corners 48, 52 to determine if the problem occurs. To this end, the program proceeds to instruction block 646 and sets the wrap array index NB equal to NCR1+1. This will cause the program to begin examining elements of the arrays XB(NB), YB(NB) beginning with the first element of the constant thickness section 56 of the ribbon 12.

Proceeding to decision block 648, the program determines if the value of the element of the wrap array XB(NB) identified by the present wrap array index is less than the immediately prior element in the array. If it is, this means that there is no concavity at that point and the program immediately proceeds to decision block 668. In this block, the program determines if the wrap array index NB is equal to NCR2−2 (the last point in the array XB(NB) that falls within the constant thickness section 56 of the ribbon 12). If it is not, the program returns to decision block 648 after incrementing the wrap array index NB by 1. The program will then determine if the element of the wrap array XB(NB), identified by the newly increased wrap array index NB, is less than the value of the immediately following element of the index. In this manner, the program will examine each two consecutive elements of the wrap array XB(NB) until it finds two elements which are not increasing in magnitude. When this happens, a deep concavity has been found and must be smoothed. To this end, the program proceeds to instruction block 652 and determines if the absolute value of the difference between XB(NB) and XB(NB−1) is less than 0.00001. If it is, the concavity is too small to bother smoothing out and the program proceeds to decision block 668. If the absolute value is greater than 0.00001, the program proceeds to instruction block 664 and determines if the absolute value of the difference XB(NB+1)−XB(NB+2) is less than 0.00001. If it is, the error is again too small to correct and the program proceeds to decision block 668. If the absolute value of this difference is not less than 0.00001, the program proceeds through instruction blocks 656-666 and performs the calculations shown in FIG. 27.

Proceeding first to instruction block 656, the program determines the equation for the line extending between points XB(NB), YB(NB) and XB(NB−1), YB(NB−1). The slope of this line is defined by the equation:

$$M3 = \frac{YB(NB) - YB(NB - 1)}{XB(NB) - YB(NB - 1)} \qquad \text{Eq. 39}$$

Since the line passes through the point XB(NB), YB(NB), the point in which the line 1 crosses the y-axis may be calculated as follows:

$$B3 = YB(NB) - M3 * XB(NB) \qquad \text{Eq. 40}$$

The equation for line 1 may then be expressed as follows:

$$y = M3x + B3 \qquad \text{Eq. 41}$$

Proceeding to instruction block 658, the program then determines the equation for line 2. The slope of this line is defined by the equation:

$$M4 = \frac{YB(NB + 1) - YB(NB)}{XB(NB + 1) - YB(NB)} \qquad \text{Eq. 42}$$

Since the line passes through the point XB(NB+1), YB(NB+1), the point at which the line 2 crosses the x-axis may be calculated as follows:

$$B4 = YB(NB+1) - M4 * XB(NB+1) \qquad \text{Eq. 43}$$

The equation for line 2 may then be expressed as follows:

$$y = M4y + B4 \qquad \text{Eq. 44}$$

Proceeding to instruction block 660, the program solves Eqs. 41 and 44 to obtain the x value of the intersecting point and sets this value equal to XB(NB) in accordance with the following equation:

$$XB(NB) = \frac{B4 - B3}{M3 - M2} \qquad \text{Eq. 45}$$

Proceeding to instruction block 662, the program sets XB(NB+1) equal to XB(NB) so that both of the successive elements of the array are set equal to the common intersecting point.

The program then proceeds to instruction block 664 and determines the y value of the intersecting point and sets YB(NB) equal to that point in accordance with the following equation:

$$YB(NB) = M3 * XB(NB) + B3 \qquad \text{Eq. 46}$$

Finally, the program sets YB(NB+1) equal to YB(NB). See instruction block 666.

At this point, the program proceeds to decision block 668 and determines if the wrap array index NB is equal to NCR2−2. If it is not, it continues to run through the loop until NP is finally equal to NCR2−2. At this point, the program returns to the main program (FIG. 10C).

Figure 16A:
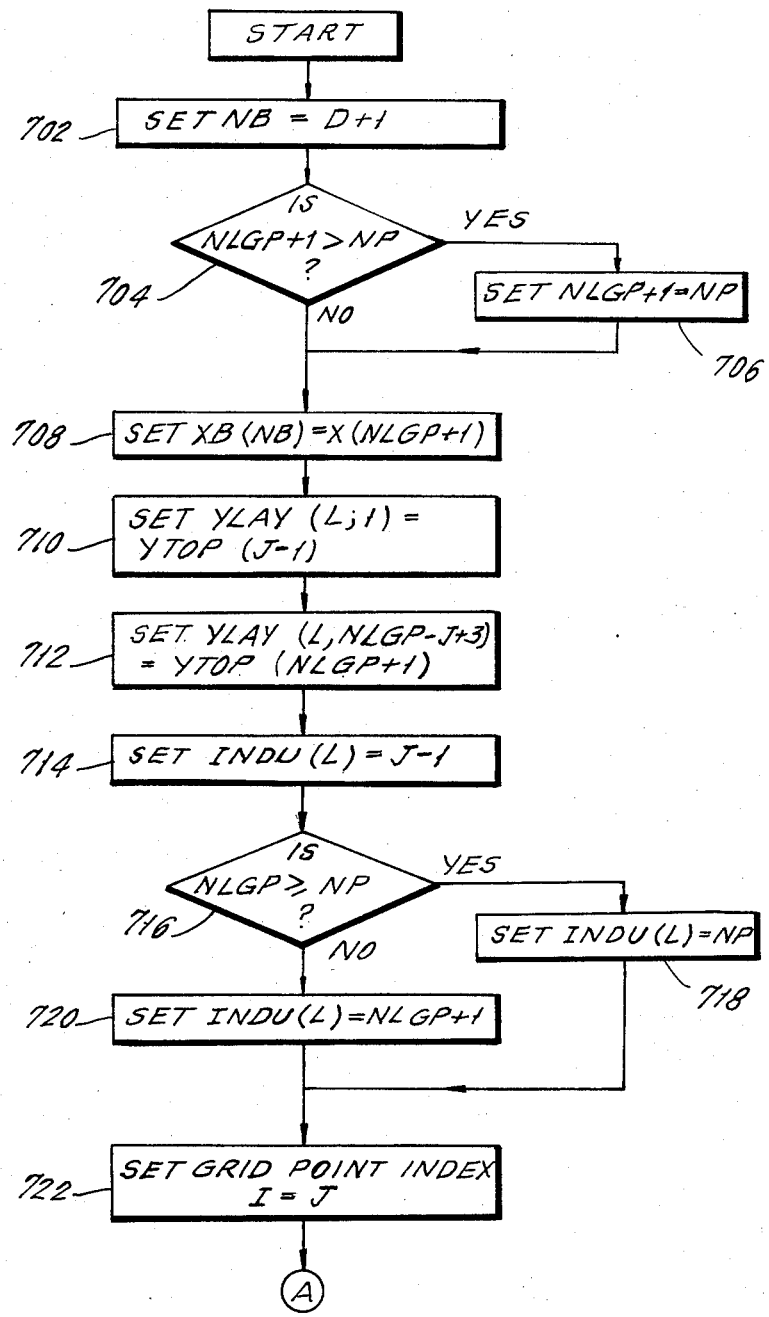

At this point in the program, the wrap arrays XB(NB), YB(NB) for the entire wrap being laid have been computed and any deep concavities have been smoothed. While the wrap arrays XB(NB), YB(NB) describe the top profile of the wrap which has just been laid, they are not in a condition which can be added to the tire profile YTOP(I) or which can be conveniently stored for later use. For this reason, the arrays XB(NB), YB(NB) are projected onto the reference grid X(I) before the tire profile YTOP(I) is updated and before the profile of the wrap which has been laid is stored in YLAY(L,P). The subroutine for projecting the array XB(NB), YB(NB) onto the reference grid X(I) and for both updating the tire profile YTOP(I) and storing the wrap profile in the array YLAY(L,P) is illustrated in FIGS. 16A and 16B. The subroutine begins at instruction 702 wherein the wrap array index NB is set equal to D+1. It will be remembered that the index D was set equal to the last wrap array index point calculated in the subroutine of FIG. 15. This last point corresponds to point XB(599), YB(599) in FIG. 25. The wrap array index NB will then identify the next element in the arrays XB(NB), YB(NB), the point XB(600), YB(600) in FIG. 25. Proceeding to decision block 704, the program determines if the next to the last grid point index NLGP+1 is greater than the total number of lines in the reference grid. If it is, the program proceeds to instruction block 706 and sets NLGP+1 equal to NP. In either case, the program then proceeds to instruction block 708 wherein it sets the last element of the array XB(NB) equal to the last reference line X(NLGP+1) in the grid which is associated with the wrap which has just been laid.

As noted above, the array YLAY(L,P) is a two-dimensional array which stores the profile of each of the wraps L in the cross-section being examined. The first dimension L defines the particular wrap stored in the array while the dimension P stores the individual profile points for that wrap. The array will store L rows of information, each row containing P elements which describe the shape of the wrap corresponding to that row. Each element will identify the point along the y-axis that the top of the wrap crosses a respective reference line of the grid X(I).

Proceeding to instruction block 710, the program sets the first element of the Lth row of the array YLAY(L,P) equal to the value of the tire profile YTOP(I) at the reference line X(J−1) immediately to the left of the edge guide of the present wrap. Proceeding to instruction block 712, the program sets the last element of the array YLAY(L,P) [the last element is the element NLGP−J+3 and corresponds to the reference grid line X(NLGP+1)] equal to the value of the tire profile at the grid point X(NLGP+1). Instruction blocks 710, 712 ensure that the opposite ends of the wrap, which have just been calculated and will now be stored in YLAY(L,P), will close upon the profile on which it is laid when the final profile is displayed on the video display 42.

Since the array YLAY(L,P) only stores the successive profile points 1 through NPS+3, additional information must be provided to identify the location of the first and last points of the wrap profile for each wrap stored in the array YLAY(L,P). This is provided by the lower and upper limit indices INDL(L), INDU(L). Proceeding to instruction block 714, the program sets the lower indices INDL(L) equal to J−1, the first point of the L wrap stored in YLAY(L,P). Proceeding to instruction block 716, the program determines if the next to the last grid point NLGP is greater than or equal to the last reference line in the reference array. If it is, the program proceeds to instruction block 718 and sets the upper limit index INDU(L) equal to NP. If NLGP is less than the last reference line in the reference array, the program proceeds to instruction block 720 and sets the upper limit index INDU(L) equal to the reference line corresponding to the last point in the wrap array. In either case, the program then proceeds to instruction block 722 and sets the grid point index I equal to the grid to the right index J (the reference line immediately to the right of the edge guide).

At this point in the program, the remaining elements of the wrap arrays XB(NB), YB(NB) must be projected onto the reference grid and the resulting points used both to update the tire profile YTOP(I) and to define the remaining elements of the array YLAY(L,P). The subroutine for performing this function is shown in FIG. 16B.

Figure 28:
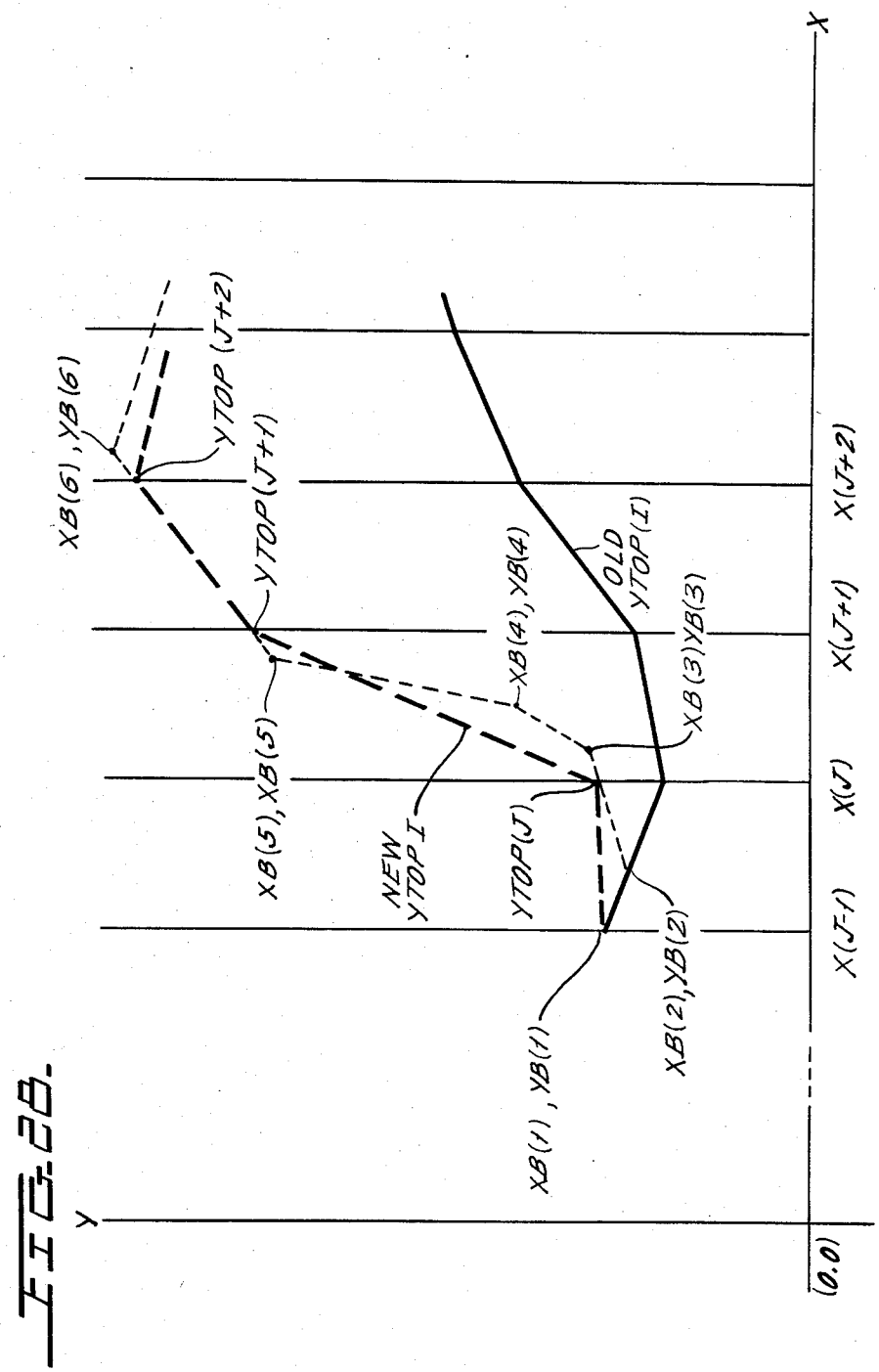
FIG. 28 is a graph illustrating the manner in which the profile of the wrap being laid is projected onto the reference grid.

Before describing this subroutine in detail, it is helpful to examine graphically the manner in which the wrap arrays XB(NB), YB(NB) are projected on the reference grid X(I) to develop the new YTOP(I). This can best be understood with reference to FIG. 28. In FIG. 28, the solid line represents the old tire profile YTOP(I) on which the present wrap has been laid, the dotted line represents the profile defined by the wrap arrays XB(NB), YB(NB), and the dashed line represents the new tire profile YTOP(I) which results from projecting the arrays XB(NB), YB(NB) onto the reference lines of the reference grid X(I). The value of each element of the new tire profile YTOP(I) is equal to the y value at which the dotted lines drawn between each successive element of the arrays XB(NB), YB(NB) cross the corresponding reference lines. Thus, the dotted line extending between points XB(2), YB(2) and XB(1), YB(1) cross the reference line X(J) at YTOP(J), the dotted line extending between points XB(5), YB(5) and XB(6), YB(6) cross the reference line X(J+1) at YTOP(J+1), etc.

To determine the locations at which the dotted lines cross the reference lines, the program of FIG. 16B examines each reference line X(I) which crosses through the wrap which has just been laid and then determines which two points determined by successive elements of the wrap arrays XB(NB), YB(NB) lie on opposite sides of that reference grid. The program first examines the reference line X(J) and looks at successive elements of the array XB(NB), to determine which successive elements lie on opposite sides of the reference line X(J). As shown in FIG. 28, the second and third elements of the reference array XB(NB) fall on either side of the reference line X(J). Using simple geometry, the program then determines the y-coordinate of the point at which the dotted line connecting the points XB(2), YB(2) and XB(3), YB(3) intersects the reference line X(J). This value is used to update the Jth element of the tire profile array YTOP(I).

The program then examines the next reference line X(J+1) and determines which elements of the wrap array XB(NB) are located on opposite sides of the reference line X(J+1). Using simple geometry, the program determines the y-coordinate of the pont where the dotted line joining these elements crosses the reference grid X(J+1) and uses this coordinate to update the (J+1)th element of the array YTOP(I). This process is repeated for each of the reference lines in the grid which pass through the wrap which has just been laid.

Referring now to FIG. 16B, the program first proceeds to instruction block 724 wherein the temporary wrap array index N is set equal to 1 identifying the first element of the wrap arrays XB(NB), YB(NB) for the wrap which has just been laid. The program then proceeds to instruction block 72 wherein the temporary variable XX is set equal to X(I). At this point, the program is ready to determine which of the elements of the array XB(NB) fall on opposite sides of the grid X(J).

Proceeding to decision blocks 728 and 730, the program determines if the reference line X(J) is either less than the first element of the wrap array XB(NB) or greater than the second element of the array XB(NB). Since it is not, the program proceeds to instruction block 732 which determines if the temporary wrap array index M is equal to NB−1. M will initially be equal to 1 and the program will return to instruction block 726 after the temporary wrap array index M is increased by 1 (block 734). Since M is now equal to 2, the program determines if the reference line X(J) is either less than XB(2) or greater than XB(3). Since X(J) is not greater than XB(3) (elements XB(2) and XB(3) fall on opposite sides of X(J)), the program proceeds to decision block 736 and determines if the absolute value of XB(2)−XB(3) is greater than 0.0001. If it is not, this indicates that the two points lie substantially one atop the other and the distance from the point XB(2) to the reference line X(J), as measured along the y-axis, would be approximately 0. For this reason, the program proceeds to instruction block 738 and sets the variable DELY equal to 0. In the example illustrated in FIG. 28, the absolute value of the difference between XB(2) and XB(3) is greater than 0.0001. In such a case, the program would proceed to instruction block 738 wherein it will compute DELY in accordance with the following equation:

$$DELY = \frac{[XX - XB(M)] * [YB(M + 1) - YB(M)]}{XB(M + 1) - XB(M)} \quad \text{Eq. 47}$$

Using simple geometry, it can be shown that the value of DELY computed in accordance with Eq. 44 is equal to the distances measured along the y-axis from the point XB(2), YB(2) to the point X(J), YTOP(J).

Proceeding to instruction block 740, the program then computes the new value of YTOP(I) for I=J, in accordance with the following equation:

$$YTOP(I) = YB(M) + DELY \quad \text{Eq. 48}$$

The program then proceeds to instruction block 742 wherein it sets the next element (I−J+2) of the array YLAY(L,P) equal to the just calculated value YTOP(I). The program then proceeds to decision block 744 where it determines if the grid point index I is equal to the next to the last grid point index NLGP. If it was, the program would return to the main program. Since I is presently equal to J, the program will return to instruction block 724 after the grip point index I is incremented by 1 (see instruction block 746). In this manner, the program will continue looping through the subroutine of FIG. 16B until the array YTOP(I) is completely updated to include the wrap which has just been laid and until each of the elements of the array YLAY(L,P) for the wrap which has just been laid has been entered into the array.

Having computed the profile of the wrap being laid, having stored its profile in the array YLAY(L,P) and having updated the tire profile YTOP(I), , the program proceeds to decision block 150 which determines if the count index KOUNT is equal to the total number of ribbons in the cross-section (NL). If it is not, there are still wraps to be laid and the program returns to instruction block 136 after the wrap index count is increased by one (see block 140) to repeat the process for the next wrap identified by the incremental wrap index KOUNT.

If the wrap index count is equal NL, all of the ribbons have been laid and the program proceeds to instruction block 152 which causes the computer to calculate the left and right area of the tire profile and the percent imbalance thereof. The subroutine for making these calculations is set forth in FIG. 29. Before reviewing the subroutine, it is helpful to provide an explanation of the manner in which the subroutine calculates the area to the left of the carcass center and to the right of the carcass center with reference to FIG. 30.

Figure 30:
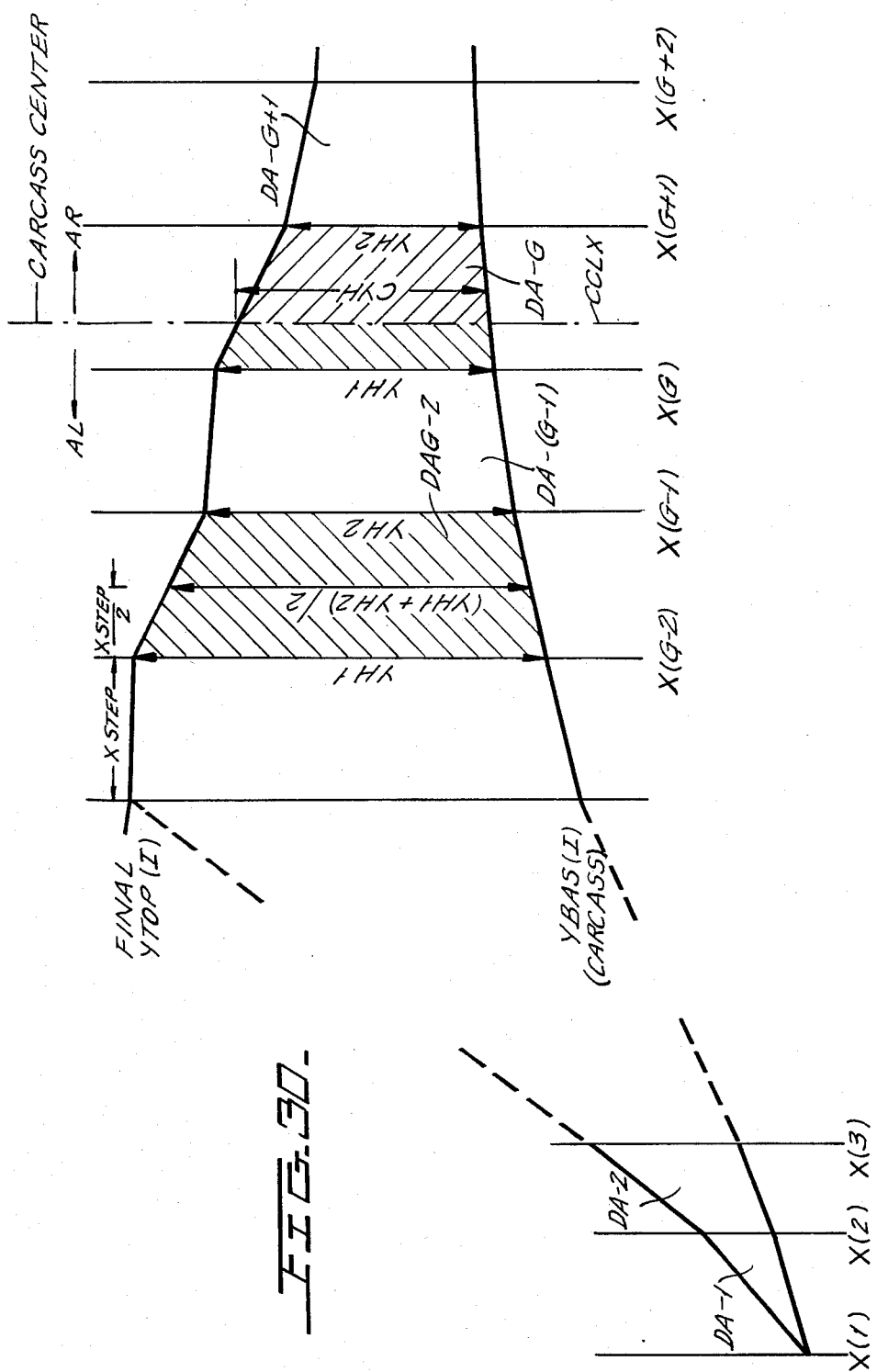
FIG. 30 is a flow chart useful in explaining the manner in which the left and right areas of the profile and the present imbalances are calculated.

As shown in FIG. 30, the area between the carcass profile YBAS(I) and the final tire profile YTOP(I) can be broken into a plurality of sub-areas DA lying between adjacent reference lines X(I). Thus, the first area DA-1 represents the area between reference lines X(1) and X(2), the area DA-2 represents the area between the reference lines X(2) and X(3), etc. The area to the left of the carcass center will be the sum of the sub-areas DA-1 through DA-(G−1), where X(G) is the reference line immediately to the left of the carcass center plus the portion of the area DA-G which lies to the left of the carcass center. The area to the right of the carcass center can be computed in a similar manner. The manner in which the program computes each sub-area can best be understood with reference to area DA-(G−2) in FIG. 30. As shown therein, the area is a trapezoid having a width XSTEP and first and second heights YH1, YH2. The height YH1 is the difference between YTOP(G−2) and YBAS(G−2). The height YH2 is the difference between YTOP(G−1) and YBAS(G−1). While the area DA-(G−2) is a trapezoid, it can be considered a rectangle whose width is XSTEP and whose height is the average of YH1 and YH2. As such, area DA(G−2) can be calculated as follows:

$$DA = \frac{YH1 + YH2}{2} \cdot XSTEP \qquad Eq.\ 49$$

Each of the sub-areas DA-1 through DA-(G−1) can be calculated in this manner. The portion of the area DA-G which lies to the left of the carcass can be computed by first determining the height CYH of the area DA-G at the carcass center CCLX and then determining the area of DA-G which is located to the left of the carcass center line CCLX in accordance with the following equation:

$$DA - G(left) = \frac{CYH + YH1}{2 \cdot [CCLX - X(G)]} \qquad Eq.\ 50$$

The area of DA-G which lies to the right of the carcass center can similarly be calculated in accordance with the following equation:

$$DA - G(right) = \frac{CYH - YH2}{2 \cdot [X(G + 1) - CCLX]} \qquad Eq.\ 51$$

The remaining sub-areas to the right of CCLX can be determined in accordance with Eq. 49, supra.

Figure 29:
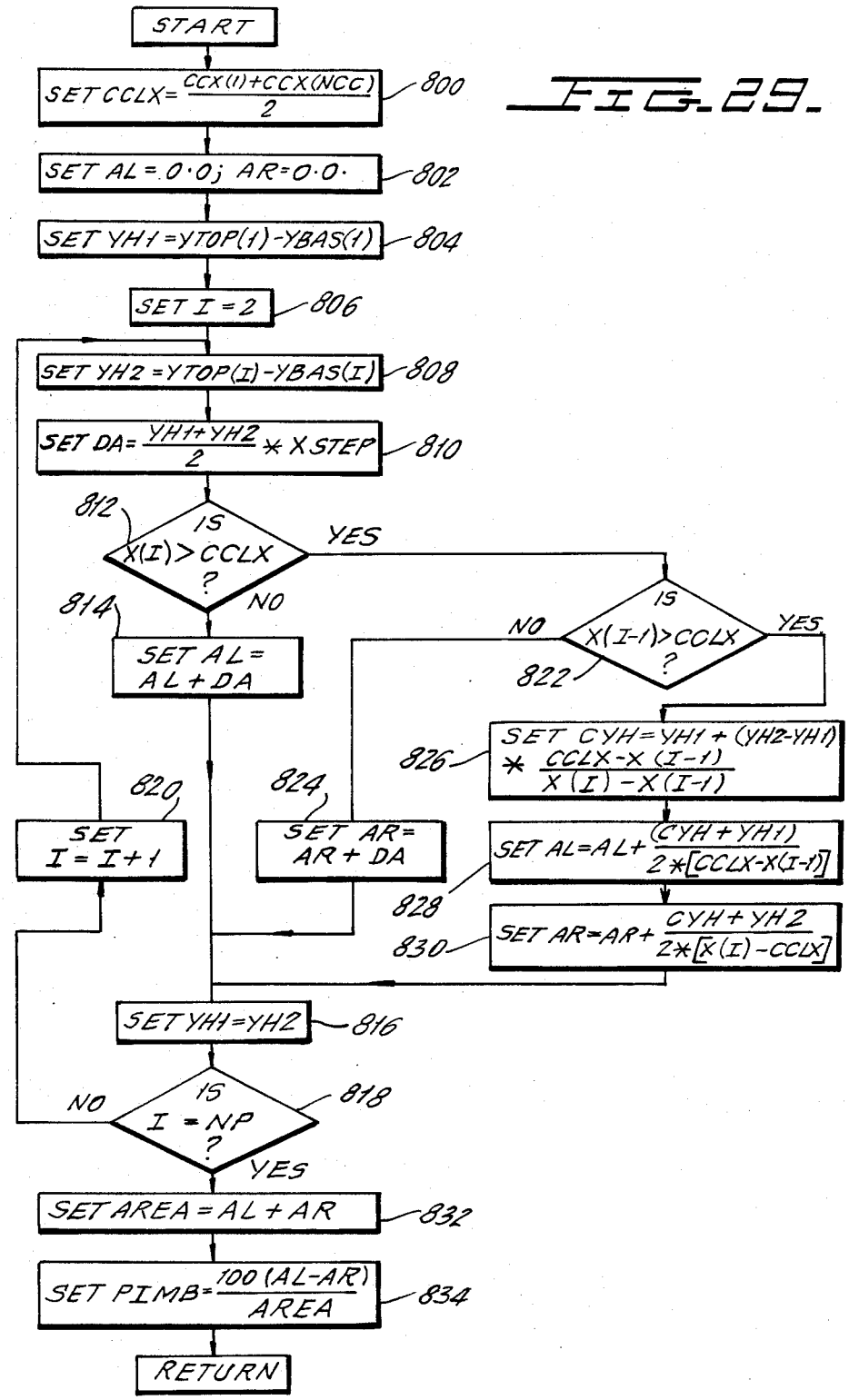
FIG. 29 is a flow chart illustrating the manner in which the left and right areas of the profile and the percent imbalance are calculated.

Turning now to the flow chart of FIG. 29, the program starts at instruction block 800 wherein it determines the center of the carcass CCLX in accordance with the following equation:

$$CCLX = \frac{CCX(1) + CCX(NCC)}{2} \qquad Eq.\ 52$$

Proceeding to instruction block 802, the program clears the left area and right area variables AL, AR by setting them equal to 0. Proceeding to instruction block 804, the program sets the left height variable YH1 equal to YTOP(1)−YBAS(1). Since the carcass profile and tire profile will normally meet at this point, YH1 will normally be initially set to 0. It it possible, however, that the build does have some height at the first carcass point in which case YH1 would be a number other than 0.

Proceeding to instruction block 806, the program sets the grid index I equal to 2 so that the first right height variable YH2 computed will be the height of the profile at the reference line X(2).

Proceeding to instruction block 808, the program determines the right height variable YHT by subtracting the value YBAS(I) from YTOP(I) for the present value of the index I. Proceeding to instruction block 810, the program then computes the sub-area DA to the right of the reference line X(I) in accordance with the following Eq. 49, supra. Proceeding to decision block 812, the computer then determines if the present reference line X(I) is greater than the carcass center CCLX. As long as the sub-area DA which has just been calculated is to the left of the carcass line CCLX, the answer will be no and the program will proceed to instruction block 814 wherein the area to the left variable is undated by adding the last computed sub-area DA to the sum of the prior sub-areas computed. The program then proceeds to instruction block 816 which sets YH1 equal to YH2. Presuming that less than all of the reference lines have been examined, I will be less than NP and the program will proceed through decision block 818 to instruction block 820 wherein the grid index I will be incremented by 1. The program then calculates the second sub-area DA-2 and updates the left area variable AL to include this sub-area. This process is repeated until all of the sub-areas DA-1 through DA-(G−1) have been computed and added to the left area variable AL. At this point, I will equal H and X(H) will be greater than the carcass center line CCLX (see decision block 812). The program will then proceed to decision block 822 and determine if X(I−1) is less than CCLX. This will be true only the first time the program proceeds to decision block 822 (i.e., when I equals H). When it is true, the program proceeds to instruction block 826 and determines the height of the sub-area DA-G at the carcass center line CCLX in accordance with the following equation:

$$CYH = YH1 + (YH2 - YH1) \cdot \frac{CCLX - X(I - 1)}{X(I) - X(I - 1)} \qquad Eq.\ 53$$

At this point, the program proceeds to instruction block 828 and adds the portion of the sub-area DA-G (see Eq. 50, supra) to the prior area. At this time, the entire area to the left of the carcass center line CCLX has been calculated.

The program then begins calculating the area to the right of the carcass center line by proceeding to instruction block 830 and calculating the portion of the subarea DA-G located to the right of the center line CCLX in accordance with Eq. 51, supra. At this point, the remaining sub-areas to the right of the carcass center CCLX are calculated and added to the right area variable AR. To this end, the program proceeds through blocks 816–810 to calculate the next sub-area DA−G+1. Proceeding to decision block 812, X(I) for the present value of the index I will be greater than the carcass center line CCLX and the program will proceed to decision block 822. At this point, X(I−1) will be equal to X(H) and is, therefore, greater than the carcass center line CCLX. This will be true for each subsequent pass through the loop. The program, therefore, proceeds to instruction block 824 where it updates the right area variable AR by adding the last calculated subarea DA to the prior value of AR. The program will continue to loop through the subroutine until the grid index I equals NP. At this point, the total area to the right of the carcass center line CCLX will have been computed and the program proceeds to instruction block 834 where it calculates the total area of the profile in accordance with the following equation:

$$AREA = AL + AR \qquad \text{Eq. 54}$$

Finally, the program computes the percent imbalance PIMB in accordance with the following equation (see block 834):

$$PIMB = \frac{100(AL - AR)}{AREA} \qquad \text{Eq. 55}$$

At this point, the program returns to the main program and proceeds to instruction block 154 which causes the arrays YBAS(I), YLAY(LP) and YTOP(I), as well as the array illustrating the desired profile 36, to be plotted on the video display 42 (the arrays may also be plotted on a hard copy using the printer 44). The result will be the exact picture illustrated in FIG. 4A. This In the preferred embodiment, the left and right area, as well as the percent imbalance, are also indicated on the video display. With this information, the programmer is presented with a visual analysis of the tire profile which will result from the winding specification he has entered, as well as the balance of the resulting profile, and can amend the winding specification to correct any errors which are unacceptable.

Once the foregoing information has been plotted, the program proceeds to decision block 156 and waits for the new cross-section button to be depressed by the programmer. Once it has been depressed, the program returns to block 108 (FIG. 10A) after increasing the cross-section index IC by one (see instruction block 158). At this point, the program will again proceed through the loop encompassing blocks 108 through 154 and will develop and plot the appropriate profiles for the second cross-section (e.g., 90°) entered by the programmer.

Figure 1:
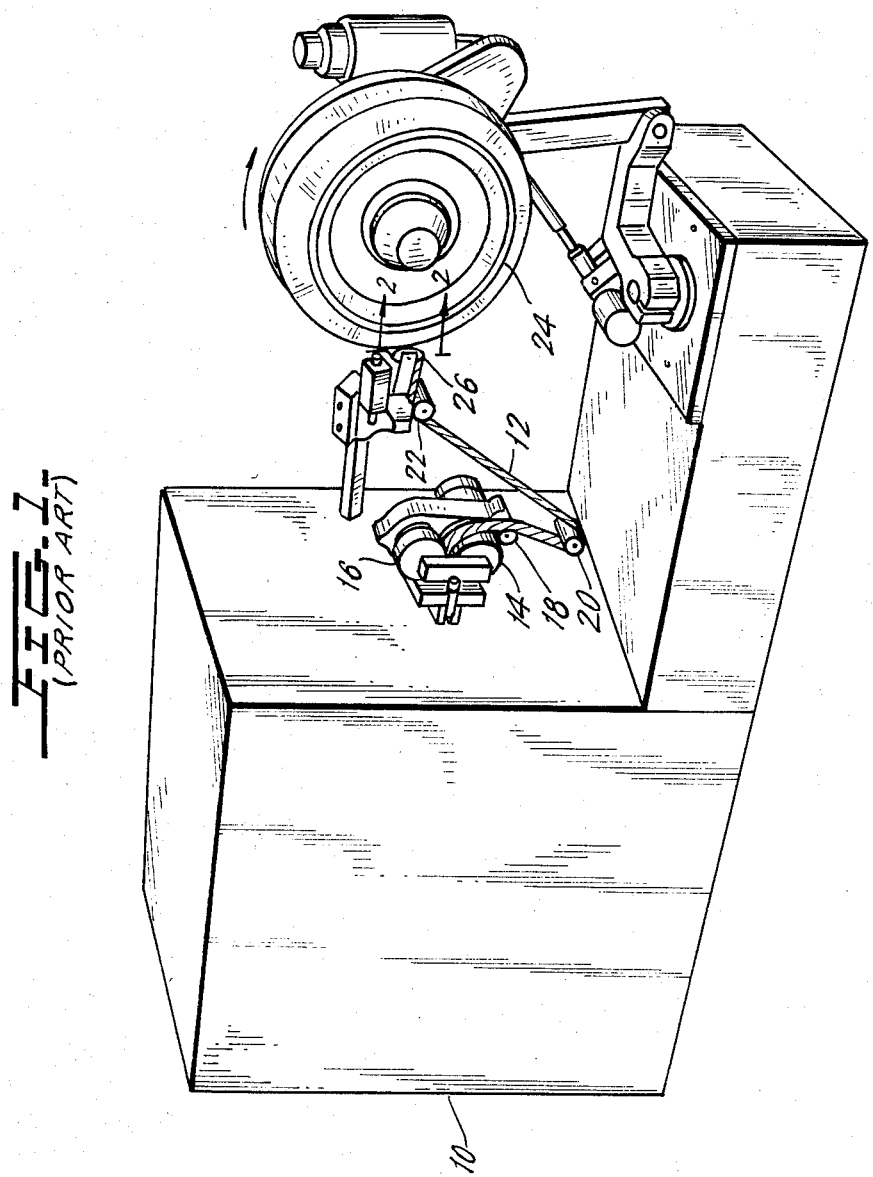
FIG. 1 is a perspective view of an Orbitread tire winding machine of the prior art.
Figure 2:
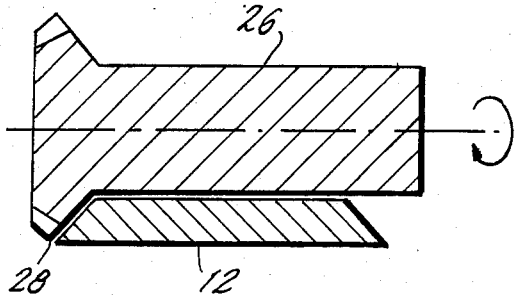
FIG. 2 is a cross-sectional view taking along lines 2—2 of FIG. 1.
Figure 3A:
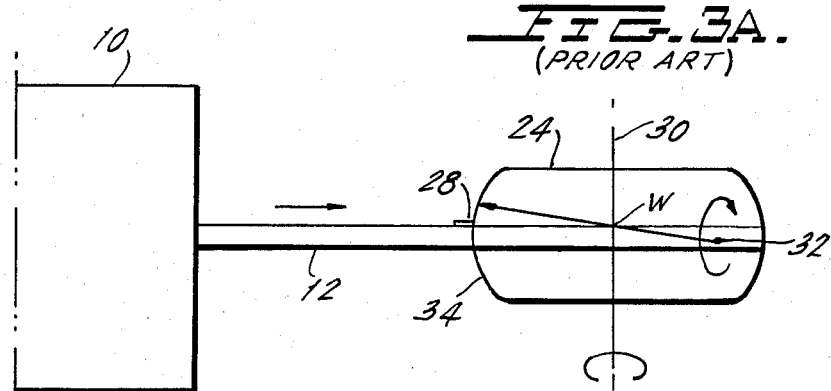
FIGS. 3A and 3B are schematic representations of the operation of the tire winding machine of FIG. 1 as viewed from above.
Figure 3B:
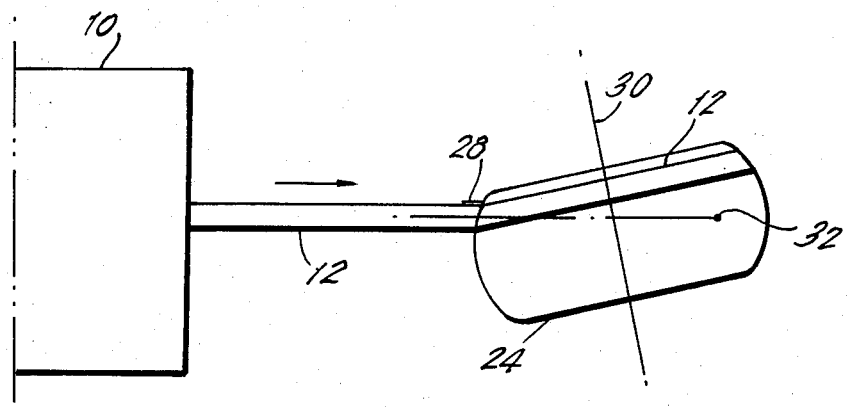

Once the desired winding specification has been determined, it can be entered into the tire winding machine (FIG. 1) either manually by entering it into the keyboard of the tire winding machine or automatically by interfacing the computer 40 with the controls of the tire winding machine.

The present invention may be embodied in other specific forms without departing from the spirit or essential attributes thereof and, accordingly, reference should be made to the appended claims, rather than the foregoing specification, as indicating the scope of the invention.

What is claimed is:

1. A method for simulating the manner in which a ribbon of known profile is wrapped around a carcass of known profile in accordance with a predetermined winding specification, said method comprising the steps of:

storing the profile of said ribbon, the profile of said carcass, and said winding specification in a memory;

calculating, for at least one cross-section of said carcass, the profile of a final ribbon build which will be created at said cross-section when said ribbon is wrapped around said carcass in accordance with said winding specification, said calculating step being performed as a function of said profile of said carcass, said ribbon profile and said winding specification; and displaying, for each of said cross-sections, said profile of said final ribbon build.

2. The method of claim 1, wherein said winding specification requires that said ribbon be wound around said carcass a plurality of times, whereby each said cross-section will include a plurality wraps of said ribbon.

3. The method of claim 2, wherein said calculating step includes the step of calculating a profile of each wrap in each said cross-section and wherein said displaying step includes the step of displaying the profile of each wrap along with said profile of said final ribbon build.

4. The method of claim 2, further including the steps of storing a desired profile of said final ribbon build in said memory and superimposing said desired profile on said build of said final ribbon profile during said display step.

5. The method of claim 1, further including the steps of storing a desired profile of said ribbon build in said memory and superimposing said desired profile on said build of said final ribbon profile during said display step.

6. The method of claim 1, further comprising the steps of:

calculating, for each said cross-section, a percentage imbalance between left and right sides of said profile of said final ribbon build; and displaying, for each said cross-section, said percent imbalance.

7. The method of claim 6, further including the steps of:

calculating, for each said cross-section, an area on the left and right sides of a center of said profile of said final ribbon build; and displaying, for each said cross-section, said areas.

8. The method of claim 1, wherein, for each said cross-section, said calculating step includes the steps of:

(A) initially storing said carcass profile in a ribbon build array YTOP(I); and (B) modifying said ribbon build array YTOP(I) by sequentially adding a top profile of each said wrap to said ribbon build array YTOP(I) so that the profile of said ribbon build array YTOP(I) will define the final profile of said ribbon build after said top profile of all of said wraps has been added to it.

9. The method of claim 8, wherein said modifying step comprises, for each successive wrap, the steps of:

(A) computing said top profile of said wrap taking into account said profile of said ribbon, a location of said wrap with respect to said ribbon build array YTOP(I) at the time said top profile of said wrap is computed, and a profile of ribbon build defined by the value of said ribbon build array YTOP(I) at the time said top profile of said wrap is computed; and (B) adding said top profile of said wrap to said ribbon build array YTOP(I) so as to modify the profile defined by the value of the ribbon build array YTOP(I) to include said profile of said wrap.

10. The method of claim 9, wherein said array YTOP(I) includes NP elements, each element of said array corresponding to a respective element of an array X(I) which defines a reference grid comprising NP equally spaced reference lines, each reference line running parallel to the y-axis of an x-y cartesian coordinate system, each element of said ribbon profile array YTOP(I) defining the location on the y-axis of said cartisian coordinate system that the most recently updated ribbon profile crosses its corresponding reference line.

11. The method of claim 10, wherein the spacing of said reference lines is determined as a function of the width of said ribbon.

12. The method of claim 11, wherein said profile of said ribbon build has a maximum width and the number of said reference lines is determined as a function of said maximum width.

13. The method of claim 9, wherein each said wrap is laid on said carcass profile and/or said top profile of a previously laid wrap and wherein said top profiles of said wraps are computed in a manner which ensures that said top profile of each wrap will close on the carcass profile and/or said top profile of the wrap on which it is held.

14. The method of claim 9, further including the step of smoothing any concavities in said wrap profiles which are more concave than a preset standard.

15. The method of claim 1, wherein said at least one cross-section comprises a plurality of cross-sections.

16. The method of claim 15, wherein each of said cross-sections is identified by a respective angle stored in said memory, said angle being measured with respect to a point on said carcass at which said ribbon is initially laid.

17. The method of claim 16, wherein whenever a first angle stored in said memory is zero degrees, and wherein said computing means is calculating the final ribbon build for the cross-section corresponding to said first angle, the final profile of said ribbon build is calculated at an angle slightly greater than zero degrees.

18. The method of claim 1, further including the steps of:

repeatedly modifying said winding specification stored in said memory and repeating said calculating and displaying steps for each said modification of winding specification until a desired winding specification is obtained; and thereafter placing a ribbon having said known profile on a carcass having said known profile in accordance with said desired winding specification.

19. Apparatus for simulating the manner in which a ribbon of known profile is wrapped around a carcass of known profile in accordance with a predetermined winding specification, said apparatus comprising:

memory means for storing the profile of said ribbon, the profile of said carcass and said winding specification;

means for computing, for at least one cross-section of said carcass, a profile of the final ribbon build which will be created at said cross-section when said ribbon is wrapped around said carcass in accordance with said winding specification, said computing means computing said profile of said final ribbon build as a function of said profile of said carcass, said ribbon profile and said winding specification; and means for displaying, for each of said cross-sections, said profile of said final ribbon build.

20. The apparatus of claim 19, wherein said winding specification requires that said ribbon be wound around said carcass a plurality of times, whereby each said cross-section will include a plurality of wraps of said ribbon.

21. The apparatus of claim 20, wherein said computing means calculates a profile of each wrap in each said cross-section and wherein said display means displays the profile of each wrap along with said profile of said final ribbon build.

22. The apparatus of claim 20, wherein said memory also stores a desired profile of said final ribbon build and wherein said display means superimposes said desired profile on said profile of said final ribbon build.

23. The apparatus of claim 19, wherein said memory also stores a desired profile of said final ribbon build and wherein said display means superimposes said desired profile on said profile of said final ribbon build.

24. The apparatus of claim 19, wherein said computing means also calculates, for each said cross-section, a percentage imbalance between left and right hand sides of said profile of said final ribbon build and wherein said display means displays said percent imbalance for each said cross-section.

25. The apparatus of claim 24, wherein said computing means also calculates, for each said cross-section, an area on the left and right hand sides of a center of said profile of said final ribbon build and wherein said display means displays said areas for each of said cross-sections.

26. The apparatus of claim 19, wherein, for each said cross-section, said computing means calculates the profile of the final ribbon build by:

(A) initially storing said carcass profile in a ribbon build array YTOP(I); and (B) modifying said ribbon build array YTOP(I) by sequentially adding a top profile of each said wrap to said ribbon build array YTOP(I) so that the profile of said ribbon build array YTOP(I) will define the final profile of said ribbon build after the profile of all of said wraps has been added to it.

27. The apparatus of claim 26, wherein said computing means carries out said modifying step by, for each successively wrap in said cross-section:

(A) computing said profile of said ribbon, a location of said wrap with respect to said ribbon build array YTOP(I) at the time said top profile of said wrap is computed, and a profile of said ribbon build defined by the value of said ribbon build array YTOP(I) at the time said top profile of said wrap is computed; and (B) adding said top profile of said wrap to said ribbon build array YTOP(I) so as to modify the profile defined by the value of said ribbon build array YTOP(I) to include said profile of said wrap.

28. The apparatus of claim 27, wherein said array YTOP(I) includes NP elements, each element of said array corresponding to a respective element of an array X(I) which defines a reference grid comprising NP equally spaced reference lines, each reference line running parallel to the y-axis of an x-y cartesian coordinate system, each element of said ribbon profile array YTOP(I) defining a location on the y-axis of said cartisian coordinate system that the most recently updated ribbon profile crosses its corresponding reference line.

29. The apparatus of claim 28, wherein the spacing of said reference lines is determined as a function of a width of said ribbon.

30. The apparatus of claim 29, wherein said profile of said ribbon build has a maximum width and the number of said reference lines is determined as a function of said maximum width.

31. The apparatus of claim 27, wherein each said wrap is laid on said carcass profile and/or said top profile of a previously laid wrap and wherein said top profiles of said wraps were computed in a manner which ensures that said top profile of each wrap will close on the carcass profile and/or said top profile of the wrap on which it is laid.

32. The apparatus of claim 27, wherein said computing means smooths any concavities in said wrap profiles which are more concave than a preset standard.

33. The apparatus of claim 19, wherein said at least one cross-section comprises a plurality of cross-section.

34. The apparatus of claim 33, wherein each of said cross-sections is identified by a respective angle stored in said memory, said angle being measured with respect to a point on said carcass at which said ribbon is initially laid.

35. The apparatus of claim 34, wherein whenever a first angle stored in said memory is zero degrees, and wherein said computing means is calculating the final ribbon build for the cross-section corresponding to said first angle, the final profile of said ribbon build is calculated at an angle slightly greater than zero degrees.

36. The apparatus of claim 19, further including a machine for placing a ribbon having said known profile on a carcass having said known profile in accordance with said winding specification.

37. A method for determining a top profile of a deformed cross-section of a flexible ribbon having a known non-deformed profile when said flexible ribbon has been placed on a surface having a known profile so as to assume said deformed cross-section, said method comprising the steps of:

computing said top profile taking into account said non-deformed profile of said ribbon, a location of said ribbon with respect to said surface of known profile, and said known profile of said surface; and displaying said top profile relative to said surface.

38. The method of claim 37, wherein the profile of said surface of known profile is displayed along with said top surface of said cross-section of said ribbon.

39. The method of claim 37, wherein said top profile of said ribbon is computed in a manner which ensures that it will close on said surface of known profile.

40. The method of claim 37, further including the step of smoothing any concavity in said ribbon profile which is more concave than a preset standard.

* * * * *